United States Patent
Torii

(10) Patent No.: US 9,224,745 B2
(45) Date of Patent: Dec. 29, 2015

(54) METHOD OF MANUFACTURING SEMICONDUCTOR DEVICE

(71) Applicant: FUJITSU SEMICONDUCTOR LIMITED, Yokohama-shi, Kanagawa (JP)

(72) Inventor: Satoshi Torii, Kuwana (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 13/668,815

(22) Filed: Nov. 5, 2012

(65) Prior Publication Data

US 2013/0171814 A1 Jul. 4, 2013

(30) Foreign Application Priority Data

Dec. 28, 2011 (JP) ................................. 2011-289254

(51) Int. Cl.
| | |
|---|---|
| H01L 21/76 | (2006.01) |
| H01L 27/115 | (2006.01) |
| H01L 21/28 | (2006.01) |
| H01L 29/66 | (2006.01) |
| H01L 49/02 | (2006.01) |

(52) U.S. Cl.
CPC .... *H01L 27/11546* (2013.01); *H01L 21/28273* (2013.01); *H01L 28/40* (2013.01); *H01L 29/66825* (2013.01)

(58) Field of Classification Search
CPC ...................................................... H01L 21/76
USPC ....................................................... 438/593
See application file for complete search history.

(56) References Cited

U.S. PATENT DOCUMENTS

| | | | |
|---|---|---|---|
| 6,194,323 B1 | 2/2001 | Downey et al. | |
| 7,208,423 B2 * | 4/2007 | Hashimoto et al. | 438/717 |
| 7,824,996 B2 | 11/2010 | Hashimoto et al. | |
| 8,158,527 B2 | 4/2012 | Hashimoto et al. | |
| 8,163,611 B2 | 4/2012 | Hashimoto et al. | |
| 8,183,119 B2 | 5/2012 | Hashimoto et al. | |
| 2009/0215243 A1 | 8/2009 | Ogura et al. | |
| 2009/0323424 A1 * | 12/2009 | Torii | 365/185.18 |
| 2010/0255611 A1 * | 10/2010 | Wang | 438/3 |
| 2012/0208342 A1 | 8/2012 | Ogura et al. | |

FOREIGN PATENT DOCUMENTS

| | | |
|---|---|---|
| JP | 9-321043 A | 12/1997 |
| JP | 10-289990 A | 10/1998 |

(Continued)

OTHER PUBLICATIONS

Office Action dated Jul. 14, 2015, issued in counterpart Japanese application No. 2011-289254 (w/English translation) (5 pages).

*Primary Examiner* — Jerome Jackson, Jr.
*Assistant Examiner* — Christopher Culbert
(74) *Attorney, Agent, or Firm* — Westerman, Hattori, Daniels & Adrian, LLP

(57) ABSTRACT

A method of manufacturing a semiconductor device includes: forming a conductive film on a semiconductor substrate; patterning the conductive film in a memory region to form a first gate electrode; after forming the first gate electrode, forming a mask film above each of the conductive film in a logic region and the first gate electrode; removing the mask film in the logic region; forming a first resist film above the mask film left in the memory region and above the conductive film left in the logic region; and forming a second gate electrode in the logic region by etching the conductive film using the first resist film as a mask.

17 Claims, 51 Drawing Sheets

(56) References Cited

FOREIGN PATENT DOCUMENTS

| JP | 2000-311899 A | 11/2000 |
| JP | 2002-359352 A | 12/2002 |
| JP | 2003249579 A | 9/2003 |
| JP | 2009200340 A | 9/2009 |

* cited by examiner

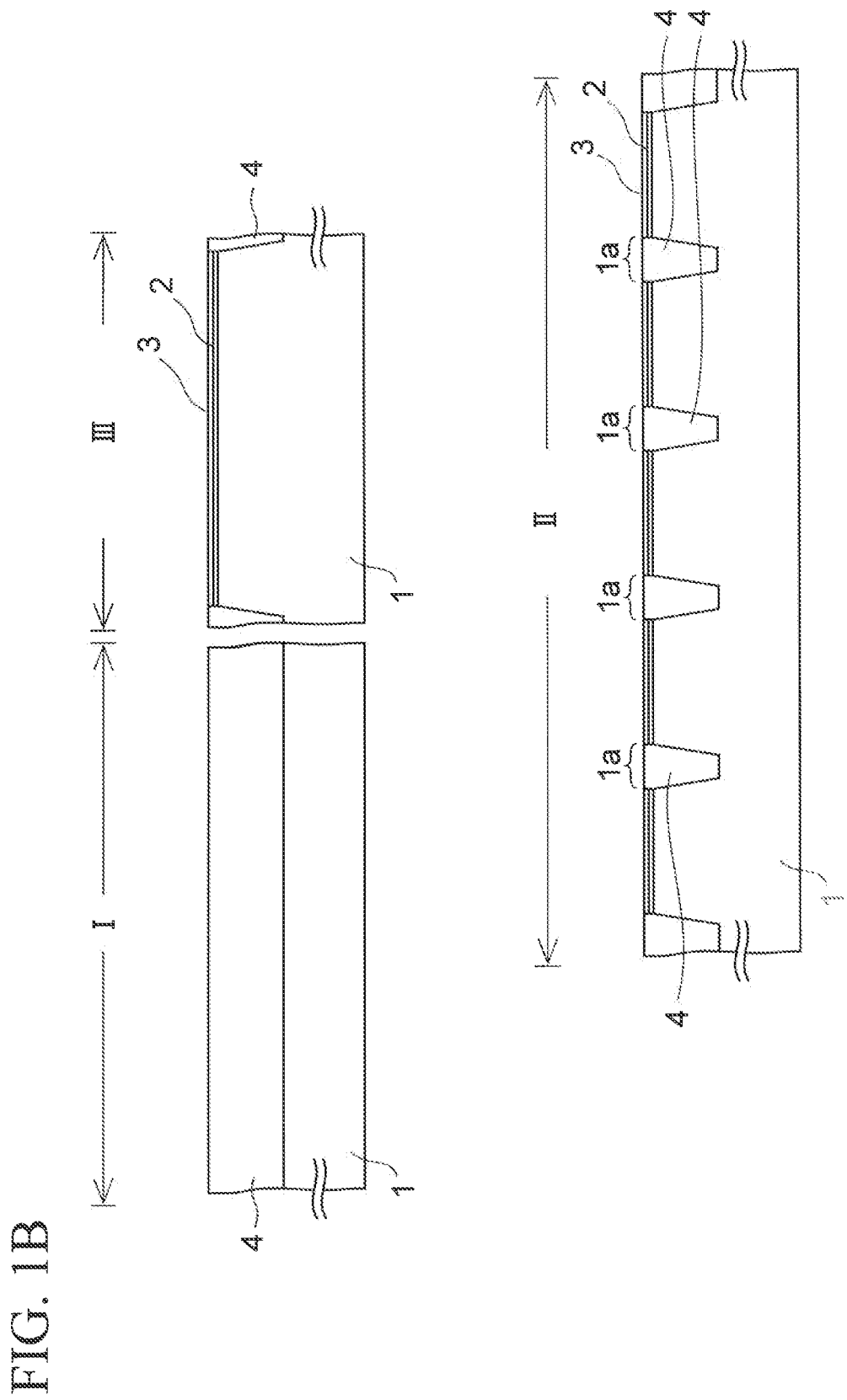

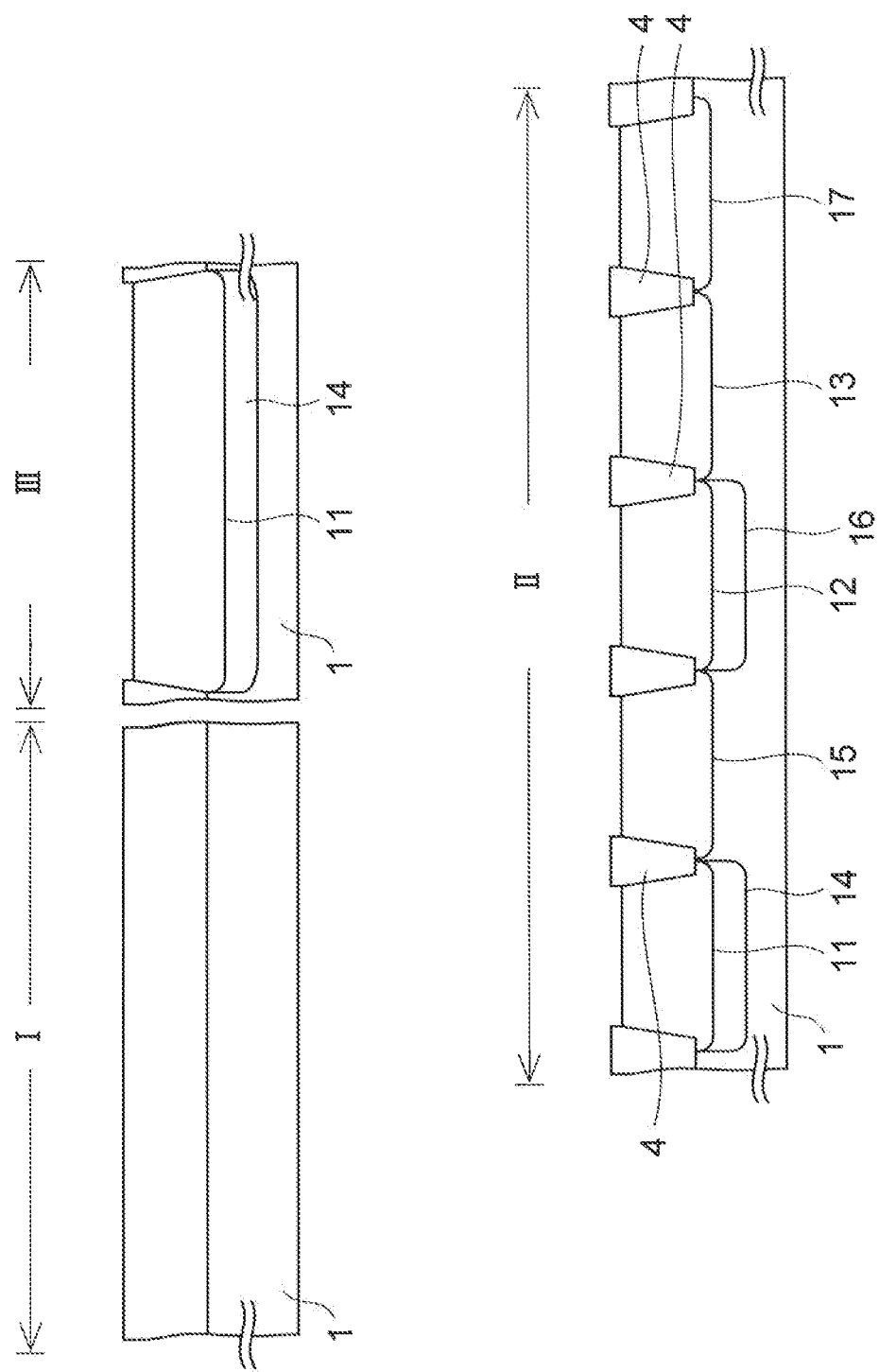

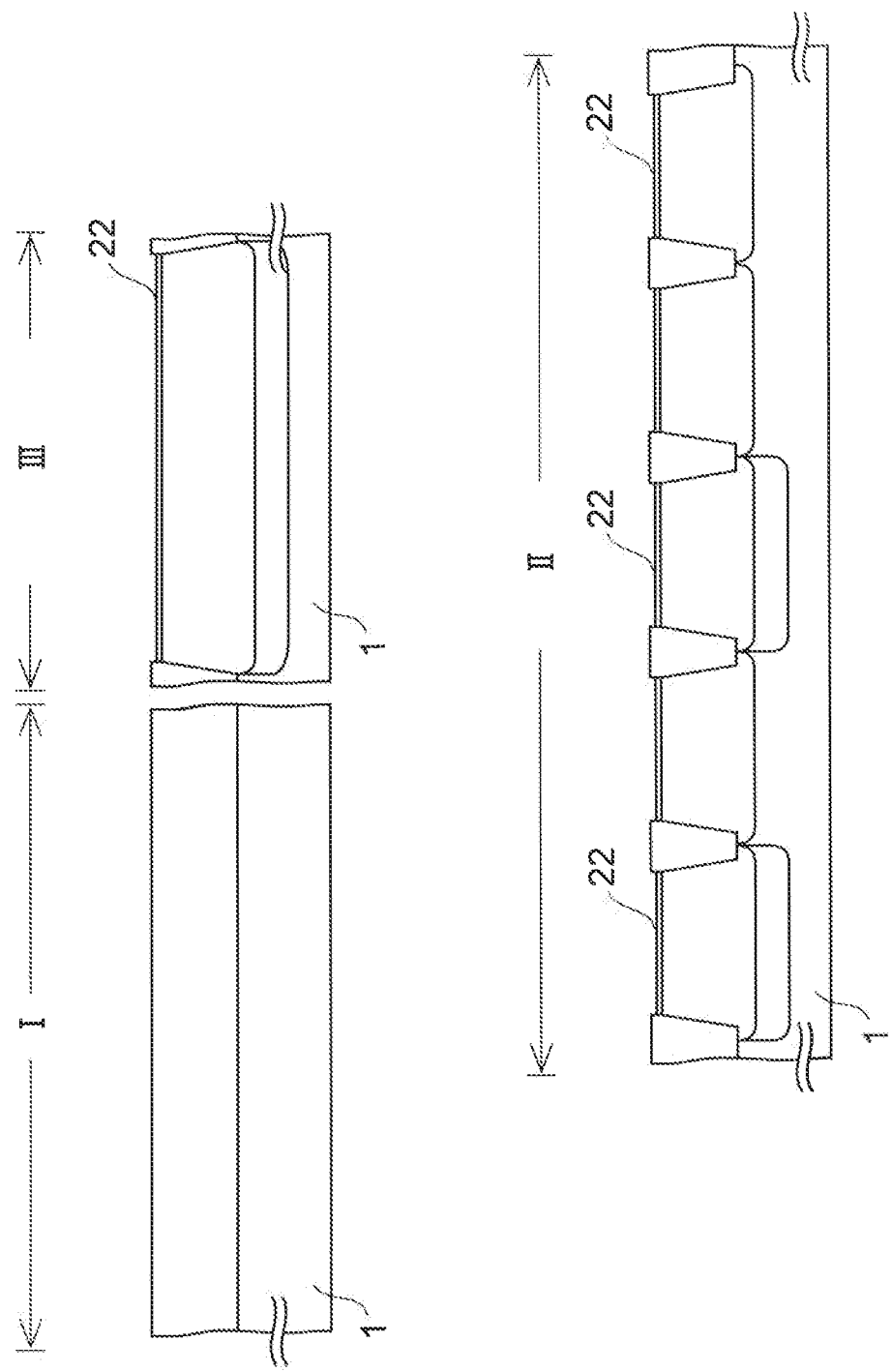

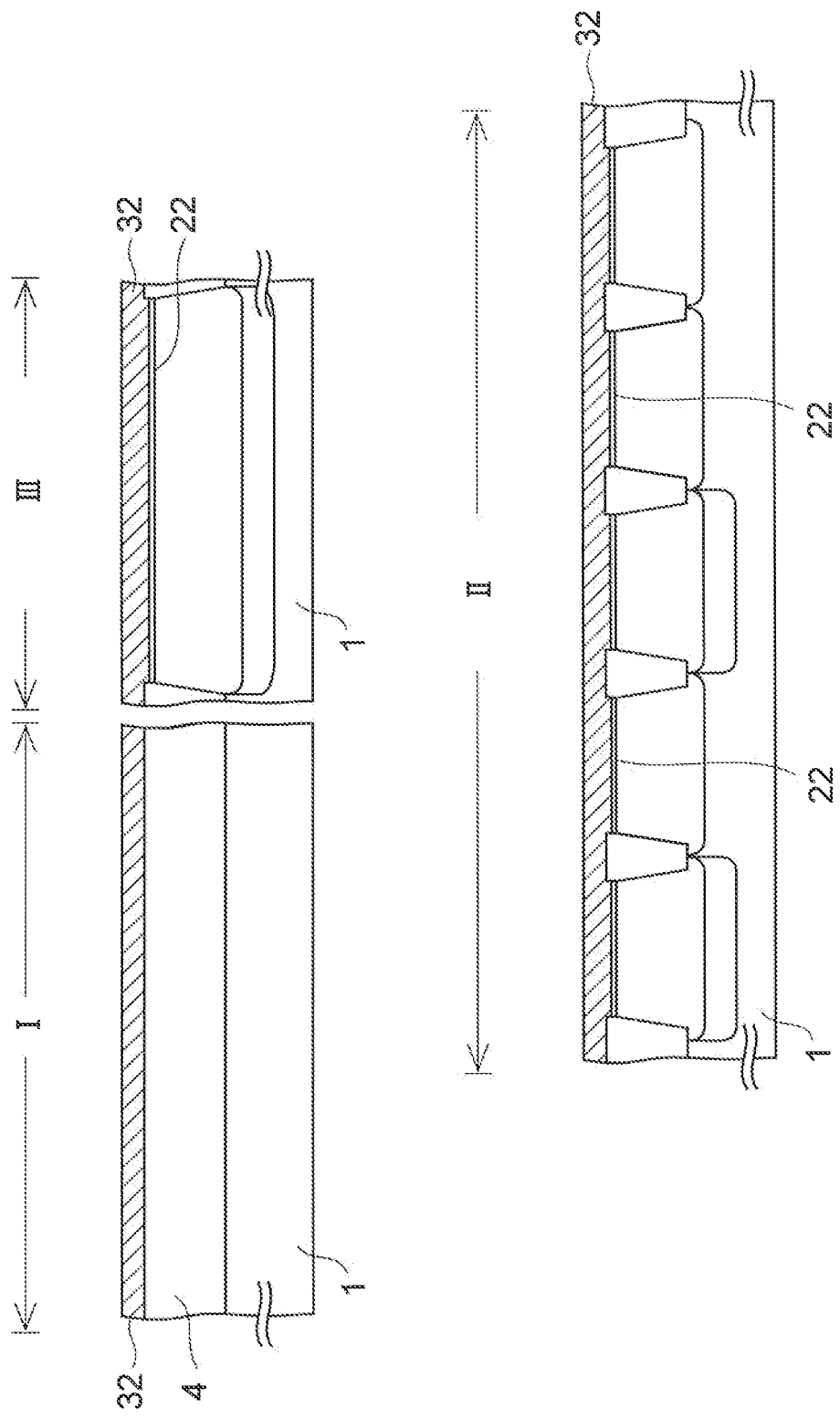

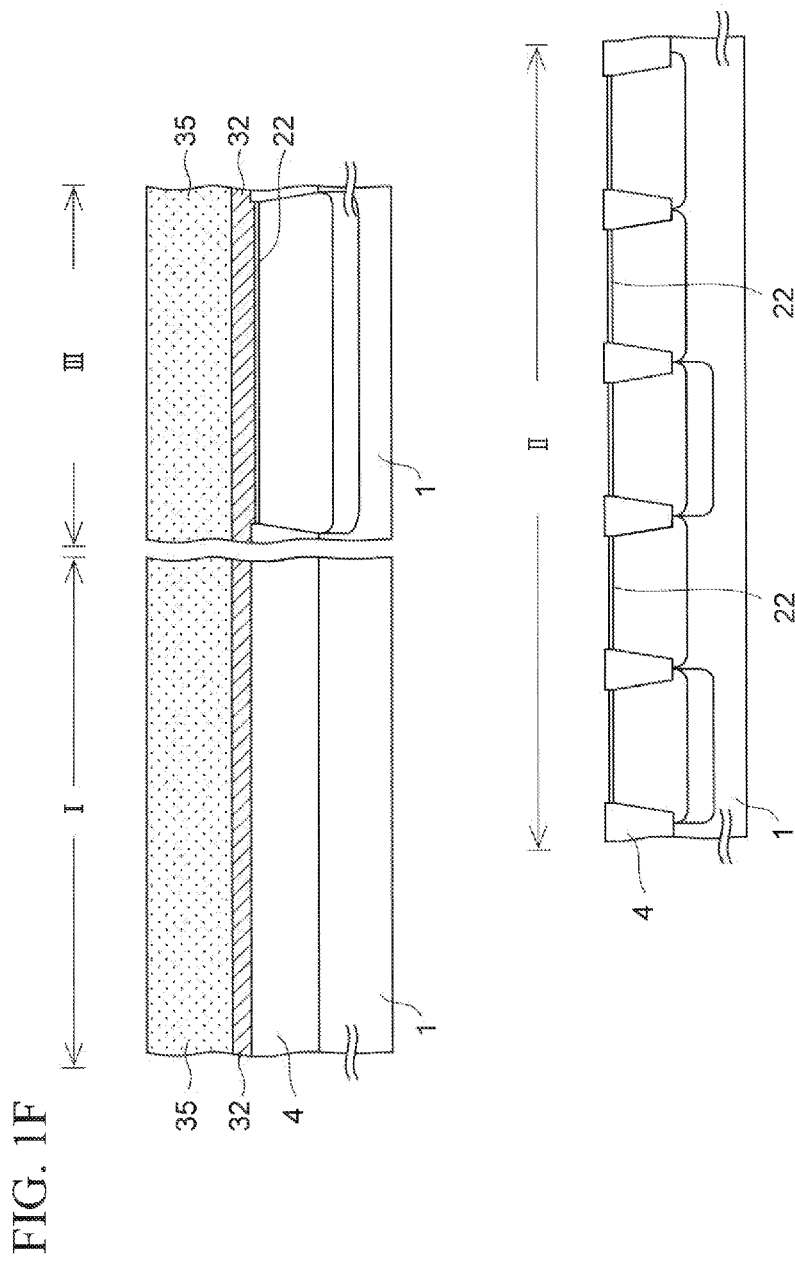

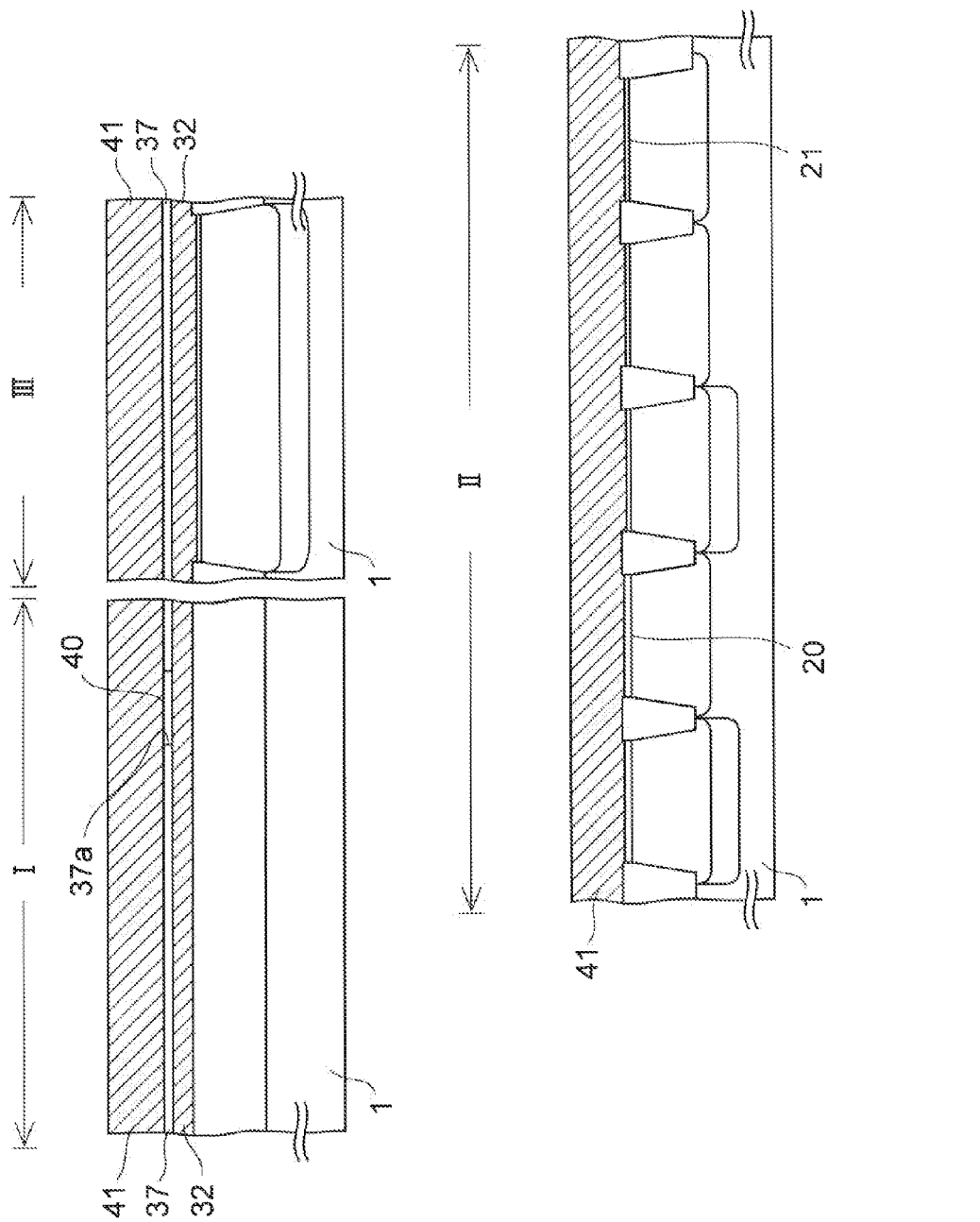

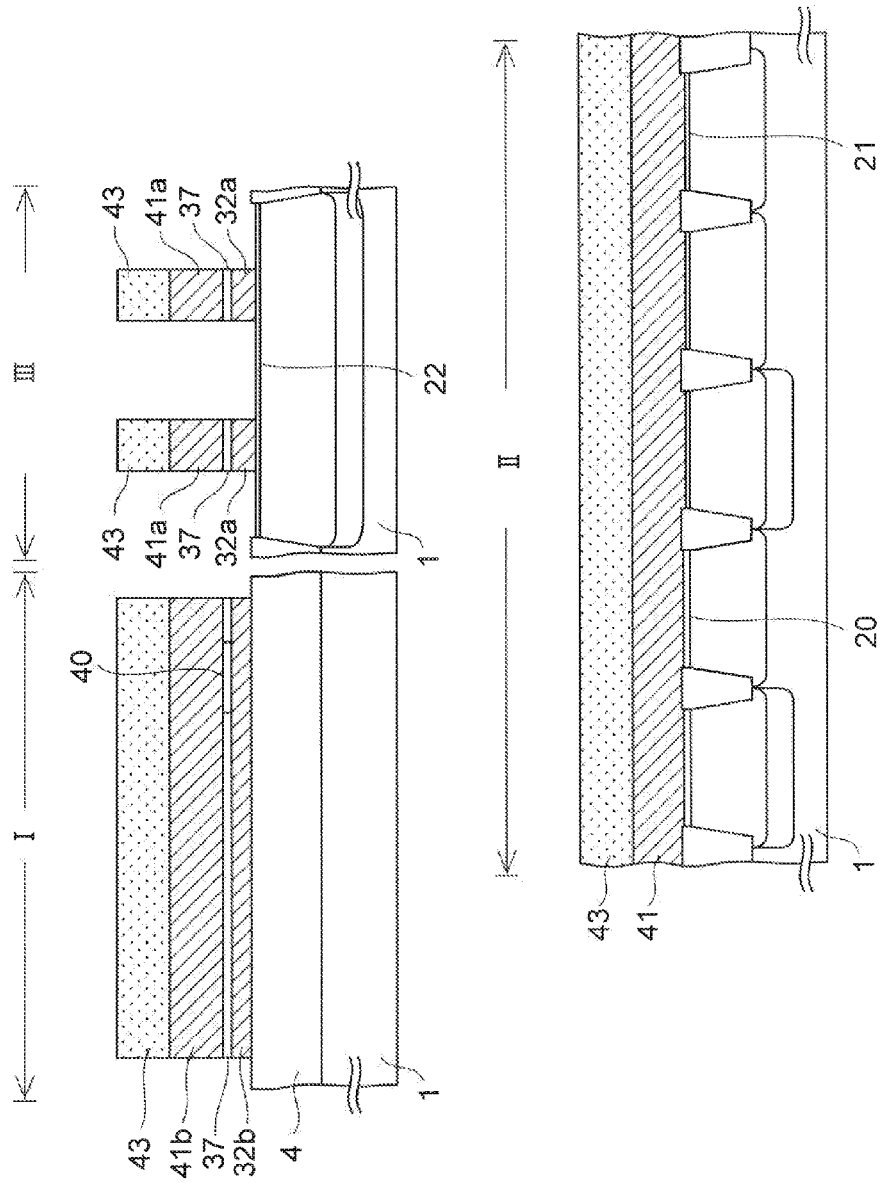

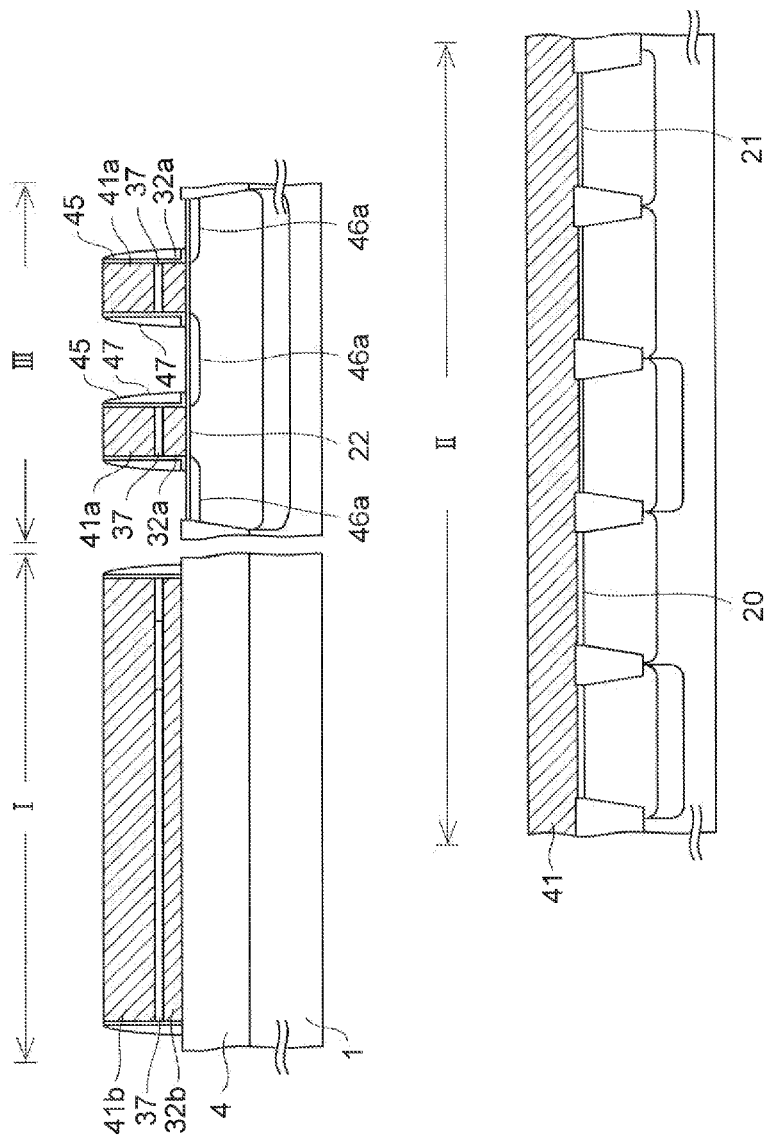

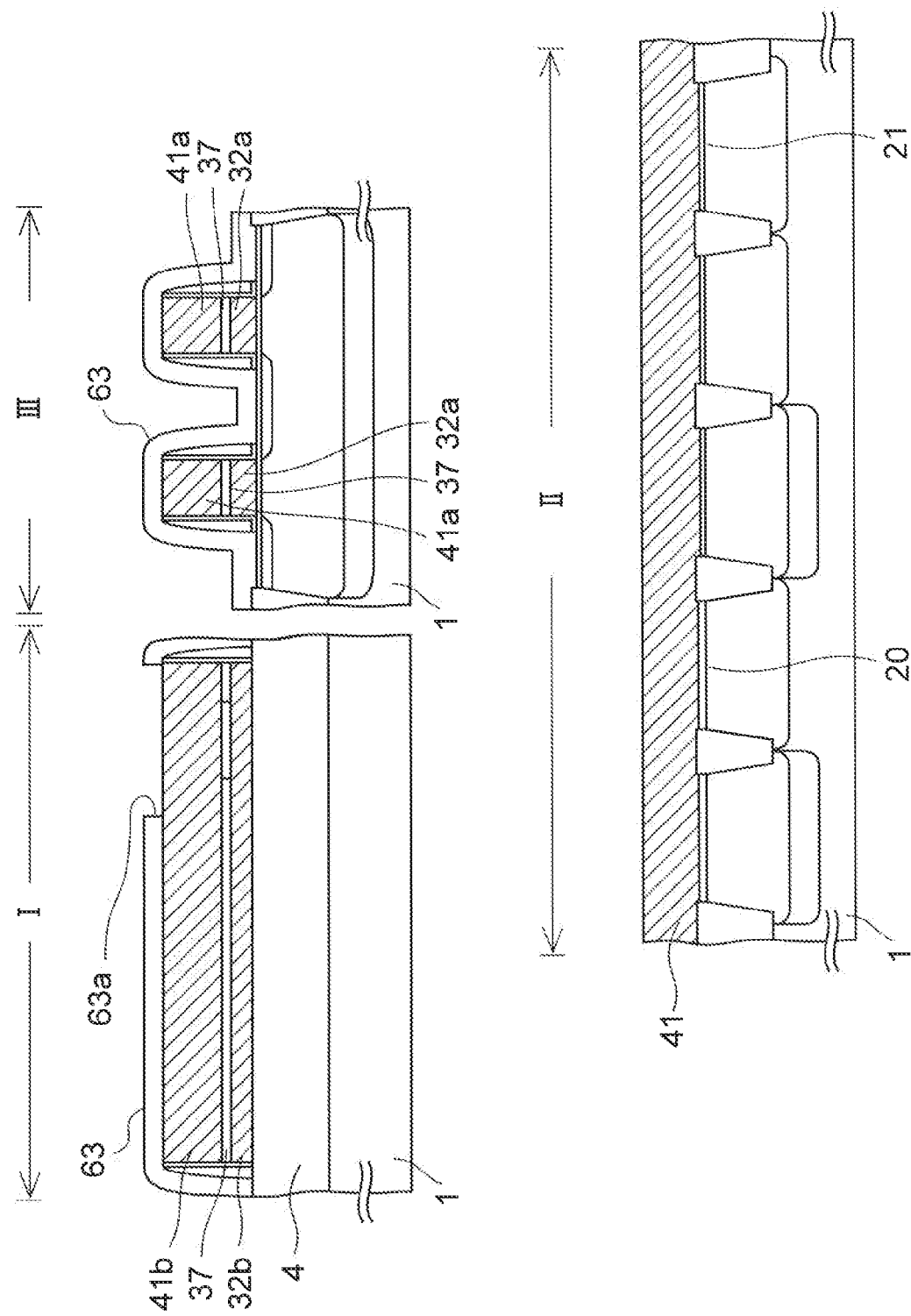

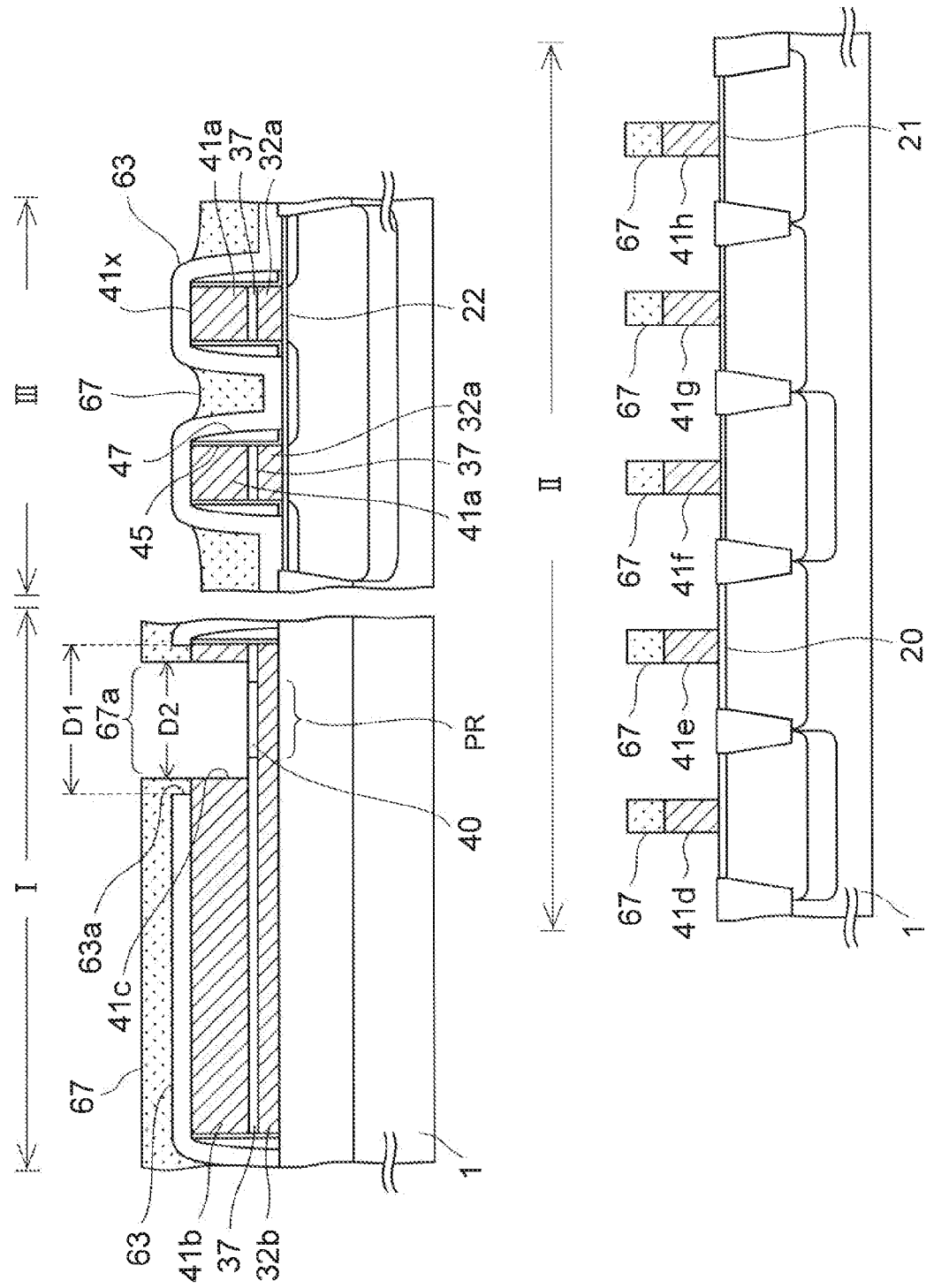

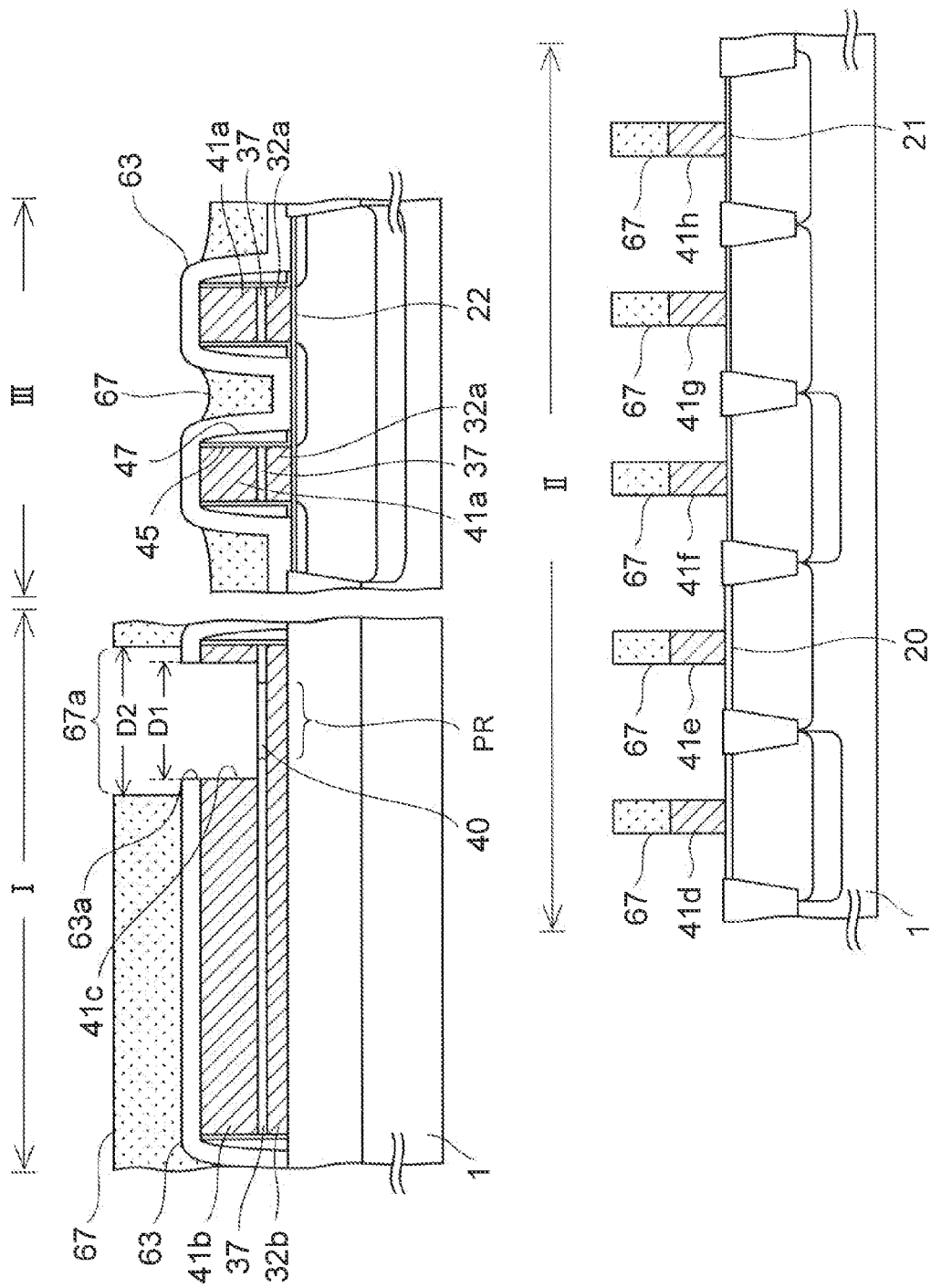

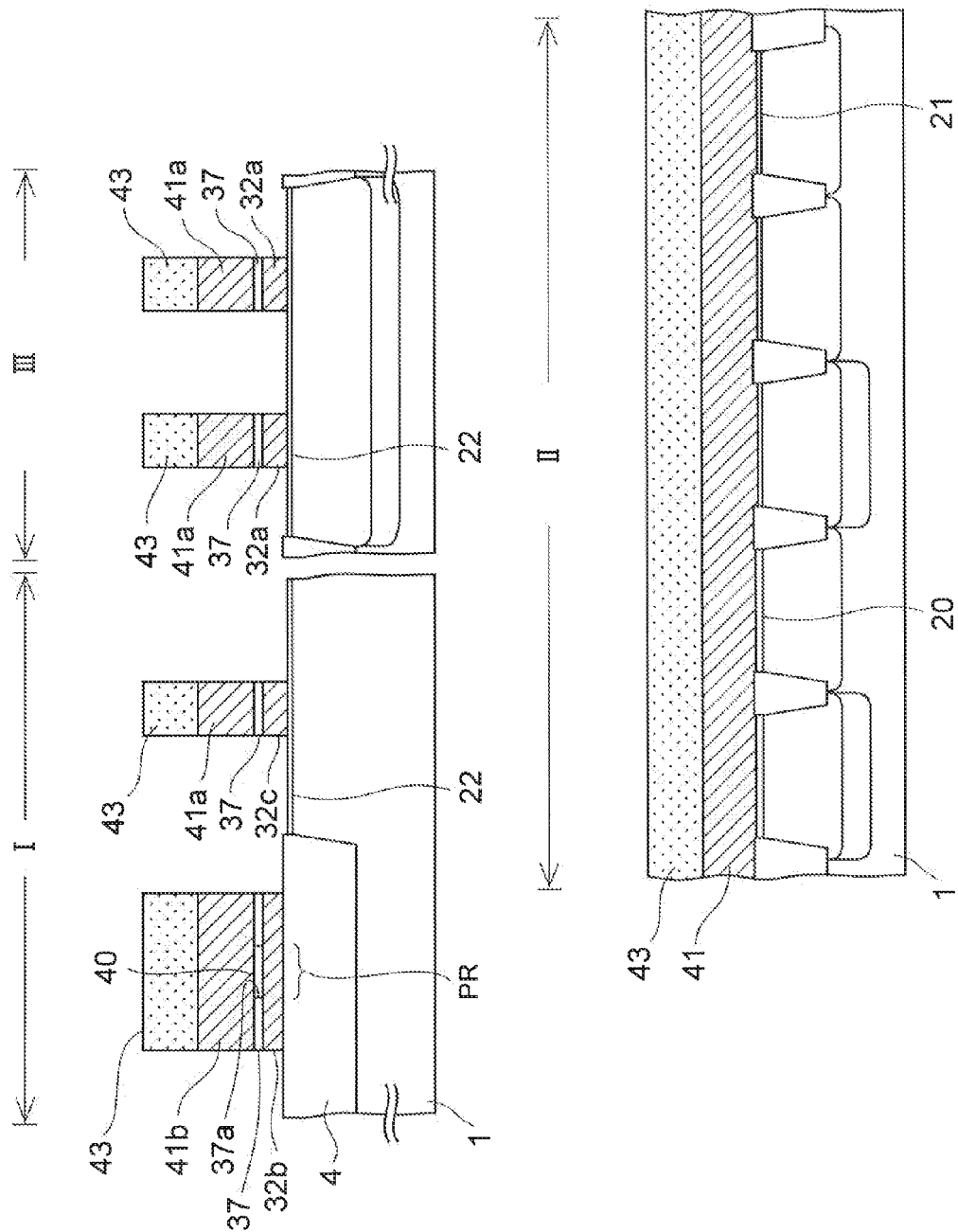

METHOD OF MANUFACTURING SEMICONDUCTOR DEVICE

CROSS-REFERENCE TO RELATED APPLICATION

This application is based upon and claims the benefit of priority of the prior Japanese Patent Application No. 2011-289254, filed on Dec. 28, 2011, the entire contents of which are incorporated herein by reference.

FIELD

The embodiments discussed herein are related to a method of manufacturing a semiconductor device.

BACKGROUND

A flash memory capable of holding data even after being powered off is used not only in mobile devices such as a mobile phone, but also in a Field Programmable Gate Array (FPGA) or the like, where the memory is embedded in logic circuits. A semiconductor device, in which a flash memory is embedded in logic circuits as in the latter device, is sometimes referred to as an embedded memory in logic.

In the embedded memory in logic, it is preferable that manufacturing processes of a flash memory and a logic circuit be utilized efficiently in combination to prevent defects in semiconductor devices to be shipped as products and achieve an improvement of the yield rate of the semiconductor devices.

[Patent Literature 1] Japanese Laid-open Patent Publication No. 10-289990

[Patent Literature 2] Japanese Laid-open Patent Publication No. 2000-311899

[Patent Literature 3] Japanese Laid-open Patent Publication No. 2002-359352

[Patent Literature 4] Japanese Laid-open Patent Publication No. 09-321043

SUMMARY

According to an aspect of the disclosure, a method of manufacturing a semiconductor device includes: forming a conductive film in a memory region and a logic region of a semiconductor substrate; forming a first gate electrode in the memory region by patterning the conductive film in the memory region while leaving the conductive film in the logic region; after forming the first gate electrode, forming a mask film above the conductive film left in the logic region, and above the first gate electrode; removing the mask film in the logic region; after removing the mask film in the logic region, forming a first resist film above the mask film left in the memory region, and above the conductive film left in the logic region; forming a second gate electrode in the logic region by etching the conductive film using the first resist film as a mask; removing the first resist film; and removing the mask film.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 3A to 3I illustrate in sectional views a semiconductor device according to a first embodiment in the course of manufacturing;

FIGS. 6A and 6B illustrate in sectional views a semiconductor device according to a second embodiment in the course of manufacturing;

FIGS. 8A to 8H illustrate in sectional views a semiconductor device according to a fourth embodiment in the course of manufacturing.

DESCRIPTION OF EMBODIMENTS

Prior to the description of embodiments, a description is given of an investigation carried out by the inventors.

In the investigation, a semiconductor device in which a flash memory is embedded in logic circuits is manufactured in the following manner.

Figure 1A:
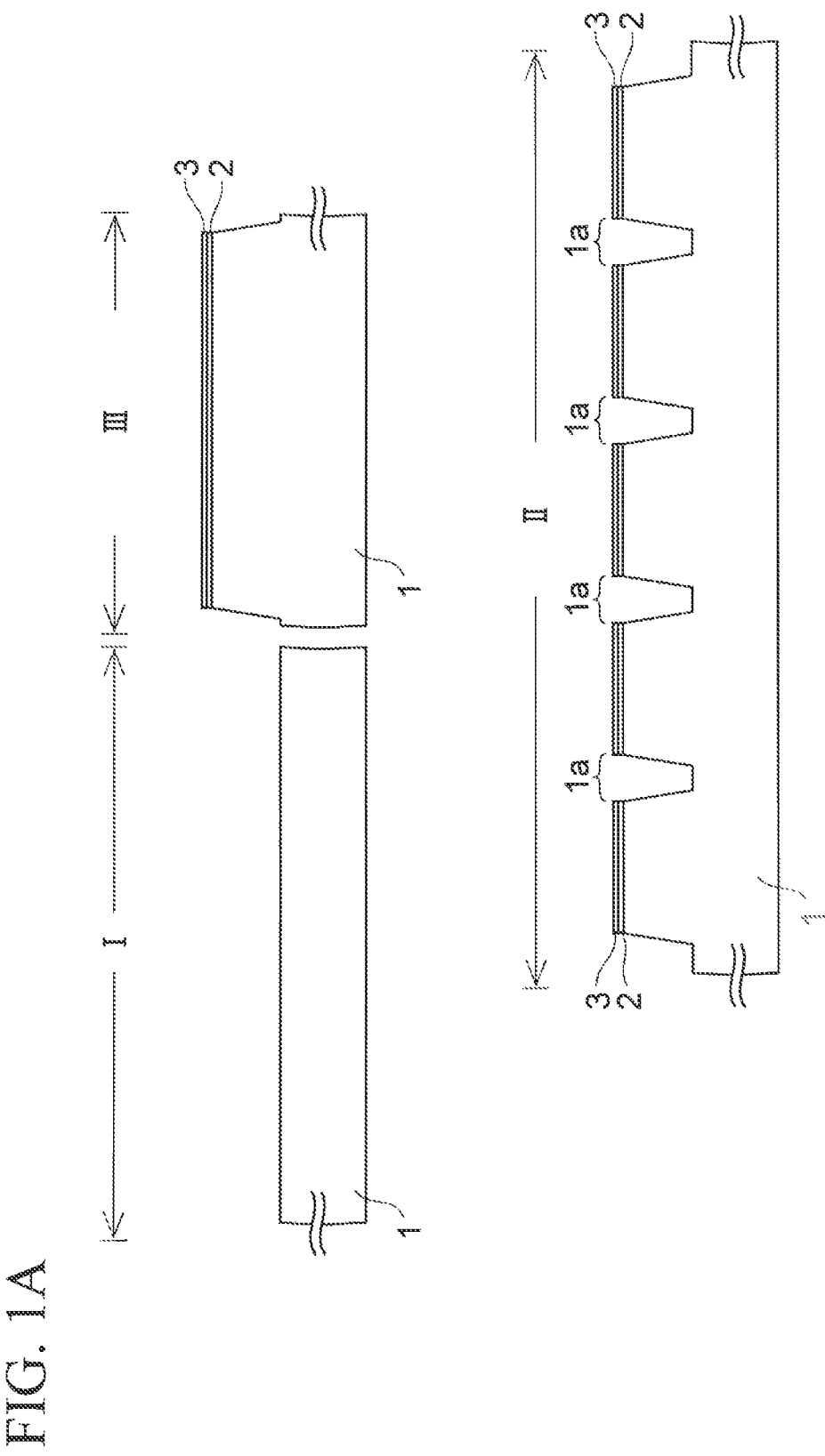
FIGS. 1A to 1T illustrate in sectional views a semiconductor device in the course of manufacturing, the semiconductor device being used in an investigation.
Figure 1G:
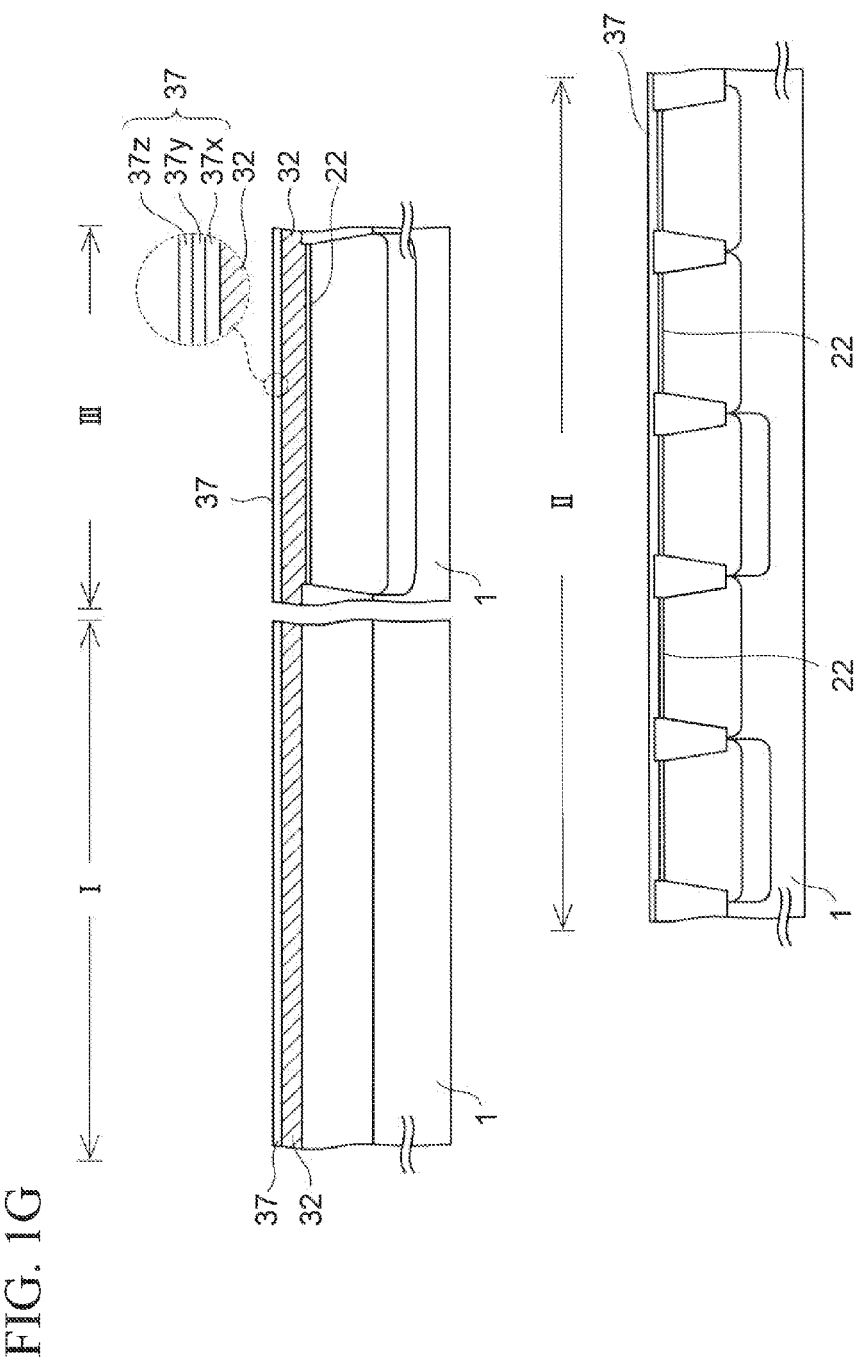
Figure 1H:
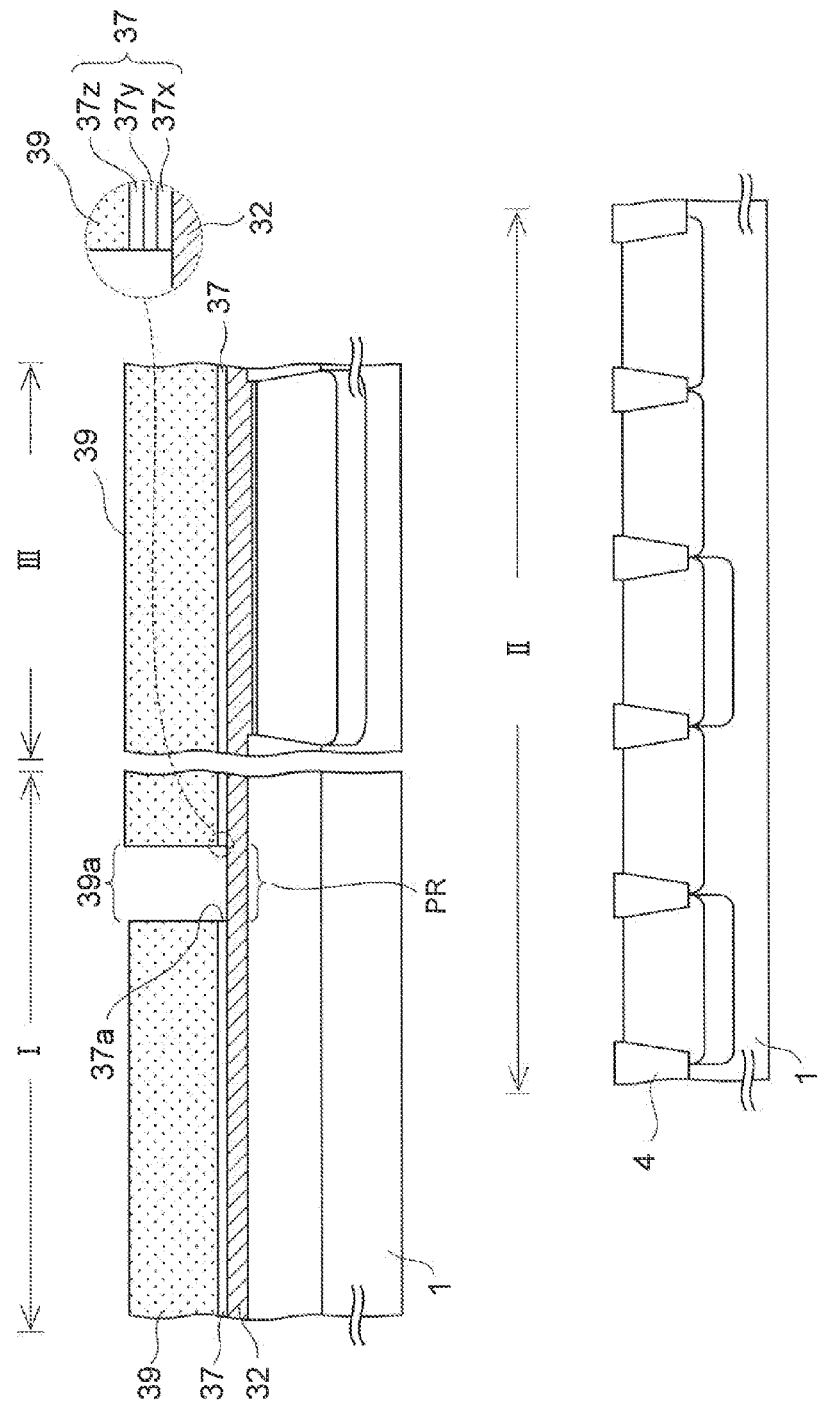
Figure 11:
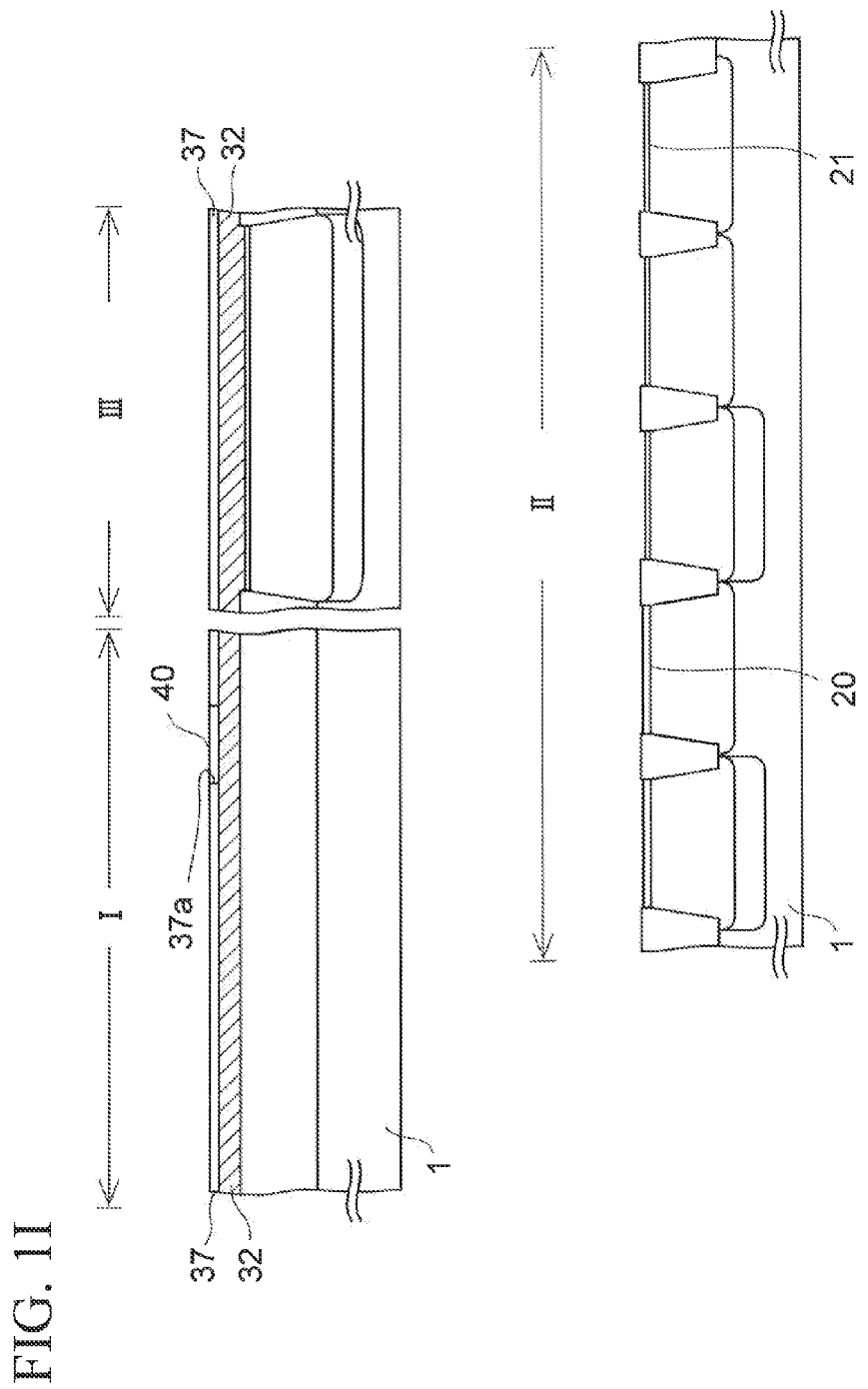
Figure 1L:
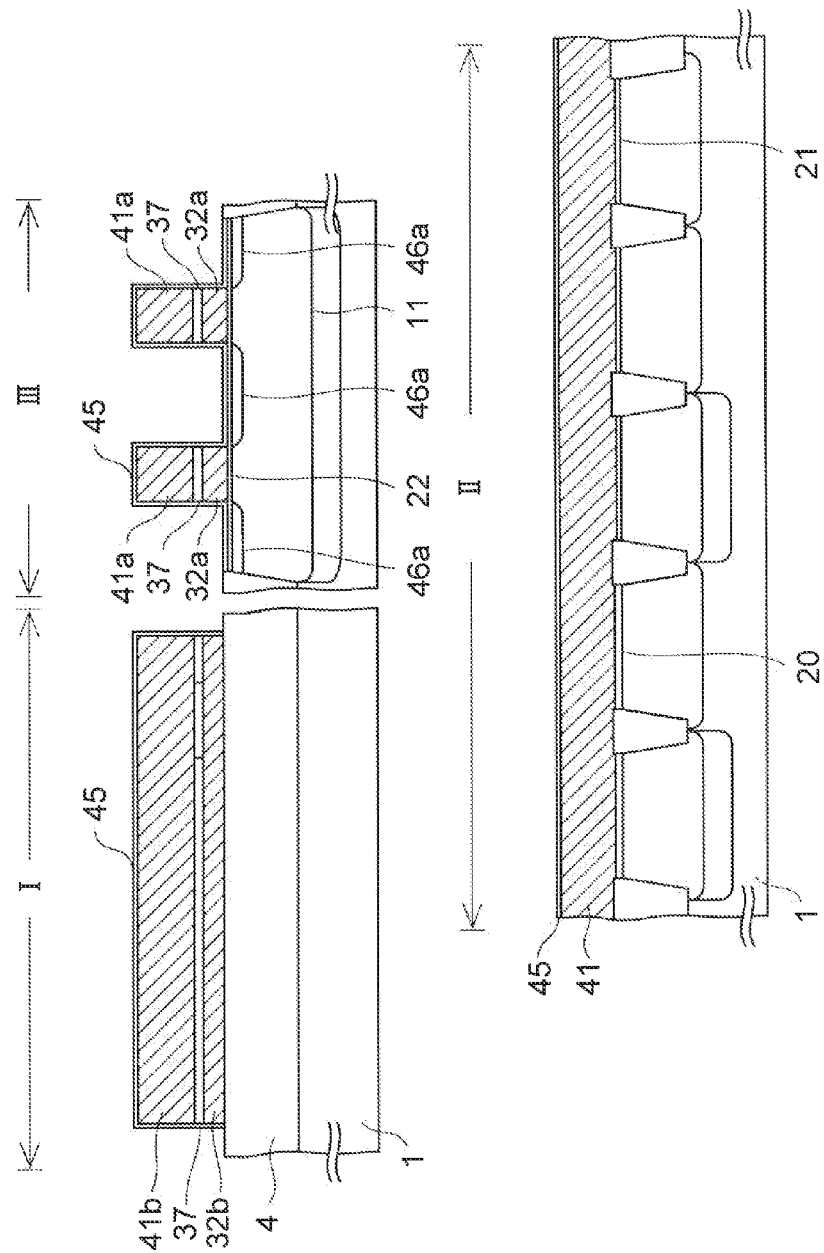
Figure 1N:
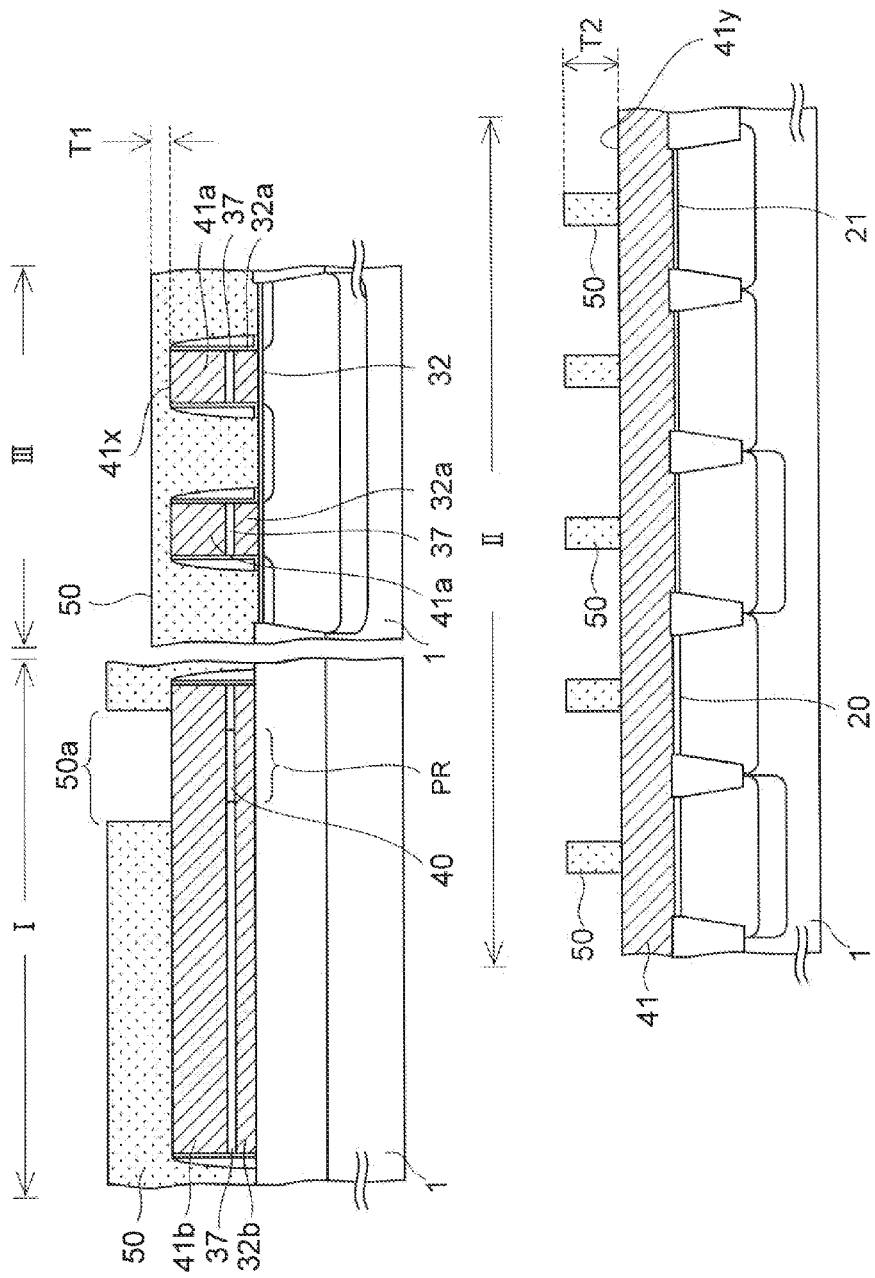
Figure 10:
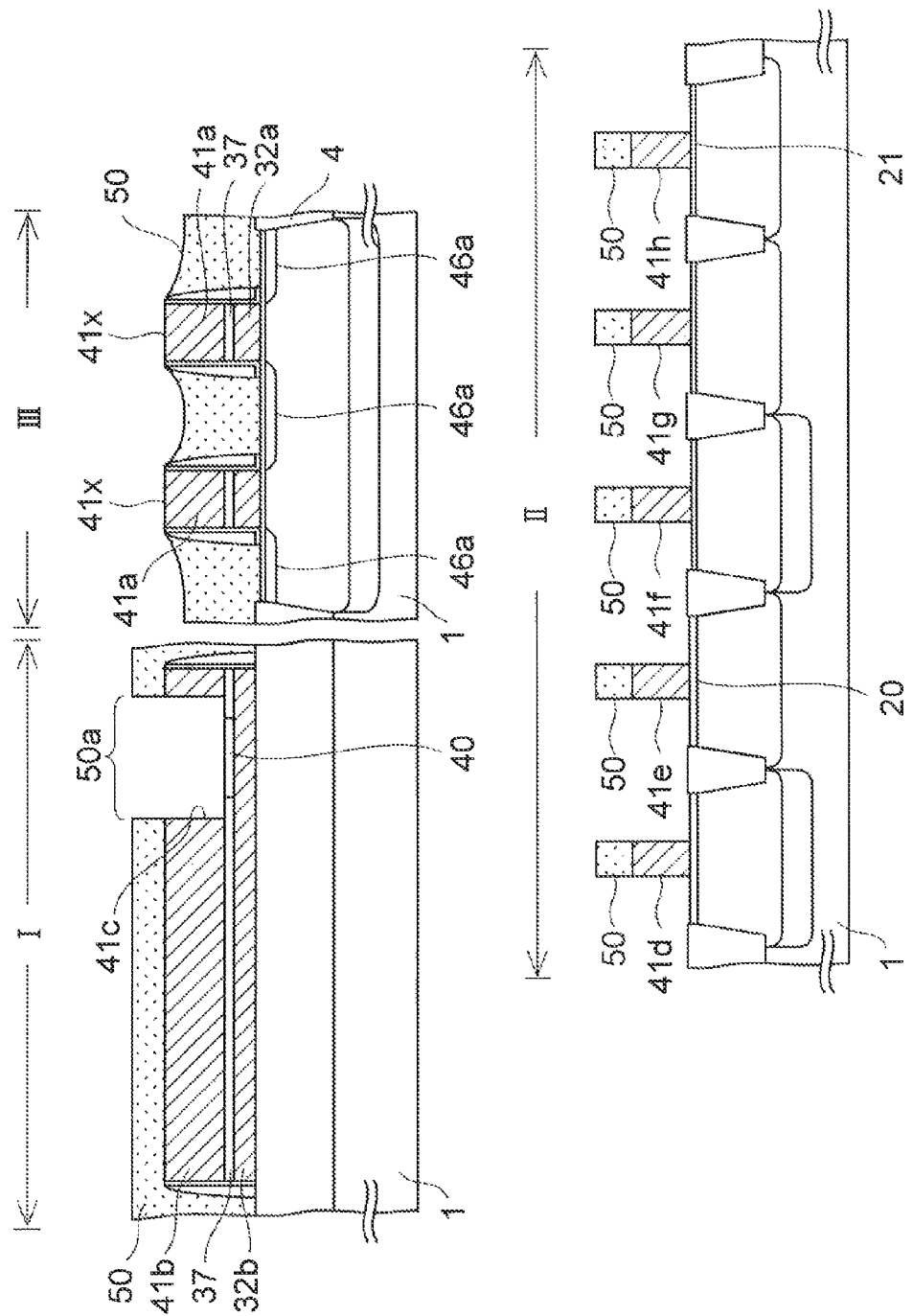
Figure 1P:
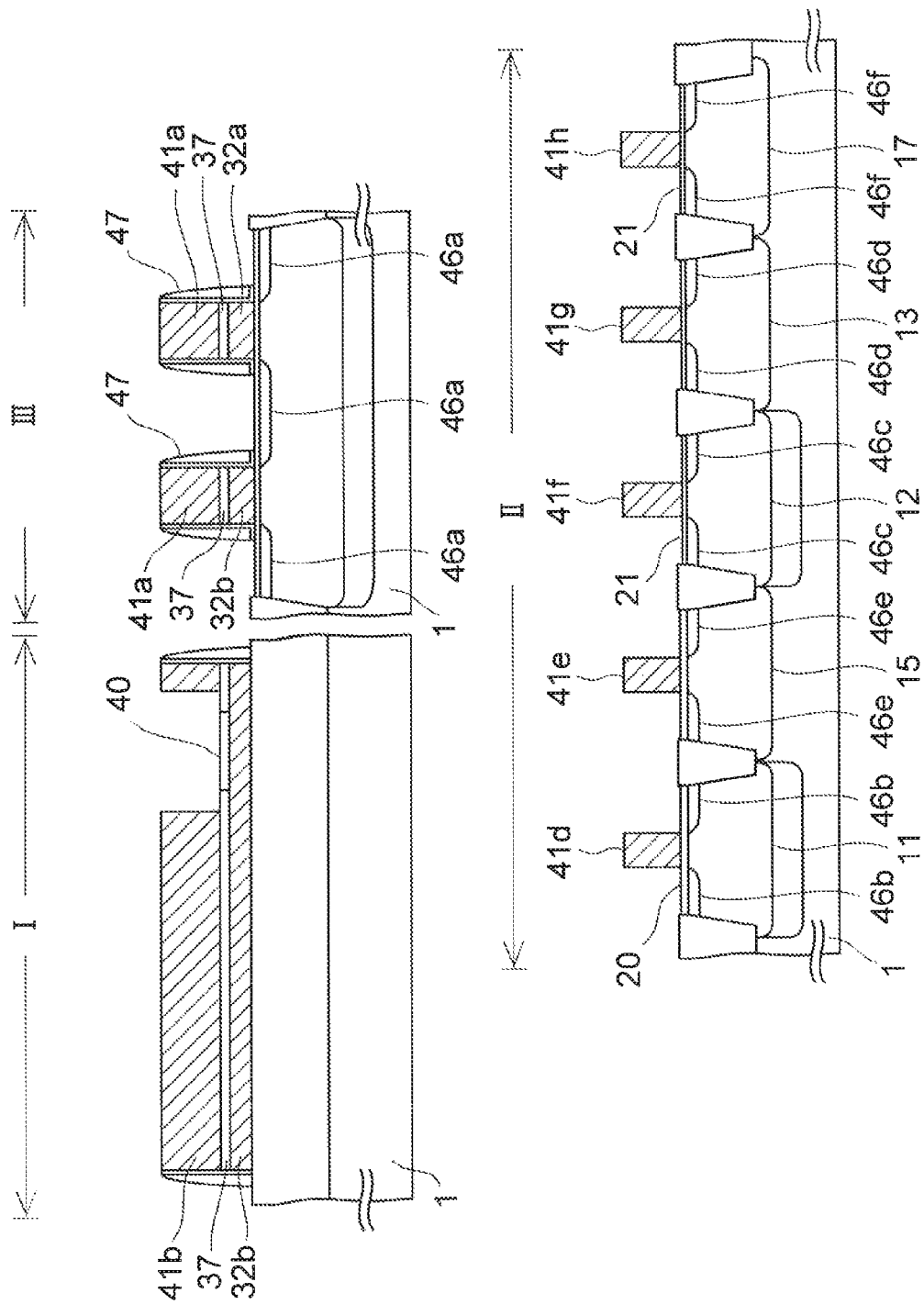
Figure 1Q:
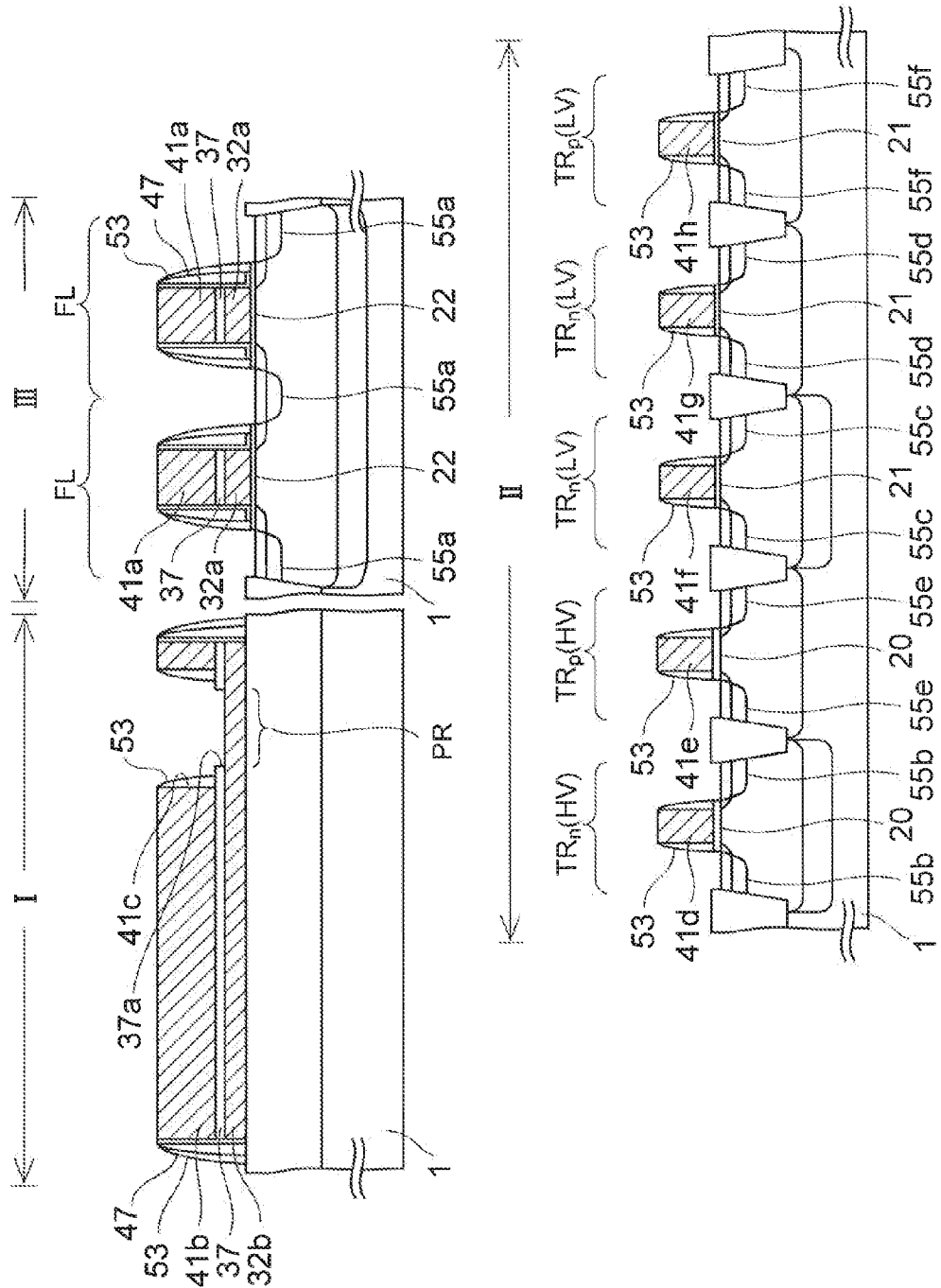
Figure 1R:
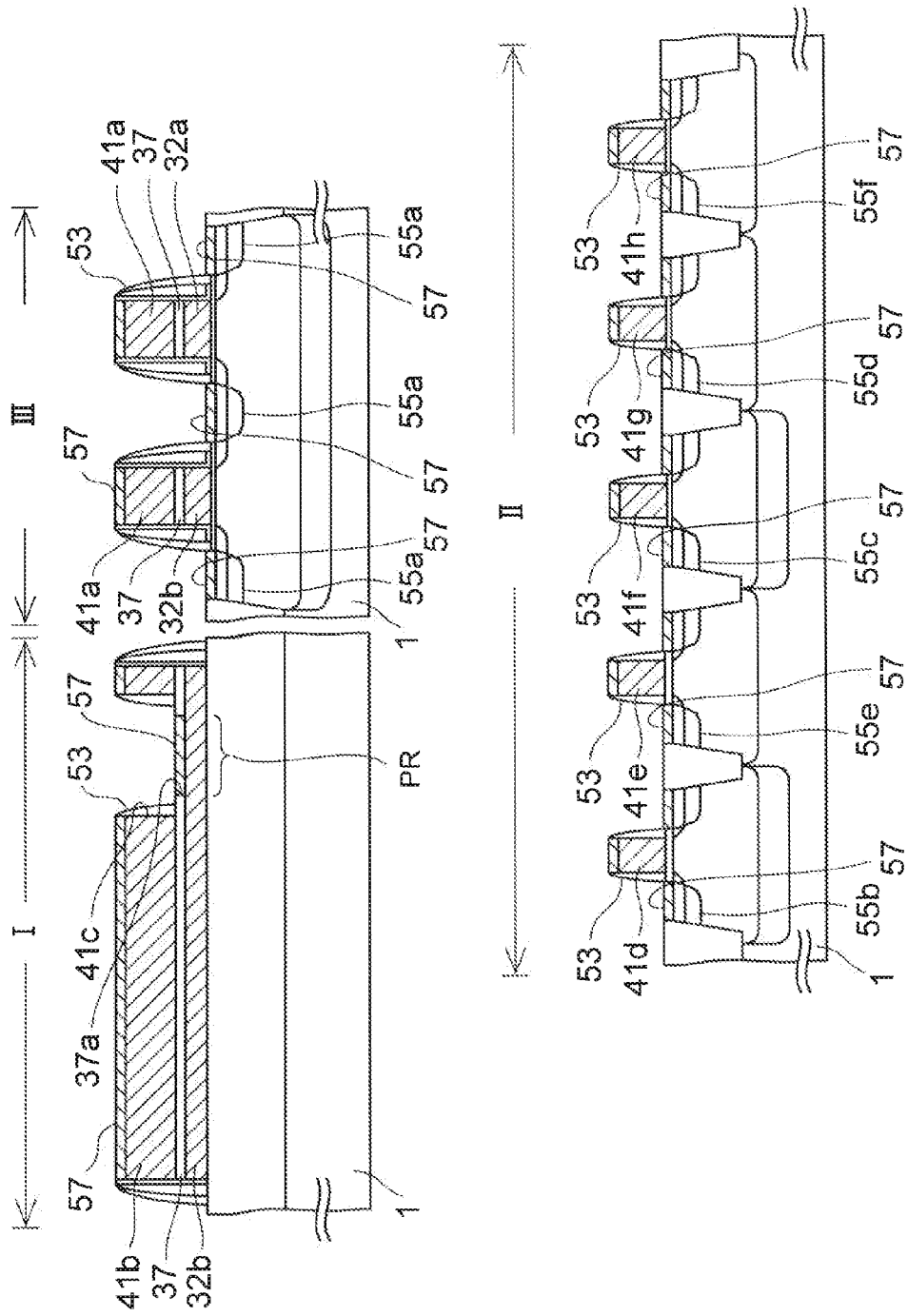
Figure 1S:
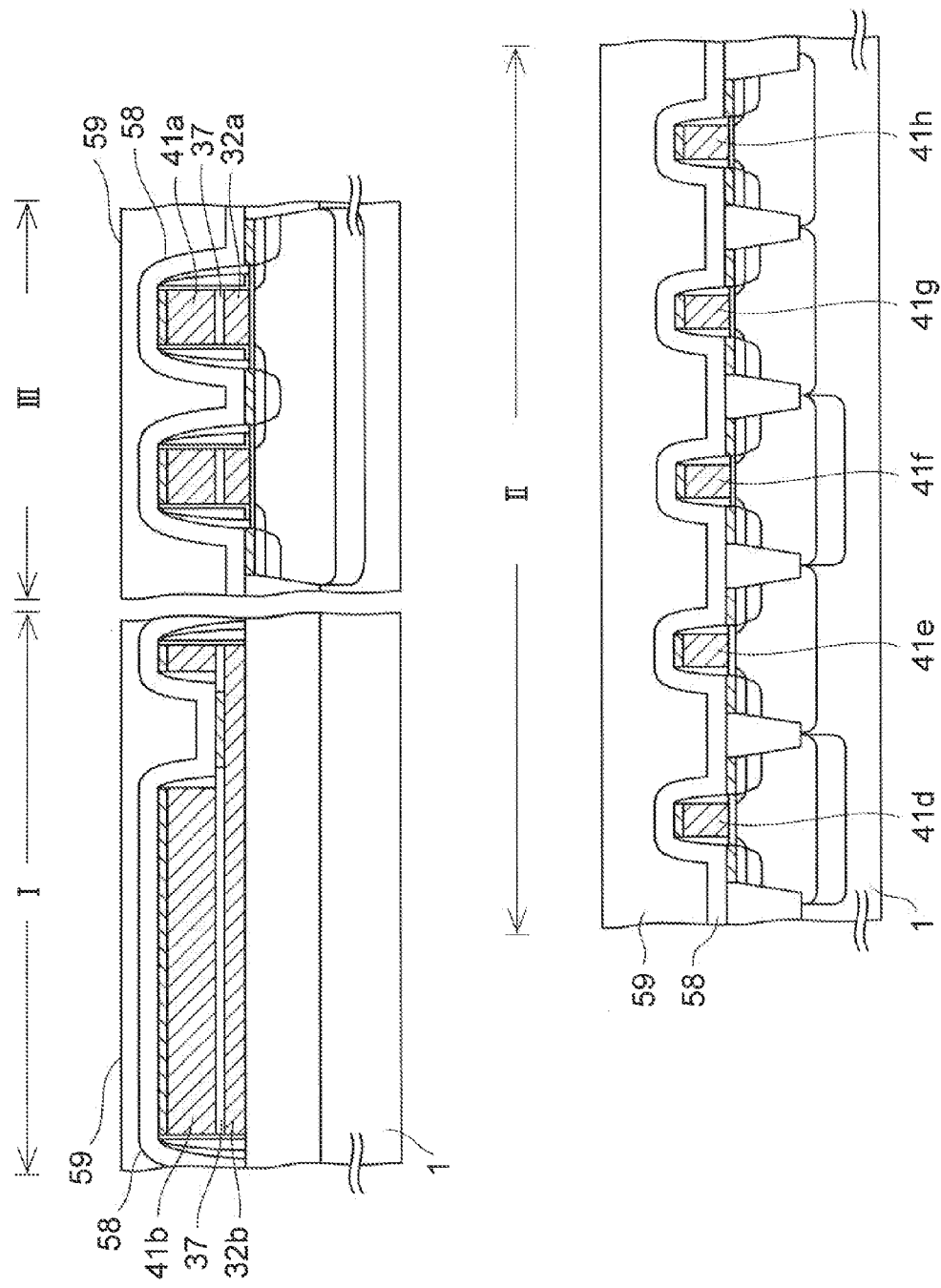
Figure 1T:
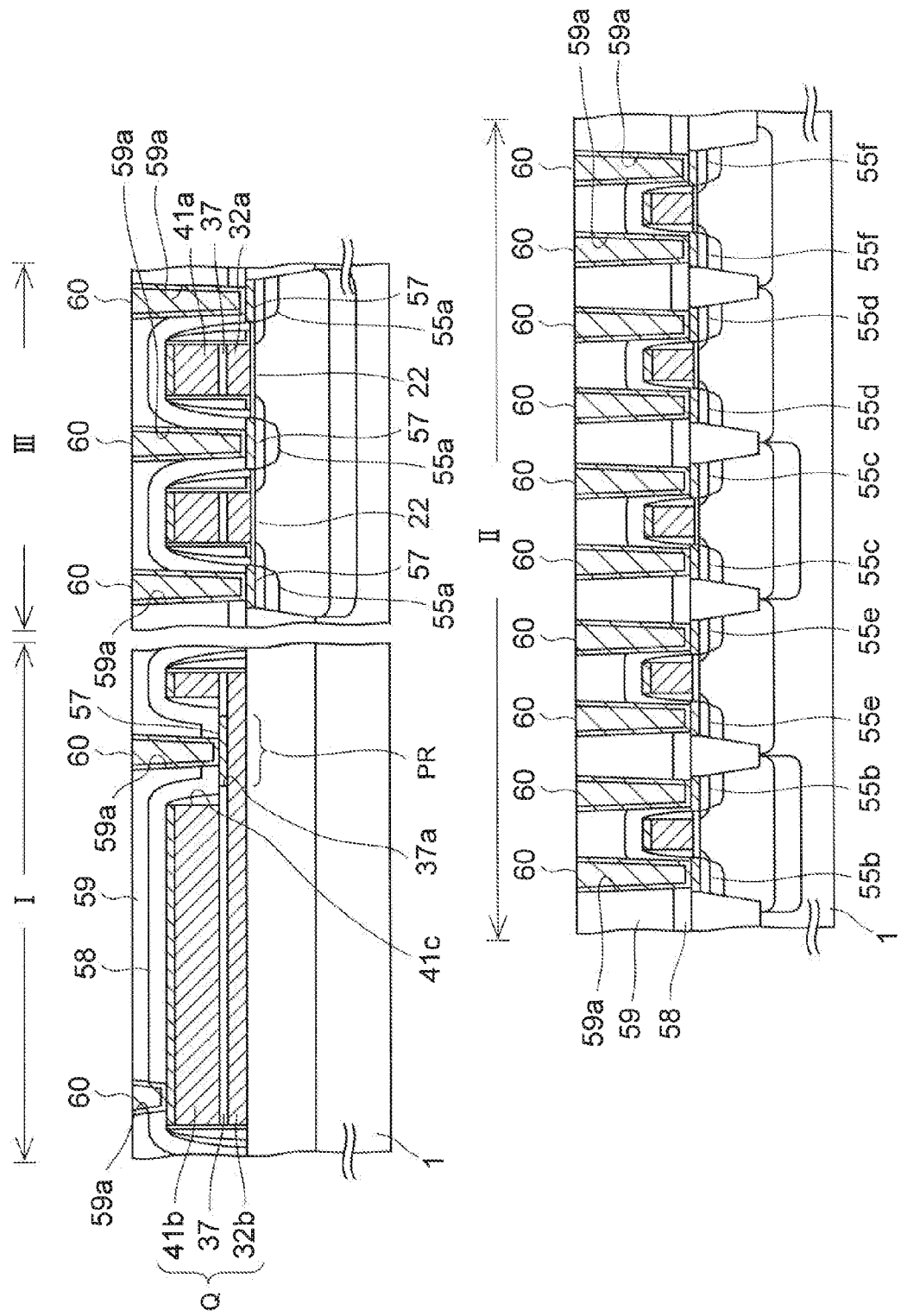

FIGS. 1A to 1T illustrate in sectional views the semiconductor device used in the investigation, in the course of manufacturing.

Firstly, a description is given of processes for obtaining the cross section structure illustrated in FIG. 1A.

At first, a first silicon thermal oxide film 2 and a silicon nitride film 3 are formed in this order on a p-type silicon substrate 1.

Note that the silicon substrate 1 is an example of a semiconductor substrate, and includes a logic region in addition to a memory region III where a flash memory cell is formed. The logic region includes a first logic region I and a second logic region II.

Next, after patterning the first silicon thermal oxide film 2 and the silicon nitride film 3, the silicon substrate 1 is dry etched by using these films as a mask, to form an element isolation trench 1a for STI.

Then, as illustrated in FIG. 1B, a silicon oxide film formed by Chemical Vapor Deposition (CVD) is filled in the element isolation trench 1a as an element isolation insulating film 4.

Thereafter, the first silicon thermal oxide film 2 and the silicon nitride film 3 are removed by wet etching.

Next, a description is given of processes for obtaining the cross section structure illustrated in FIG. 1C.

Firstly, $P^+$ ions are implanted by ion implantation into the memory region III as an n-type impurity, to form a first n well 14 in a deep portion of the silicon substrate 1. Then, $B^+$ ions being a p-type impurity are implanted into the memory region III, to form a first p well 11 in a portion shallower than the above first n well 14 in the silicon substrate 1.

The above first n well 14 and first p well are also formed in a region in the second logic region II, where a high-voltage transistor is later formed.

Further, ions are implanted into remaining regions in the second logic region II to form second and third p wells 12 and 13, and second to fourth n wells 15 to 17 as in FIG. 1C. Note that among these wells, the third n well 16 is formed deeper than the second p well 12.

In addition, the ions are implanted through an unillustrated silicon thermal oxide film formed on the surface of the silicon substrate 1. When all the ions are implanted, the silicon thermal oxide film is removed by wet etching.

Next, as illustrated in FIG. 1D, the surface of the silicon substrate 1 is thermally oxidized in a mixed atmosphere including Ar (argon) gas and $O_2$ (oxygen) gas, to form a silicon thermal oxide film as a tunnel insulating film 22 in each of the first logic region I, the second logic region II, and the memory region III.

Conditions for this thermal oxidation are not particularly limited. In the first embodiment, the tunnel insulating film 22 is formed with approximately 10 nm thickness under condition that the substrate temperature is 900° C. to 1050° C.

Next, as illustrated in FIG. 1E, a polysilicon film is formed with approximately 90 nm thickness as an underlying conductive film 32, on the tunnel insulating film 22 by low-pressure CVD using $SiH_4$ (silane) and $PH_3$ (phosphine) as a reactant gas. With this treatment, phosphorous is in situ doped into the polysilicon film from $PH_3$ in the reactant gas.

Then, as illustrated in FIG. 1F, a photoresist is applied onto the underlying conductive film 32, and the photoresist is exposed and developed to form a first resist film 35.

Thereafter, the underlying conductive film 32 is dry etched by using the first resist film 35 as a mask. Thus, the underlying conductive film 32 in the second logic region II is removed while leaving the underlying conductive film 32 in the first logic region I and in the memory region III.

While an etching gas for this dry etching is not particularly limited, in the first embodiment, a mixed gas including $Cl_2$, HBr, and $CF_4$ is used as the etching gas.

Thereafter, the first resist film 35 is removed.

Next, as illustrated in FIG. 1G, a first silicon oxide film 37x and a silicon nitride film 37y are formed in this order with thicknesses of 5 nm and 10 nm, respectively by low-pressure CVD, on the underlying conductive film 32 and on the tunnel insulating film 22 in the second logic region II.

Further, the surface of the silicon nitride film 37y is oxidized in an oxygen atmosphere, under conditions that the substrate temperature is approximately 950° C., and the heating time is approximately 90 minutes. With this, a second silicon oxide film 37z is formed with approximately 30 nm thickness on the surface of the silicon nitride film 37y.

With these processes, an ONO film in which the first silicon oxide film 37x, the silicon nitride film 37y, and the second silicon oxide film 37z are laminated in this order is formed as an intermediate insulating film 37 on an entire top surface of the silicon substrate 1.

Next, as illustrated in FIG. 1H, a photoresist is applied onto each of the first logic region I, the second logic region II, and the memory region III, and the photoresist is exposed and developed to form a second resist film 39.

Note that the second logic region II is not covered with the second resist film 39, but is exposed. In addition, in the second resist film 39 in the first logic region I, a window 39a is formed on a partial region PR of the underlying conductive film 32.

Then, by using the second resist film 39 as a mask, a portion of the intermediate insulating film 37 not covered with the second resist film 39 is removed by etching.

This etching is performed in two steps. In the first step, the second silicon oxide film 37z and the silicon nitride film 37y of the intermediate insulating film 37 are dry etched, by using a mixed gas including $CH_3$ and $O_2$ as the etching gas. Then, in the second step, the first silicon oxide film 37x of the intermediate insulating film 37 is removed by wet etching using hydrofluoric acid. Note that the tunnel insulating film 22 in the second logic region II is also removed by the wet etching in the second step.

A first opening 37a is formed in the intermediate insulating film 37 in the first logic region I by the etching described above. Hence, the partial region PR of the underlying conductive film 32 is exposed from the first opening 37a, and a clean surface of the silicon substrate 1 in the second logic region II is also exposed.

Then, the surface of the silicon substrate 1 is cleaned by a wet treatment after removing the second resist film 39.

Next, a description is given of processes for obtaining the cross section structure illustrated in FIG. 1I.

Firstly, silicon at portions not covered with the intermediate insulating film 37 is thermally oxidized in an oxygen atmosphere, under an oxidation condition that the substrate temperature is approximately 850° C.

With this treatment, a second silicon thermal oxide film 40 is formed on the surface of the underlying conductive film 32 exposed from the first opening 37a, and a silicon thermal oxide film is formed as a first gate insulating film 20 on the surface of the silicon substrate 1 in the second logic region II.

Next, a portion of the gate insulating film 20 in the second logic region II where a low-voltage transistor is later formed is removed, so that a clean surface of the silicon substrate 1 is exposed.

Then, the clean surface thus exposed is thermally oxidized in an oxygen atmosphere under an oxidation condition that the substrate temperature is approximately 700° C. to 800° C. With this treatment, a silicon thermal oxide film is formed with approximately 1.7 nm thickness as a second gate insulating film 21.

Note that this thermal oxidation also makes the first gate insulating film 20 thicker, and the thickness thereof grows to approximately 16 nm upon completion of this process.

Subsequently, as illustrated in FIG. 1J, an undoped polysilicon film is formed with approximately 180 nm thickness as a conductive film 41, in each of the first logic region I, the second logic region II, and the memory region III. The conductive film 41 is formed by low-pressure CVD using silane as a reactant gas.

Next, a description is given of processes for obtaining the cross section structure illustrated in FIG. 1K.

Firstly, a photoresist is applied onto the conductive film 41, and the photoresist is exposed and developed to form a third resist film 43.

Then, the underlying conductive film 32, the intermediate insulating film 37, and the conductive film 41 are dry etched by using the third resist film 43 as a mask.

In this dry etching, a mixed gas including $Cl_2$ and $O_2$ is used as the etching gas for the underlying conductive film 32 and the conductive film 41 made of polysilicon, whereas a mixed gas including $CH_3$ and $O_2$ is used as the etching gas for the ONO film formed as the intermediate insulating film 37.

As a result of the dry etching, a floating gate 32a is made from the underlying conductive film 32, and a first gate electrode 41a is made from the conductive film 41 in the memory region III. As is described later, the first gate electrode 41a serves as a control gate in the flash memory cell to be formed in the memory region III.

In addition, a first conductive pattern 32b and a second conductive pattern 41b are made from the underlying conductive film 32 and the conductive film 41, respectively, in the first logic region I.

Thereafter, the third resist film 43 is removed.

Subsequently, as illustrated in FIG. 1L, a third silicon thermal oxide film 45 is formed with approximately 10 nm thickness on lateral surfaces of the floating gate 32a and the first gate electrode 41a, by thermally oxidizing the lateral surfaces thereof. The third silicon thermal oxide film 45 plays a role in improving a retention characteristic of the flash memory cell to be formed in a final process.

Thereafter, by ion implantation using the floating gates 32a as a mask, ions of As are implanted as an n-type impurity into the silicon substrate 1 at sides of the floating gates 32a, to form first n-type source and drain extensions 46a.

Next, as illustrated in FIG. 1M, an insulating film is formed in each of the first logic region I, the second logic region II, and the memory region III, and the insulating films are etched back by Reactive Ion Etching (RIE) to form first side wall insulating films 47 at sides of the first gate electrodes 41a. In the first embodiment, a silicon nitride film is formed by plasma CVD as the insulating film.

Although the third silicon thermal oxide film 45 is also etched in the above etch back treatment, in the memory region III, the first side wall insulating films 47 serve as a mask, and thus the third silicon thermal oxide film 45 remains on lateral surfaces of the first gate electrodes 41a, and on the silicon substrate 1 at sides of the first gate electrodes 41a.

Next, as illustrated in FIG. 1N, a photoresist is applied onto each of the first logic region I, the second logic region II, and the memory region III, and the photoresist is exposed and developed to form a fourth resist film 50.

In the first logic region I, the fourth resist film 50 has a window 50a above the partial region PR, and in the second logic region II, the fourth resist film 50 is formed in the shape of gate electrodes.

Moreover, in the memory region III, top surfaces 41x of the first gate electrodes 41a are covered with the fourth resist film 50.

The thickness of the fourth resist film 50 applied in the above manner depends on irregularities of the foundation. Hence, although the fourth resist film 50 is formed with a sufficient thickness on a flat foundation, if there is an irregularity in the foundation, the photoresist flows into the concave portion and the film is formed thin.

In this example, the top surface 41y of the conductive film 41 left in the second logic region II is flat. In contrast, in the memory region III, the irregularity in the foundation is made larger than in the second logic region II because of the first gate electrodes 41a. Accordingly, a thickness T1 of the fourth resist film 50 on the top surface 41x of the first gate electrode 41a is smaller than a thickness T2 of the fourth resist film 50 in the second logic region II. Thus, the thickness of the fourth resist film 50 on the first gate electrode 41a tends to be insufficient.

Subsequently, as illustrated in FIG. 1O, the second conductive pattern 41b in the first logic region I and the conductive film 41 in the second logic region II are dry etched, by using a mixed gas including $Cl_2$ and $O_2$ as the etching gas, and the fourth resist film 50 as a mask.

As a result of the dry etching, a second opening 41c is formed in the second conductive pattern 41b in the first logic region I, and the conductive film 41 in the second logic region II is patterned to form second to sixth gate electrodes 41d to 41h.

At this time, the fourth resist film 50 serving as a mask in this process is also etched and made thinner. In particular, on the first gate electrodes 41a, the fourth resist film 50 is originally formed thin, and thus the fourth resist film 50 is removed by this dry etching. Consequently, the top surfaces 41x of the first gate electrodes 41a are exposed to the etching atmosphere.

Note that the fourth resist film 50 may be previously formed thick to prevent the fourth resist film 50 from being removed from the first gate electrode 41a. However, if the fourth resist film 50 is formed excessively thick, the aspect ratio of the fourth resist film 50 having the gate electrode shape in the second logic region II gets so high that the fourth resist film 50 may collapse and cause a pattern defect in the second logic region II.

Accordingly, to prevent occurrence of the pattern defect, the fourth resist film 50 may need to be formed thin to some extent, and the aforementioned exposure of the gate electrode 41a may be inevitable.

Thereafter, the fourth resist film 50 is removed.

Figure 2:
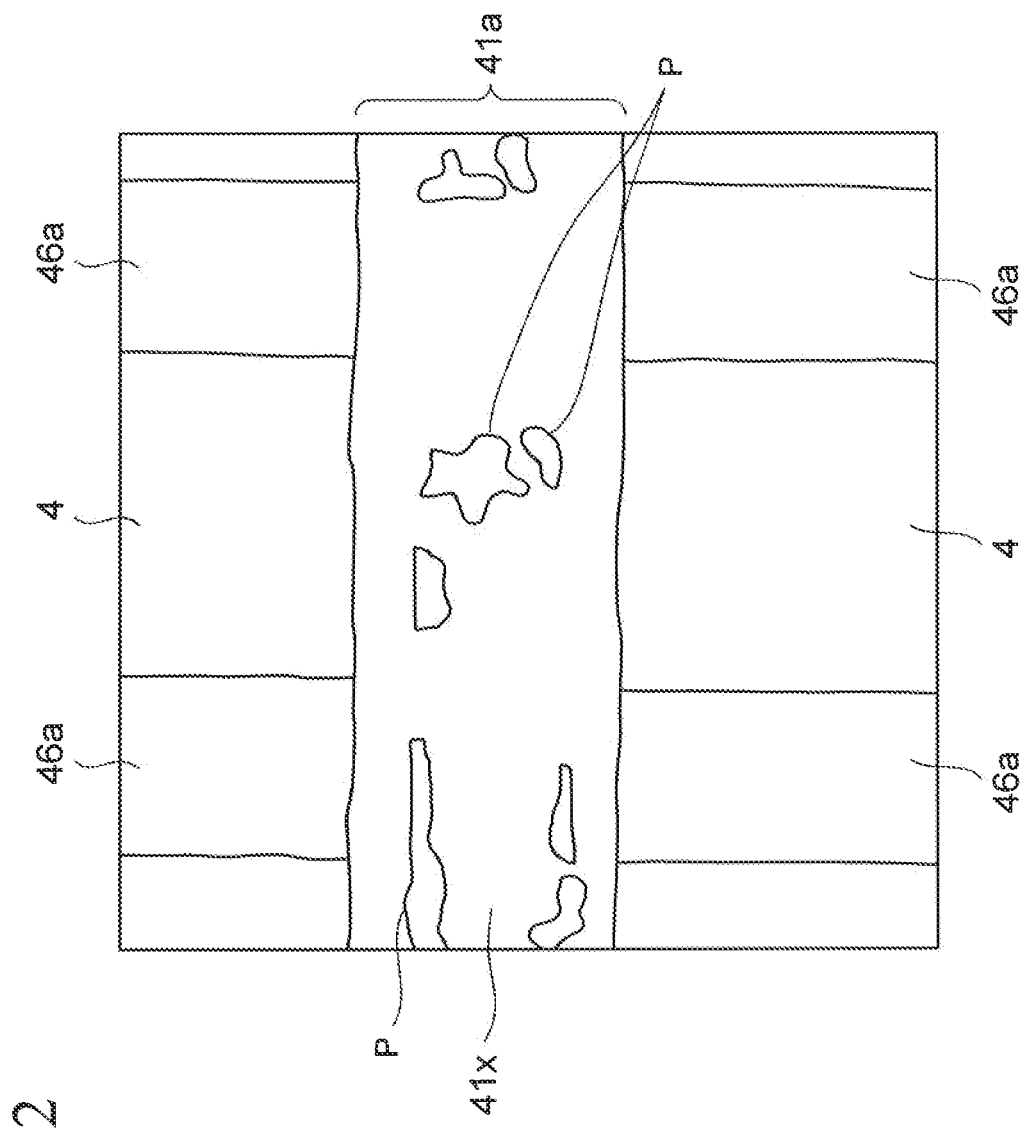
FIG. 2 is a diagram depicted on the basis of an image obtained from observing a top surface of a first gate electrode of the semiconductor device used in the investigation, the observation being made with an SEM.

FIG. 2 is a diagram depicted on the basis of an image obtained from observing the top surface 41x of the first gate electrode 41a with a Scanning Electron Microscope (SEM), after completing the above processes.

As illustrated in FIG. 2, damages P occur on the top surface 41x having been exposed to the etching atmosphere as described above.

Next, as illustrated in FIG. 1P, second to fourth n-type source and drain extensions 46b to 46d, as well as first and second p-type source and drain extensions 46e and 46f are formed in the silicon substrate 1 in the second logic region II.

Note that this process is performed by implanting ions while using the second to sixth gate electrodes 41d to 41h as a mask, and the p-type and n-type impurities are selectively implanted by use of an unillustrated resist film.

Next, as illustrated in FIG. 1Q, an insulating film is formed in each of the first logic region I, the second logic region II, and the memory region III. Then, the insulating films are etched back by RIE, so that remainders thereof may serve as second side wall insulating films 53 at sides of the first gate electrodes 41a in the memory region III. The insulating film is a silicon oxide film formed by CVD, for example.

In the etch back treatment, the second silicon thermal oxide film 40 in the first logic region I is also removed, and the partial region PR of the first conductive pattern 32b is exposed.

Moreover, the second side wall insulating film 53 is also formed at sides of each of the second to sixth gate electrodes 41d to 41h in the second logic region II.

Then, by ion implantation using the second side wall insulating films 53 as a mask, ions are implanted as an n-type impurity into the silicon substrate 1 in the memory region III, to form first n-type source and drain regions 55a in the silicon substrate 1 at sides of the floating gates 32a.

Further, second to fourth n-type source and drain regions 55b to 55d, as well as first and second p-type source and drain regions 55e and 55f are formed in the silicon substrate 1 in the second logic region II by selectively implanting p-type and n-type impurities.

Note that the p-type and n-type impurities are selectively implanted by use of an unillustrated resist film.

With these processes, a basic structure of a flash memory cell FL including the first n-type source and drain region 55a, the tunnel insulating film 22, the floating gate 32a, the intermediate insulating film 37, and the first gate electrode 41a is completed in the memory region III.

As described above, the first gate electrode 41a serves as a control gate of the flash memory cell, and data may be stored by controlling potentials of the first gate electrodes 41a and accumulating charges in the floating gate 32a.

Meanwhile, in the second logic region II, basic structures of n-type MOS transistors $TR_n$ (HV), $TR_n$ (LV), and p-type MOS transistors $TR_p$ (HV), $TR_p$ (LV) forming a logic circuit such as a sense amplifier are completed. Note that among these transistors, those assigned with HV are high-voltage transistors whose breakdown voltages are higher than those assigned with LV.

Subsequently, as illustrated in FIG. 1R, a cobalt film is formed with approximately 8 nm thickness by sputtering in each of the first logic region I, the second logic region II, and the memory region III, and then the cobalt film is annealed to be reacted with silicon.

Then, the unreacted cobalt film left on portions such as the element isolation insulating film 4 are removed by wet etching, to form a metal silicide film 57 on the surface of the silicon substrate 1 besides the first gate electrode 41a, and besides each of the second to sixth gate electrodes 41d to 41h.

Note that the metal silicide film 57 is also formed on top surfaces of these gate electrodes, whereby resistance of the gate electrodes is lowered.

In addition, in the first logic region I, the metal silicide film 57 is also formed on the surface of the first conductive pattern 32b exposed from the first opening 37a.

Then, as illustrated in FIG. 1S, a silicon nitride film is formed with approximately 50 nm thickness by CVD as a cover insulating film 58.

Then, after forming a silicon oxide film with approximately 1000 nm thickness as an interlayer insulating film 59 on the cover insulating film 58 by CVD, a top surface of the interlayer insulating film 59 is polished and made flat by Chemical Mechanical Polishing (CMP).

Next, a description is given of processes for obtaining the cross section structure illustrated in FIG. 1T.

Firstly, the cover insulating film 58 and the interlayer insulating film 59 are patterned by photolithography and dry etching, to form a plurality of holes 59a in these insulating films.

In the first logic region I, the holes 59a are formed inside the first opening 37a and the second opening 41c.

Moreover, in the second logic region II and the memory region III, the hole 59a is formed above each of the first to fourth n-type source and drain regions 55a to 55d, as well as above each of the first and second p-type source and drain regions 55e and 55f.

Next, a Ti (titanium) film and a TiN (titanium nitride) film are formed in this order by sputtering as a glue film, in these holes 59a and on the interlayer insulating film 59. Then, a W (tungsten) film is formed on the glue film by CVD using tungsten hexafluoride as a reactant gas, to fill in the holes 59a. Then, excess W film and glue film on the top surface of the interlayer insulating film 59 are removed by CMP, so that these films are left in each of the holes 59a as a conductive plug 60.

Among these conductive plugs 60, those formed in the first logic region I are to be electrically connected with the first conductive pattern 32b. Meanwhile, the conductive plugs 60 formed in the second logic region II and the memory region III are to be electrically connected to the first to fourth n-type source and drain regions 55a to 55d, and the first and second p-type source and drain regions 55e and 55f.

Thus, the basic structure of the semiconductor device used in the investigation is completed.

In this semiconductor device, the capacitor Q is formed of the first conductive pattern 32b, the intermediate insulating film 37, and the second conductive pattern 41b in the first logic region I.

While functions of the capacitor Q are not particularly limited, the capacitor Q may be used as a pumping capacitor in a booster circuit in which about 1.2V supply voltage is boosted to generate a high voltage of 10V. The high voltage thus generated is applied to the first gate electrode 41a for writing to or eliminating from the flash memory cell FL, for example, whereby electrons are implanted into or taken from the floating gate 32a via the tunnel insulating film 22.

According to the above method of manufacturing a semiconductor device, the fourth resist film 50 is removed from the top surfaces 41x of the first gate electrodes 41a in the process illustrated in FIG. 1O, the top surfaces 41x are exposed to the etching atmosphere, and damages P occur as in FIG. 2.

When such damages P occur, the first gate electrode 41a gets locally thin at portions including the damage P, and the electrical resistance of the entire first gate electrode 41a gets high. At worst, the entire first gate electrode 41a may be eliminated by the etching. Since both of these cases may cause a defect in the semiconductor device and lower the yield rate thereof, it is preferable that such damages in the first gate electrode 41a be prevented in an embedded memory in logic.

Hereinbelow, a description is given of the embodiments.

First Embodiment

In the first embodiment, a semiconductor device in which a flash memory is embedded in logic circuits is manufactured.

FIGS. 3A to 3I illustrate in sectional views a semiconductor device according to the first embodiment in the course of manufacturing. Note that in FIGS. 3A to 3I, components which are the same as those described above are assigned the same reference numerals as above, and descriptions thereof are omitted in the following description.

Figure 3A:
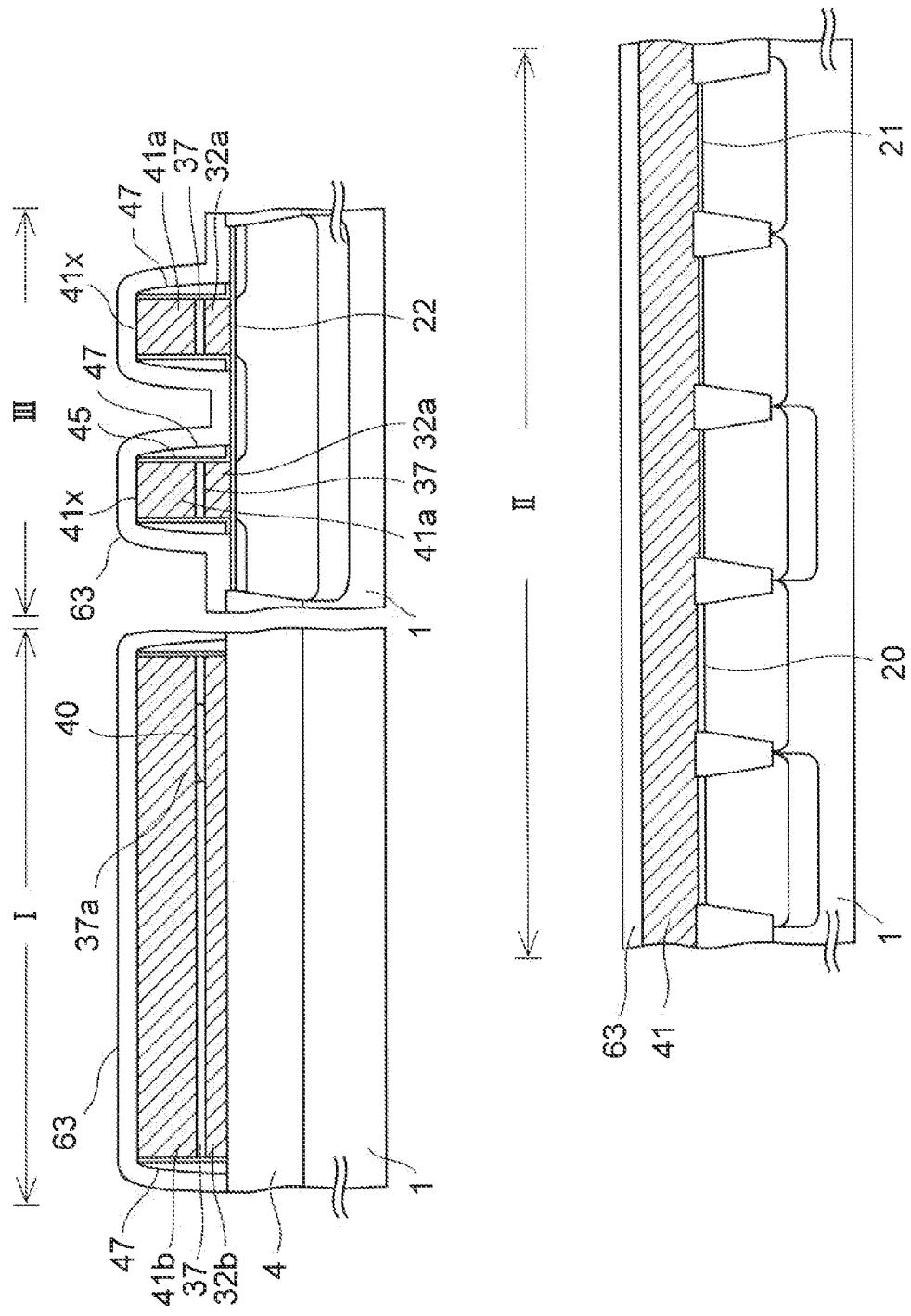

Firstly, a description is given of processes for obtaining the cross section structure illustrated in FIG. 3A.

To begin with, after performing the aforementioned processes illustrated in FIGS. 1A to 1M, as illustrated in FIG. 3A, a silicon oxide film is formed with about 30 nm thickness as a mask film 63 on each of the second conductive pattern 41b, the first gate electrodes 41a, the conductive film 41, and the first side wall insulating films 47.

While film-forming conditions for the mask film 63 are not particularly limited, it is preferable that the mask film 63 be formed by CVD using Tetraethyl Orthosilicate (TEOS) gas as the film-forming gas at a substrate temperature of 620° C.

Note that the mask film 63 may otherwise be formed by using the TEOS gas at a high substrate temperature of about 780° C. The silicon oxide film thus formed at a high temperature is also referred to as a High Temperature Oxide (HTO). Since this silicon oxide film is dense, it suffices that the film be formed with about 4 nm thickness.

Moreover, since this mask film 63 is formed to protect the top surface 41x of the first gate electrode 41a, as is mentioned later, it is preferable that the mask 63 be formed to be in direct contact with the top surface 41x.

Figure 3B:
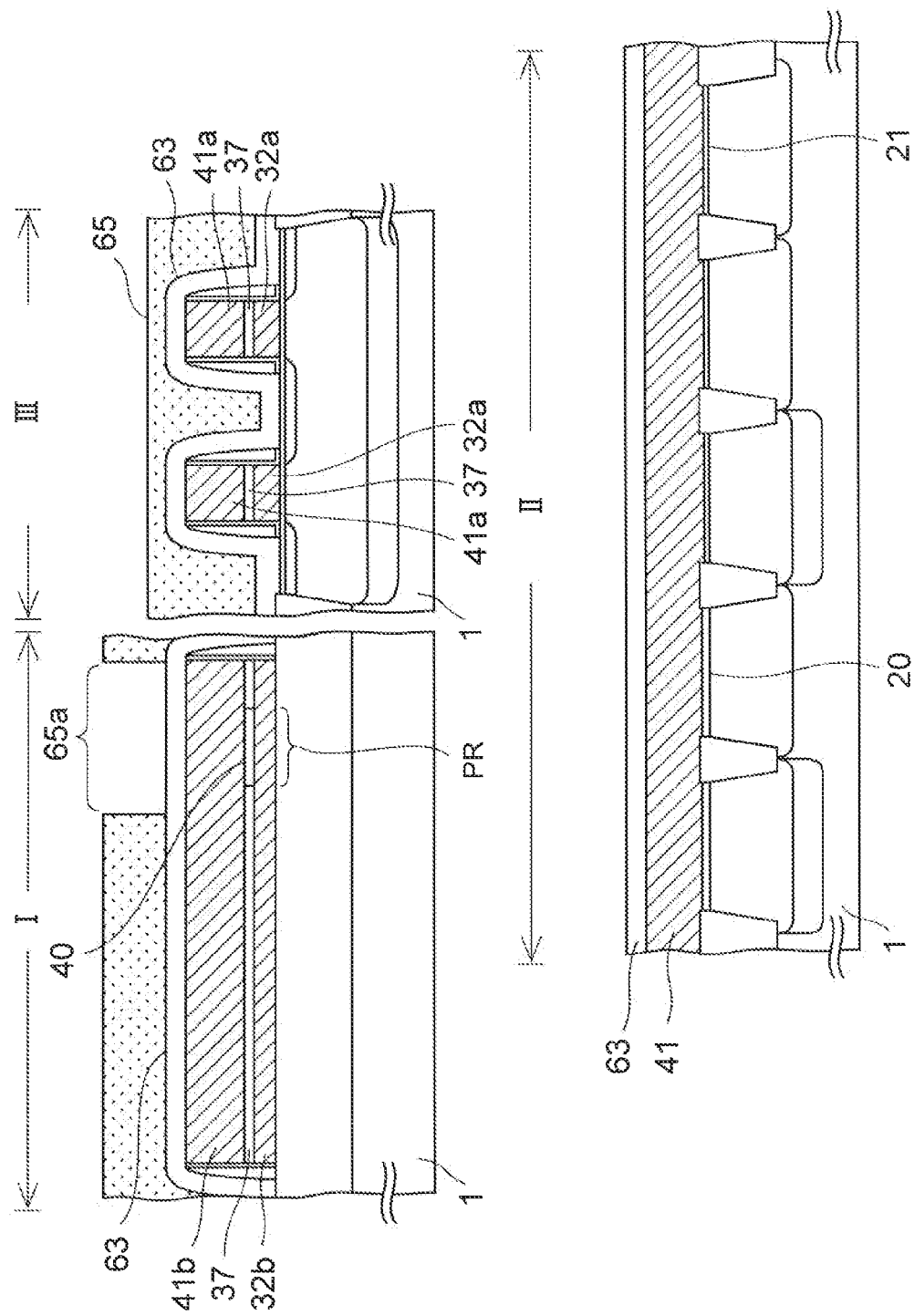

Next, as illustrated in FIG. 3B, a photoresist is applied onto each of the first logic region I, the second logic region II, and the memory region III, and the photoresist is exposed and developed to form a fifth resist film 65.

In the first logic region I, the fifth resist film 65 has a window 65a including the partial region PR inside thereof is exposed, and in the memory region III, the fifth resist film 65 covers the mask film 63. Meanwhile, in the second logic region II, the fifth resist film 65 is not formed, and the mask film 63 is exposed.

Note that the fifth resist film 65 is not used as an etching mask for obtaining a fine device pattern like the gate electrode. Accordingly, a resist for an exposure light with a longer wavelength than an ArF laser beam, such as an i-line resist is sufficient for the material of the fifth resist film 65.

Figure 3C:
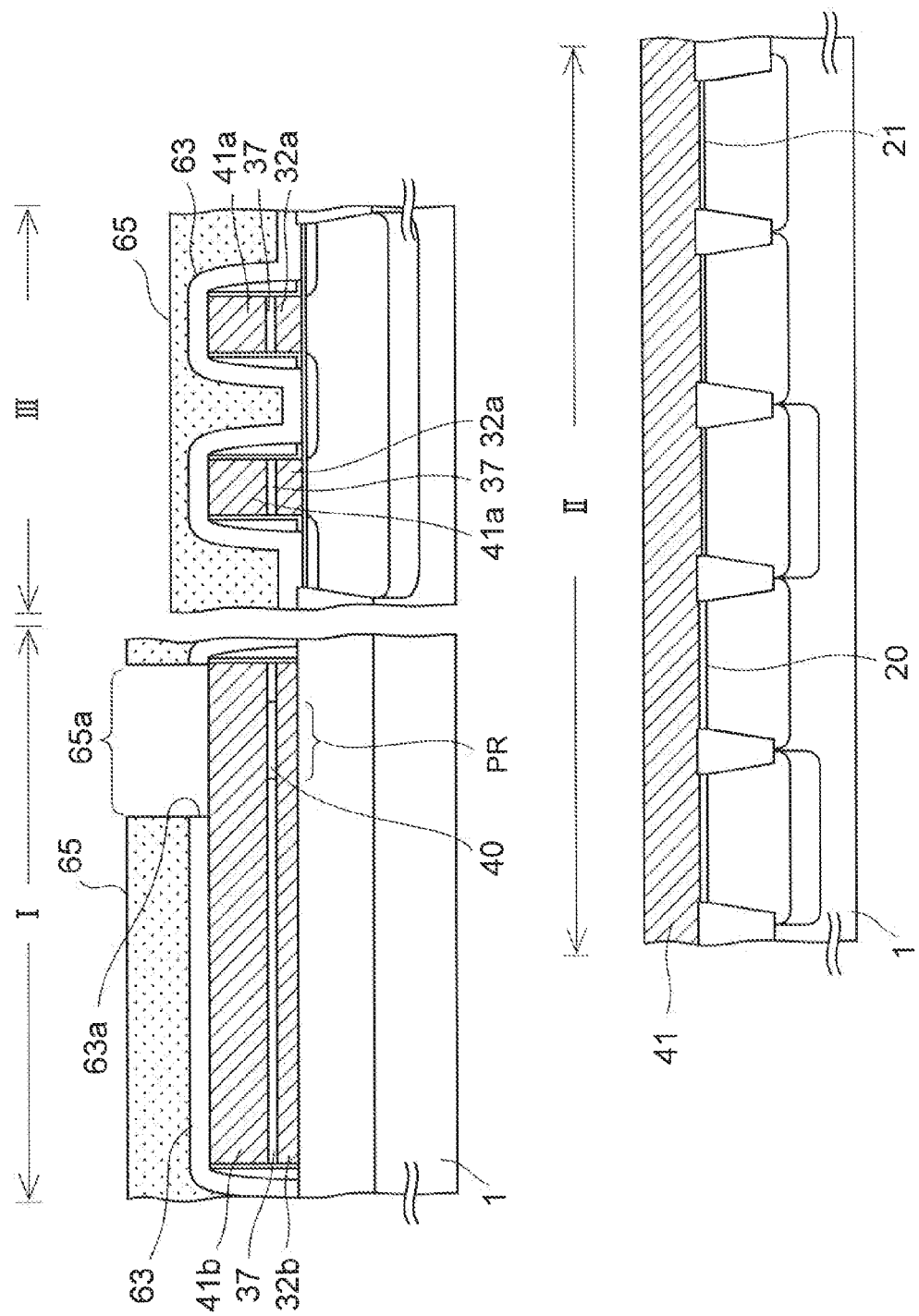

Next, as illustrated in FIG. 3C, by using the fifth resist film 65 as a mask, the mask film 63 in the second logic region II is removed by wet etching using hydrofluoric acid as the etchant, and the surface of the conductive film 41 is exposed in the second logic region II.

With this etching, the mask film 63 in the first logic region I is also etched through the window 65a, and a third opening 63a including the partial region PR inside thereof is exposed is formed in the mask film 63.

In addition, since the i-line resist being the material of the fifth resist film 65 has a higher resistance to hydrogen fluoride than chemically amplified resists such as an ArF resist and a KrF resist, hydrogen fluoride is less likely to soak into the fifth resist film 65, and thus the third opening 63a may be formed in a good shape.

Thereafter, as illustrated in FIG. 3D, the entire top surface of the silicon substrate 1 is exposed to ammonia-hydrogen peroxide mixture (APM) and sulfuric acid-hydrogen peroxide mixture (SPM) in turn to remove the fifth resist film 65.

Figure 3E:
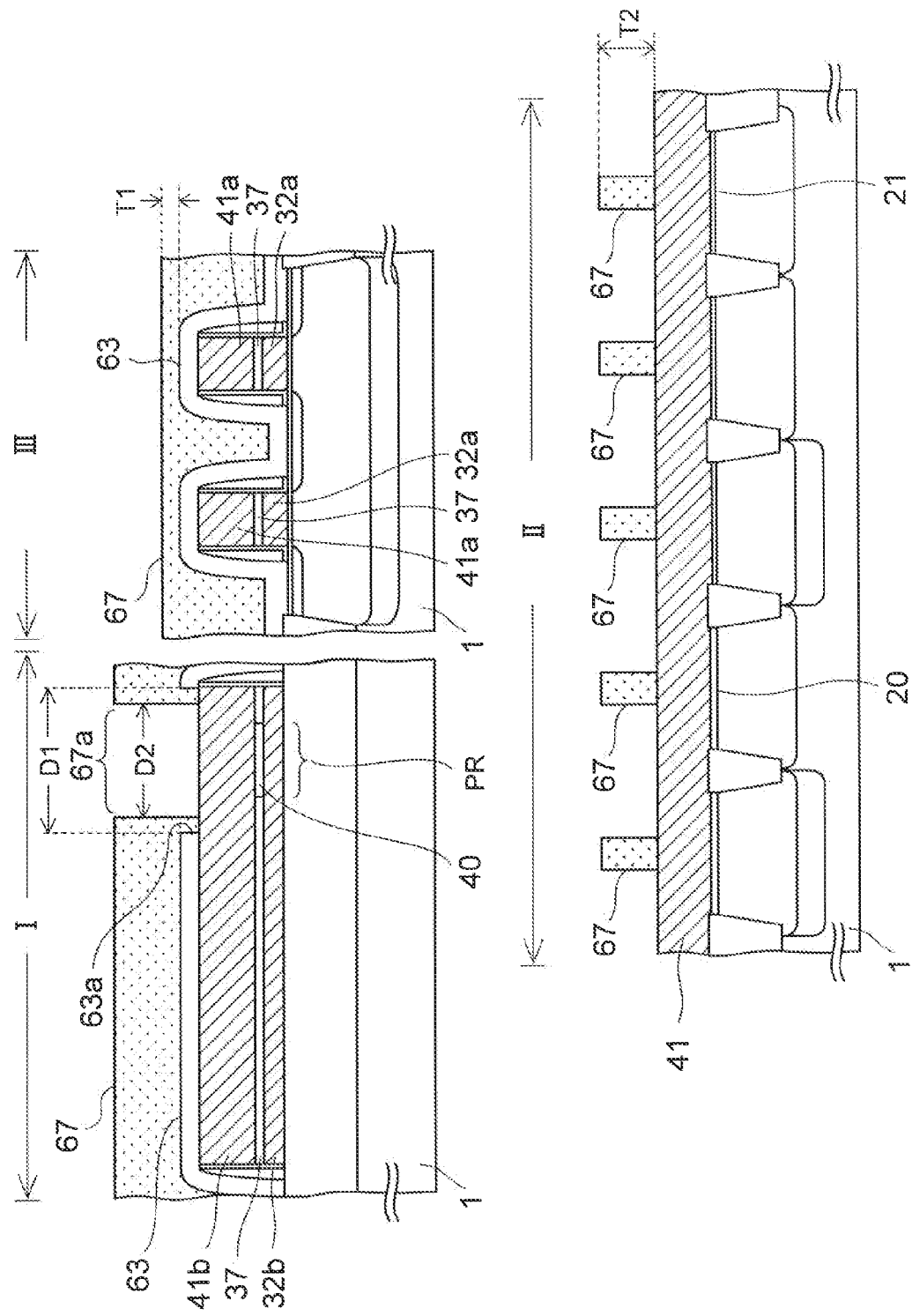

Next, as illustrated in FIG. 3E, a photoresist is applied again onto each of the first logic region I, the second logic region II, and the memory region III, and the photoresist is exposed and developed to form a sixth resist film 67.

As is described later, the sixth resist film 67 is used for patterning gate electrodes. Hence, to obtain a fine gate electrode, it is preferable that a resist for an exposure light with a comparatively short wavelength, such as an ArF resist be used as the material of the sixth resist film 67.

Moreover, in the first logic region I, the sixth resist film 67 thus formed has a window 67a formed to overlap with the third opening 63a, and in the second logic region II, the sixth resist film 67 is formed in the shape of gate electrodes.

A diameter D2 of the window 67a is not particularly limited. In the first embodiment, the window 67a is formed inside the third opening 63a by making the diameter D2 of the window 67a smaller than a diameter D1 of the third opening 63a.

Further, as described in the above investigation result, in the memory region III, the resist flows into spaces between neighboring first gate electrodes 41a, so that a thickness T1 of the sixth resist film 67 on the top surface 41x of the first gate electrode 41a becomes smaller than a thickness T2 thereof in the second logic region II.

Next, as illustrated in FIG. 3F, by using the sixth resist film 67 as a mask, the second conductive pattern 41b in the first logic region I, and the conductive film 41 in the second logic region II are dry etched. While conditions for this dry etching are not particularly limited, a mixed gas including $Cl_2$ and $O_2$ is used as the etching gas in the first embodiment.

With this dry etching, in the second logic region II, the conductive film 41 is patterned to form second to sixth gate electrodes 41d to 41h.

Here, in the memory region III, since the thickness T1 of the sixth resist film 67 on the first gate electrode 41a is small as described above, the sixth resist film 67 is eliminated from the surface of the first gate electrode 41a by the dry etching in this process.

Note, however, that since the first gate electrodes 41a are covered with the mask film 63 in the first embodiment, the top surfaces 41x of the first gate electrodes 41a are not exposed to the etching atmosphere in this process.

In particular, silicon oxide has a lower etching rate for the mixed gas including $Cl_2$ and $O_2$ used as the etching gas, than that for the sixth resist film 67, silicon oxide being the material of the mask film 63. Accordingly, it may be possible to prevent the mask film 63 from being etched and eliminated in the course of dry etching.

With this structure, the first embodiment may make it possible to prevent the first gate electrodes 41a from being exposed to the etching atmosphere and to prevent damages from occurring on the top surface 41x of the first gate electrodes 41a.

Although the mask film 63 thus protects the first gate electrodes 41a, the mask film 63 may be eliminated from the surface of the first gate electrode 41a if it is exposed long enough in the etching atmosphere.

To avoid such a risk, it is preferable that the mask film 63 be formed with such a thickness that the mask film 63 remains on the first gate electrodes 41a at the time point when the second to sixth gate electrodes 41d to 41h are formed, such as about 300 nm. Note that when HTO is formed as the mask film 63, about 4 nm thickness is enough to leave the mask film 63 on the first gate electrodes 41a, as mentioned above.

In addition, since the sixth resist film 67 does not need to be formed thick to protect the first gate electrodes 41a, it may be possible to form the sixth resist film 67 thin for finer second to sixth gate electrodes 41d to 41h in the second logic region II.

Meanwhile, in the first logic region I, the second conductive pattern 41b is dry etched through the window 67a, to form a second opening 41c in the second conductive pattern 41b, the second opening 41c including the partial region PR inside thereof is exposed.

In the first embodiment, the third opening 63a is previously formed in the process in FIG. 3C, and the window 67a is formed to overlap with the third opening 63a. For this reason, the mask film 63 does not hinder the etching and the second opening 41c may be formed as described above.

Note that when a diameter D2 of the window 67a is made smaller than a diameter D1 of the third opening 63a, the diameter of the second opening 41c is the same as the diameter D2 of the window 67a.

Figure 3G:
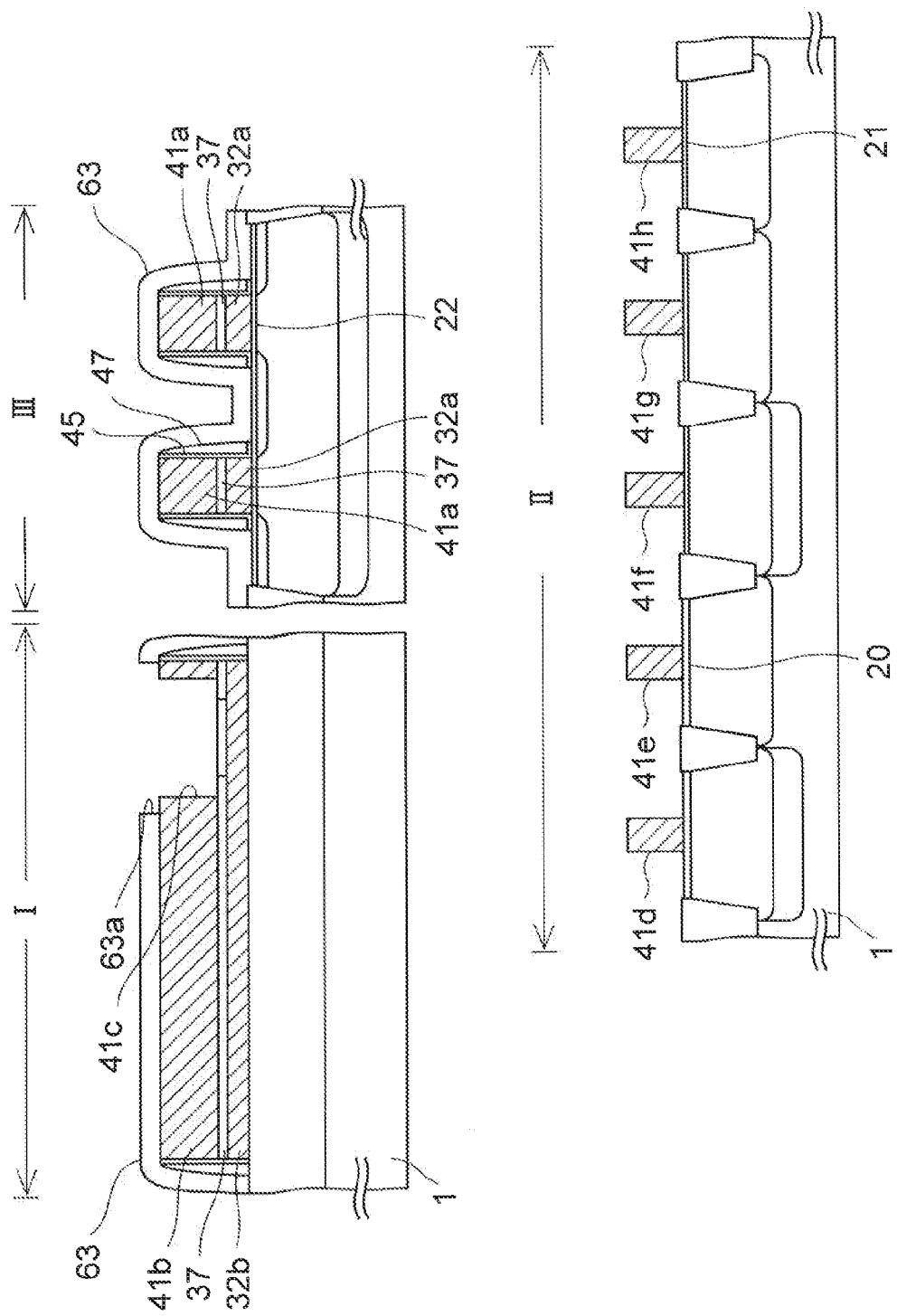

Next, as illustrated in FIG. 3G, the sixth resist film 67 is removed by asking.

Figure 3H:
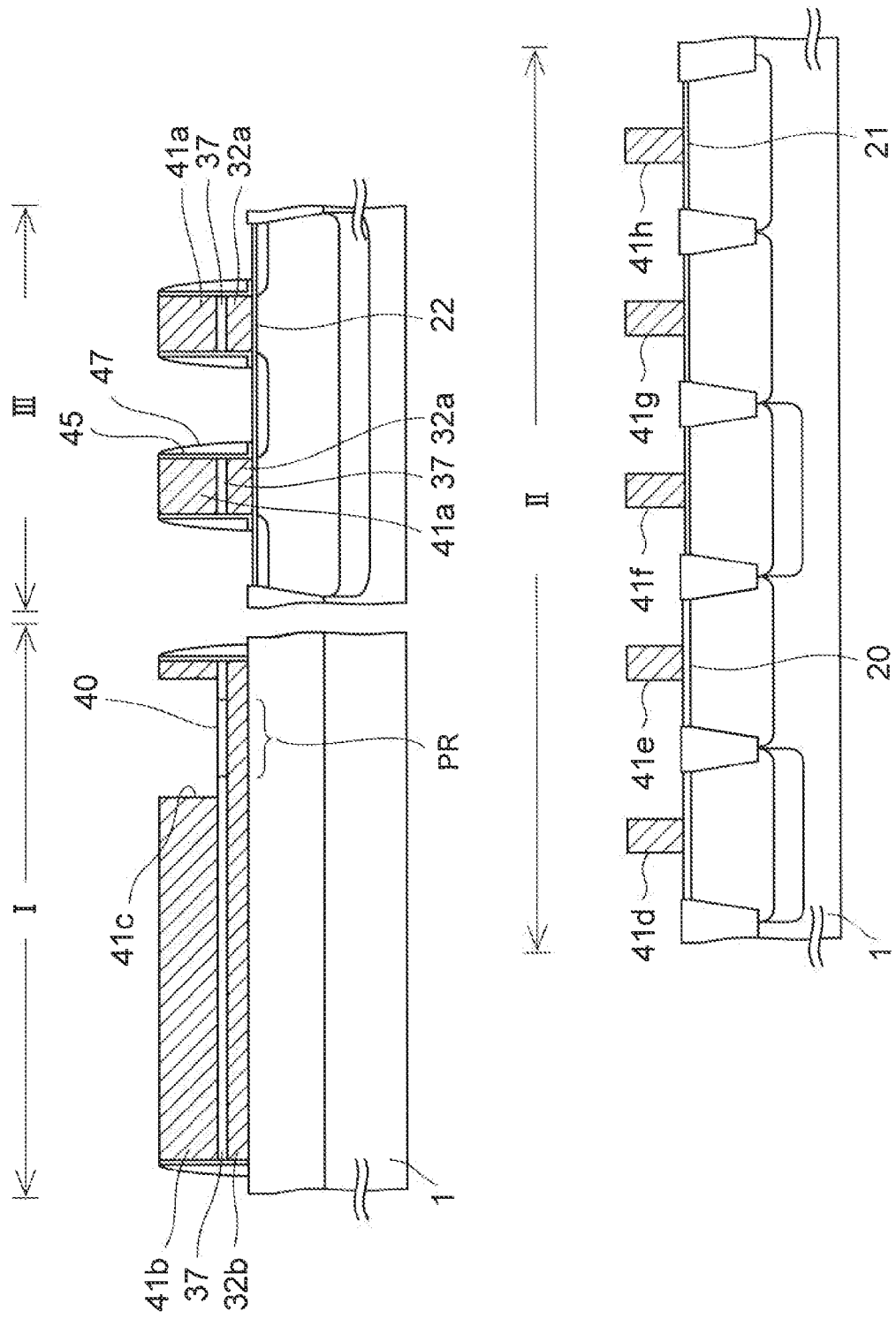

Subsequently, as illustrated in FIG. 3H, the mask film 63 is removed by wet etching using hydrofluoric acid as the etchant.

Silicon oxide being the material of the mask film 63 has a higher etching rate for hydrofluoric acid than silicon nitride being the material of the first side wall insulating film 47. Accordingly, in this etching, the mask film 63 alone may be selectively removed while leaving the first side wall insulating films 47.

Further, the mask film 63 formed by using TEOS gas as the reactant gas has a lower film density than silicon thermal oxide films, and has 8 to 9 times higher etching rate for hydrofluoric acid than silicon thermal oxide films. Hence, in this process, the mask film 63 is removed in a short etching time, so that the wet etching is not continuously performed on the tunnel insulating film 22 or the third silicon thermal oxide film 45.

In particular, since the third silicon thermal oxide film 45 has a function of improving the retention characteristic of the flash memory as described above, it is advantageous to prevent the third silicon thermal oxide film 45 from being wet etched.

Note that the etch amount of the mask film 63 may be controlled according to the length of the wet etching time, and the entire mask film 63 may be removed by performing wet etching for the same amount of time required to etch the silicon thermal oxide film for approximately 5 nm.

Moreover, after thus removing the mask film 63, the silicon substrate 1 may be soaked in APM or SPM to be cleaned.

Figure 3I:
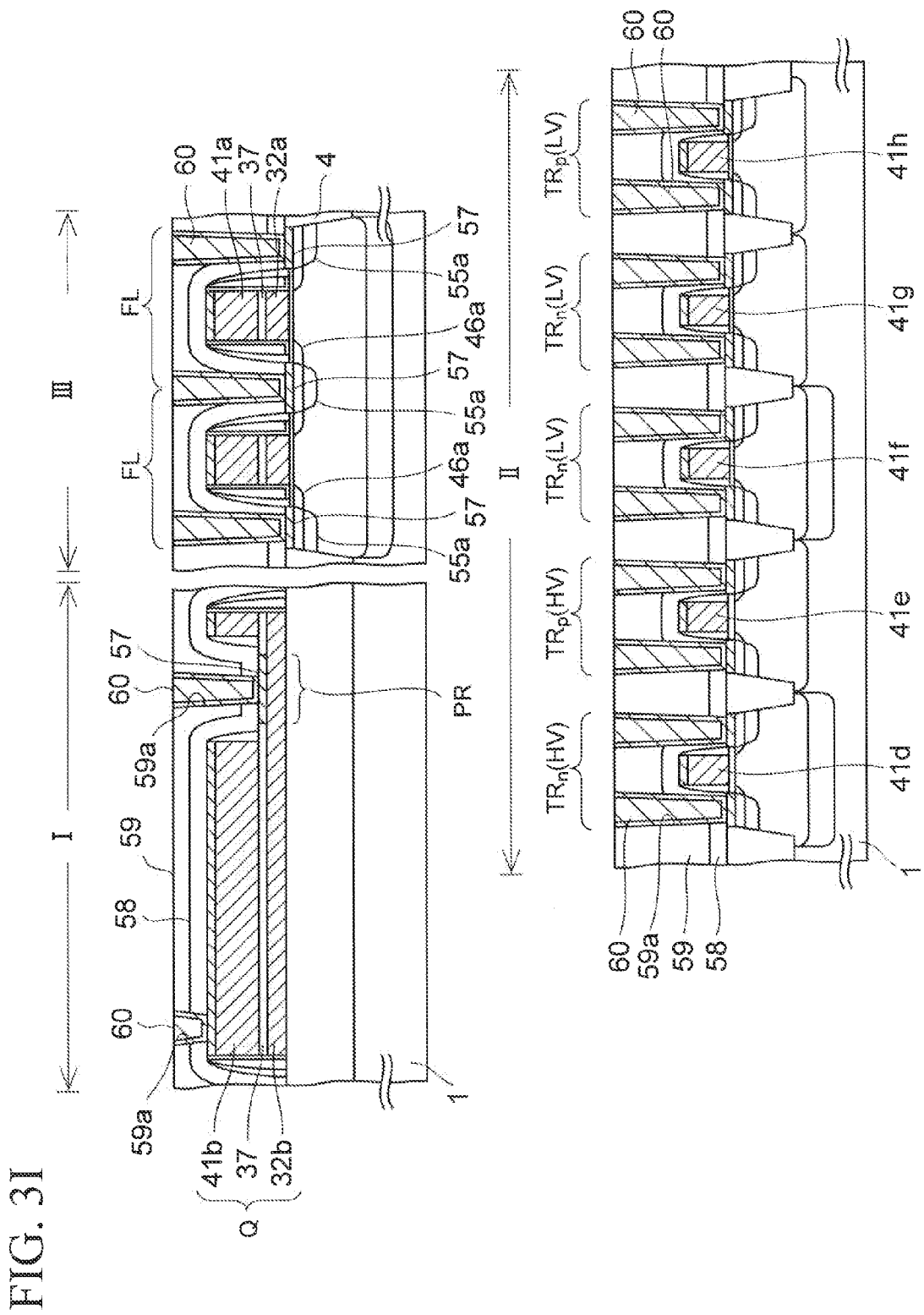

Thereafter, by performing the aforementioned processes illustrated in FIGS. 1P to 11, the basic structure of the semiconductor device according to the first embodiment illustrated in FIG. 3I is completed.

According to the first embodiment described above, as explained with reference to FIG. 3F, the top surfaces 41x of the first gate electrodes 41a are covered with the mask film 63 in the memory region III. With this, the top surfaces 41x of the first gate electrodes 41a may be prevented from being exposed to the dry etching atmosphere when forming the second to sixth gate electrodes 41d to 41h, and thus it is less likely that the top surfaces 41x are damaged by the dry etching or that the first gate electrodes 41a are removed.

As a result, the semiconductor device is less likely to include a defect due to damages on the top surface 41x and the like, and the yield rate thereof may be improved.

Figure 4:
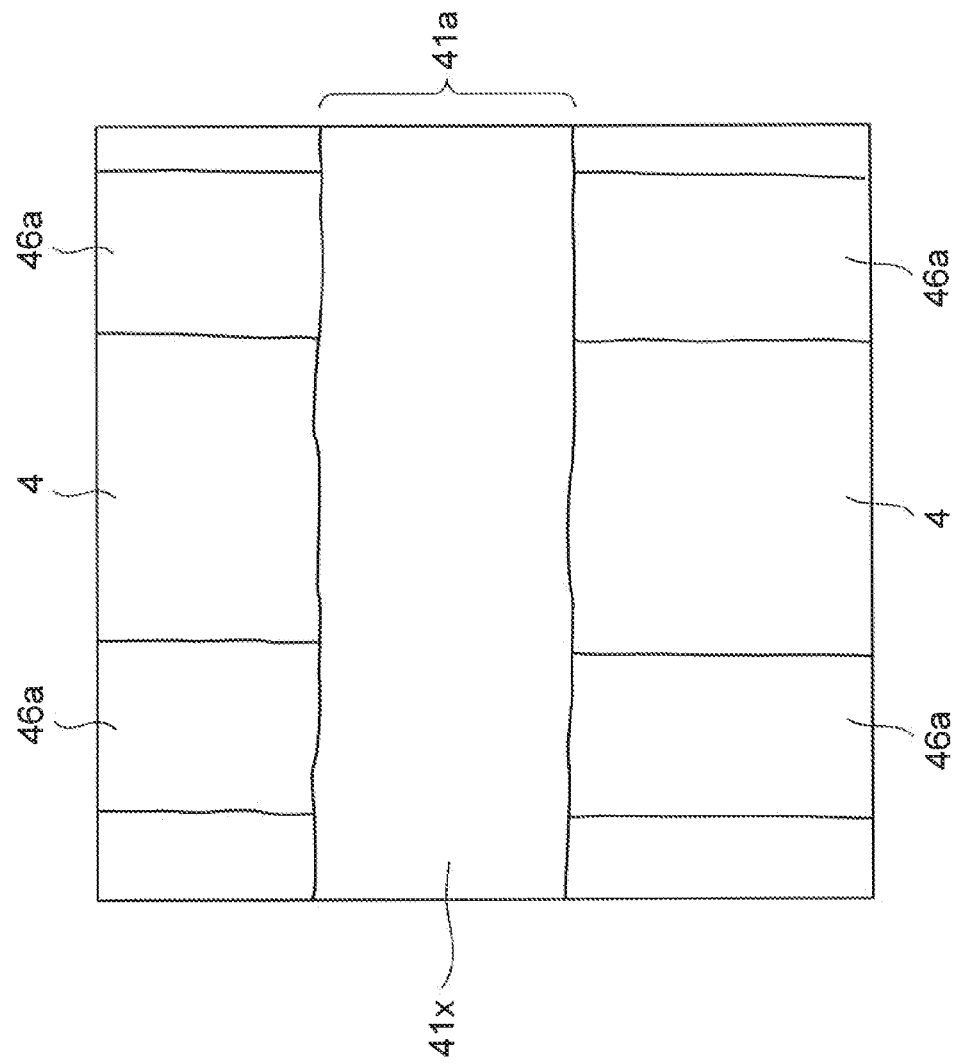
FIG. 4 is a diagram depicted on the basis of an image obtained from observing a top surface of a first gate electrode of a first embodiment, the observation being made with an SEM.

FIG. 4 is a diagram depicted on the basis of an image obtained from observing a top surface 41x of the first gate electrode 41a of the first embodiment, the observation being made with an SEM.

Unlike the case of FIG. 2, there is no damage on the top surface 41x in FIG. 4. Accordingly, it is confirmed that the mask film 63 is effective in preventing damages from occurring on the top surface 41x.

As described above, the first embodiment is capable of preventing occurrence of damages on the top surfaces 41x of the first gate electrodes 41a serving as control gates in the flash memory cell FL, and thereby improving the yield rate of a semiconductor device in which a flash memory cell and logic circuits are mounted together.

In the first embodiment, the mask film 63 is removed from the second logic region II in the process of FIG. 3C. Although the mask film 63 may be left in the second logic region II instead of being removed in the above manner, in such a case, inconvenience occurs as described in the following comparative example.

Figure 5A:
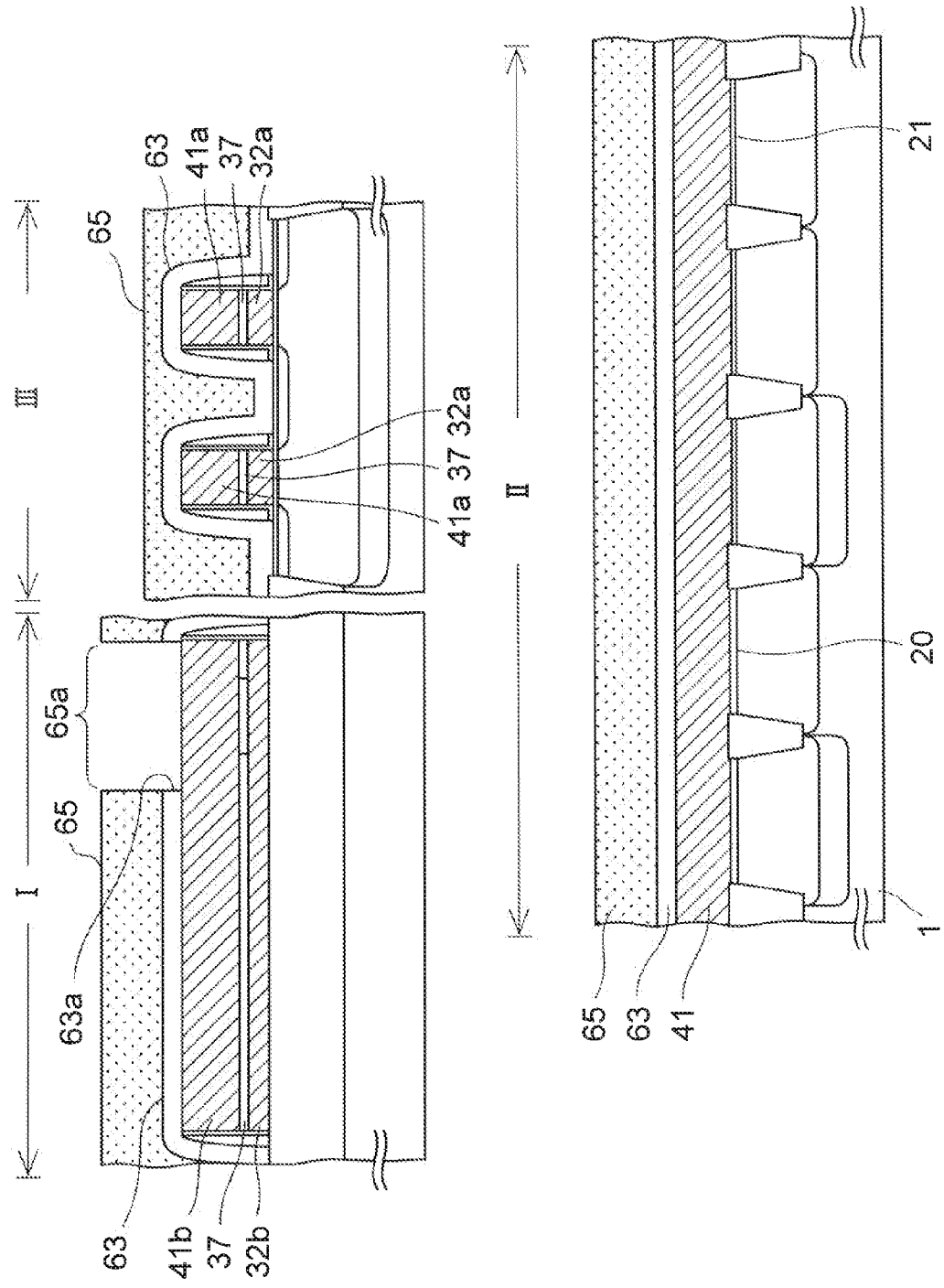
FIGS. 5A to 5C illustrate in sectional views a semiconductor device according to a comparative example in the course of manufacturing.
Figure 5B:
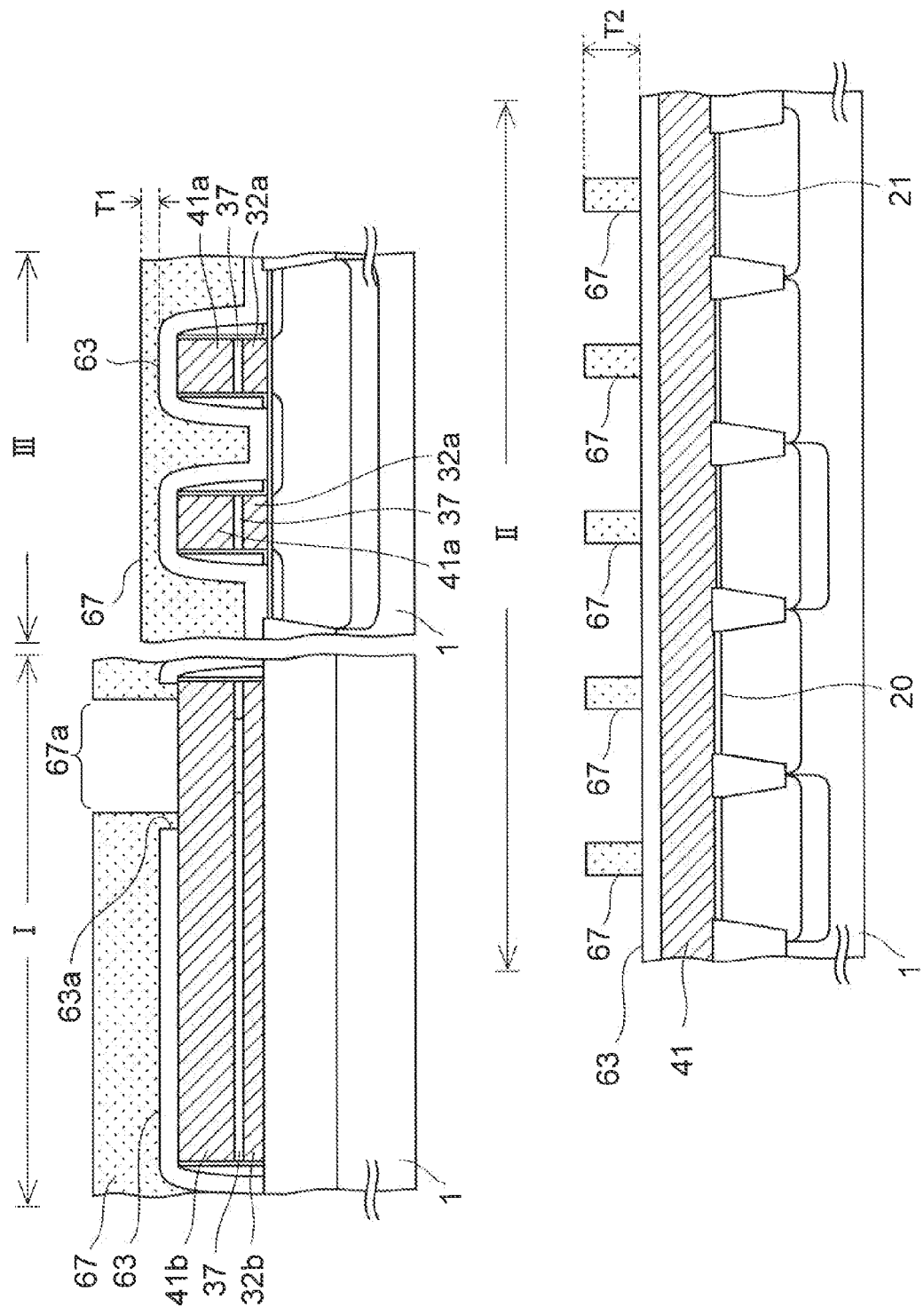
Figure 5C:
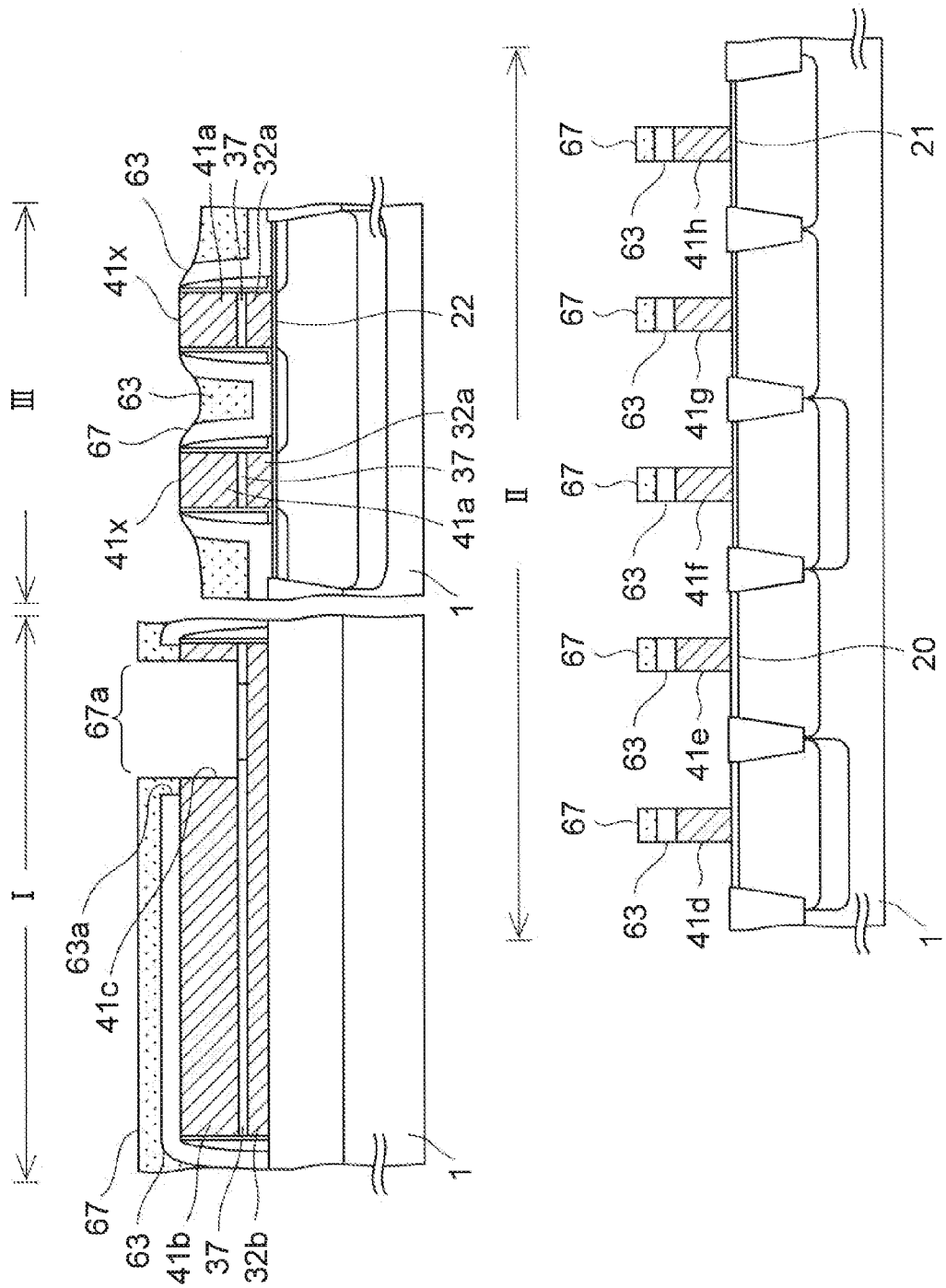

FIGS. 5A to 5C illustrate in sectional views a semiconductor device according to a comparative example in the course of manufacturing.

While FIG. 5A is a sectional view corresponding to the process in FIG. 3C, in the comparative example, a fifth resist film 65 is also formed in a second logic region II. With this, while a mask film 63 is dry etched through a window 65a in a first logic region I, the fifth resist film 65 serves as a mask and a conductive film 41 is not etched in the second logic region II.

Thereafter, the entire top surface of a silicon substrate 1 is exposed to APM and SPM in turn to remove the fifth resist film 65.

Next, as illustrated in FIG. 5B, the aforementioned sixth resist film 67 is formed in each of the first logic region I, the second logic region II, and a memory region III.

In the second logic region II having a flat foundation, a sixth resist film 67 is formed with a sufficient thickness T2. However, in the memory region III including a large irregularity, a thickness T1 of the sixth resist film 67 on first gate electrodes 41a becomes insufficient.

Next, as illustrated in FIG. 5C, by using a mixed gas including $Cl_2$ and $O_2$ as the etching gas and the sixth resist film 67 as a mask, the mask film 63 and the conductive film 41 in the second logic region II are dry etched to form second to sixth gate electrodes 41d to 41h.

With this dry etching, as in the process of FIG. 3F, a second opening 41c is formed in a second conductive pattern 41b in the first logic region I.

Meanwhile, in the memory region III, since the thickness T1 of the sixth resist film 67 is small as mentioned above, the sixth resist film 67 is eliminated in the course of this dry etching.

Further, since the depth of etching in this process is set to etch two layers including the mask film 63 and the conductive film 41 in the second logic region II, the mask film 63 in the memory region III is also etched, whereby top surfaces 41x of the first gate electrodes 41a are exposed.

Thus, if the mask film 63 is left in the second logic region II, the first gate electrodes 41a are exposed to the etching atmosphere when the mask film 63 is etched in the shape of gate electrodes. Hence, the aforementioned damages occur in the first gate electrodes 41a.

Accordingly, in order not to expose the first gate electrodes 41a to the etching atmosphere, it is preferable that the mask film 63 be previously removed from the second logic region II as in FIG. 3F of the first embodiment, so that the depth of etching is kept within the thickness of the first conductive film 41.

Second Embodiment

As illustrated in FIGS. 3E and 3F, in the first embodiment, the diameter D2 of the window 67a in the sixth resist film 67 is made smaller than the diameter D1 of the third opening 63a in the mask film 63.

In the second embodiment, the magnitude relation between the diameters D1 and D2 is opposite from that in the first embodiment.

Figure 6A:
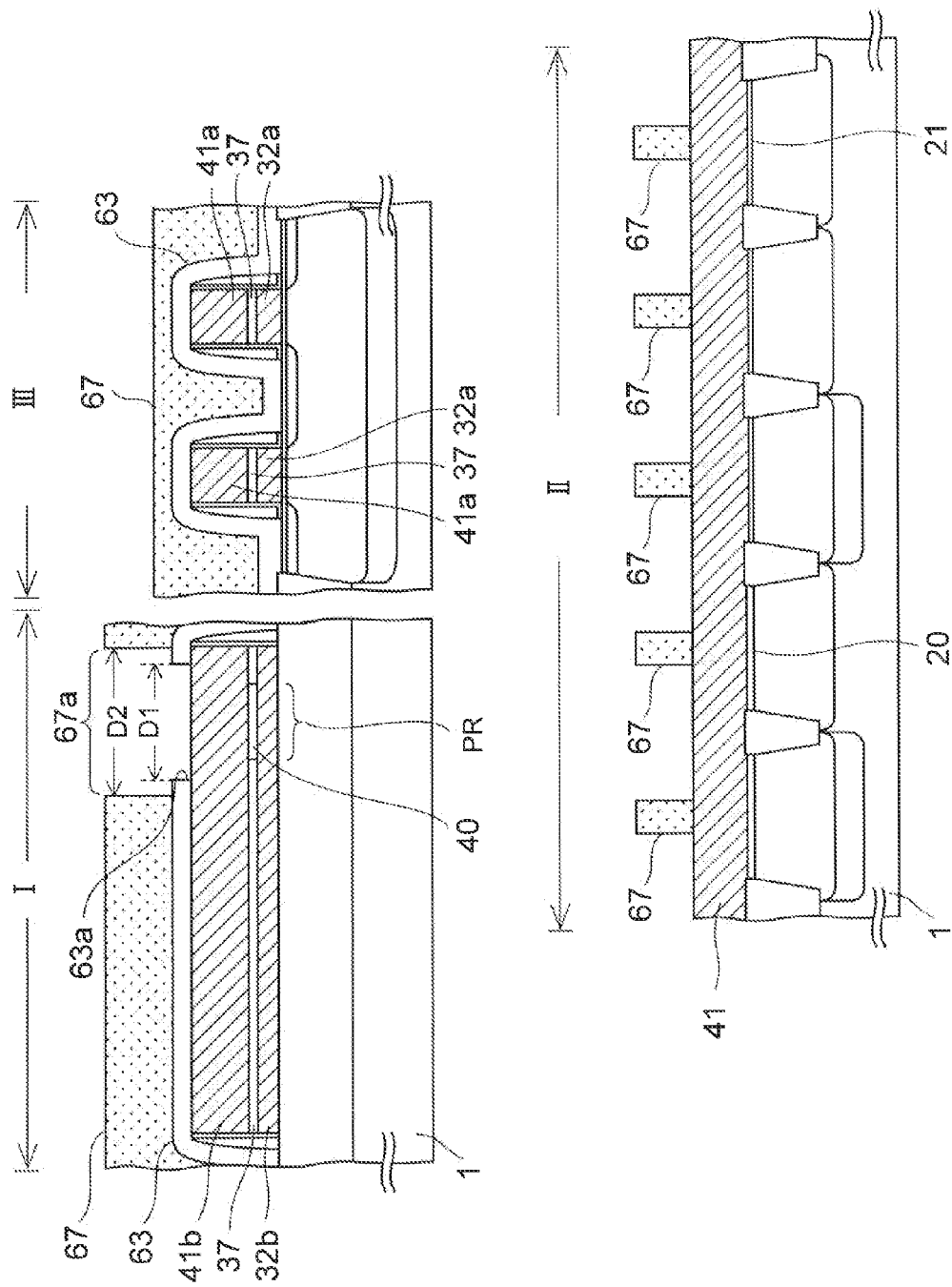

FIGS. 6A and 6B illustrate in sectional views a semiconductor device according to the second embodiment in the course of manufacturing. Note that FIGS. 6A and 6B correspond to processes of FIGS. 3E and 3F of the first embodiment, respectively.

As illustrated in FIG. 6A, in the second embodiment, a diameter D2 of a window 67a in a sixth resist film 67 is made larger than a diameter D1 of a third opening 63a in a mask film 63.

Next, as illustrated in FIG. 6B, by using the sixth resist film 67 as a mask, a second conductive pattern 41b is dry etched under the same etching conditions as the first embodiment, to form a second opening 41c.

Since the second conductive pattern 41b is etched through the third opening 63a in this process, the diameter of the second opening 41c is the same as the diameter D1 of the third opening 63a.

Thereafter, the basic structure of the semiconductor device is completed by performing the processes of the first embodiment illustrated in FIGS. 3H to 3I, and details thereof are omitted.

In the second embodiment described above, since the diameter D2 of the window 67a is made larger than the diameter D1 of the third opening 63a, the mask film 63 serves as the etching mask in the first logic region I at the time of etching in FIG. 6B. For this reason, the second opening 41c may be formed in a good shape in the second conductive pattern 41b by etching using the mask film 63 as a mask, even when the sixth resist film 67 in the first logic region I is etched and made thin.

Third Embodiment

As illustrated in FIG. 3I, in the first embodiment, the capacitor Q is formed in the first logic region I. However, the element to be formed in the first logic region I is not limited to a capacitor. In the third embodiment, a resistive element is formed as the element.

FIGS. 7A to 7F illustrate in sectional views the semiconductor device according to the third embodiment in the course of manufacturing.

Note that in FIGS. 7A to 7F, components which are the same as those described in the first embodiment are assigned the same reference numerals as the first embodiment, and descriptions thereof are omitted in the following description.

Figure 7A:
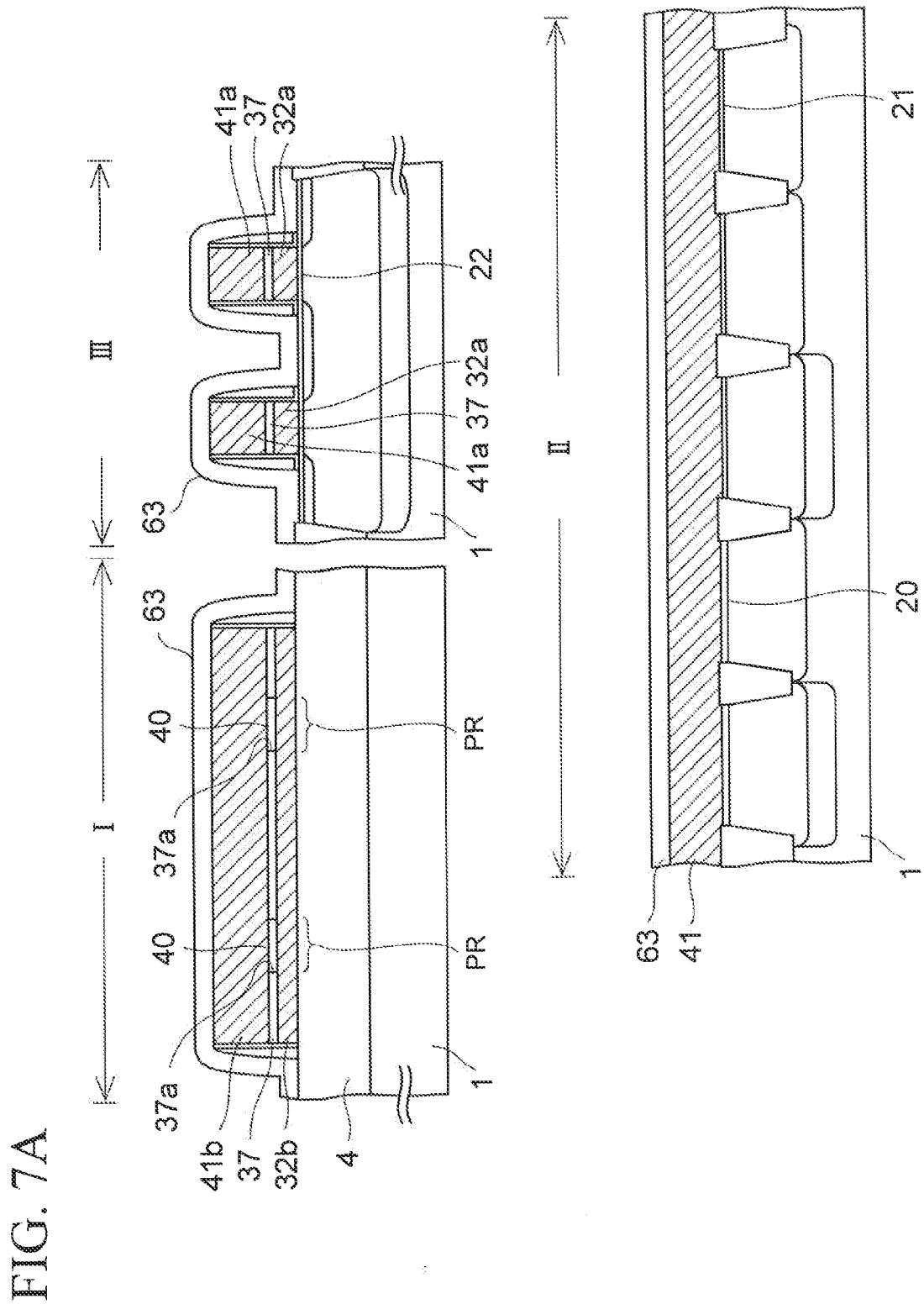
FIGS. 7A to 7F illustrate in sectional views a semiconductor device according to a third embodiment in the course of manufacturing.

Firstly, a description is given of processes for obtaining the cross section structure illustrated in FIG. 7A.

At first, the process of the first embodiment illustrated in FIG. 3A is performed to form a mask film 63 on an entire top surface of a silicon substrate 1.

Note that in the third embodiment, a first conductive pattern 32b in a first logic region I includes two partial regions PR, and a first opening 37a and a second silicon thermal oxide film 40 are formed in each of the partial regions PR.

Figure 7B:
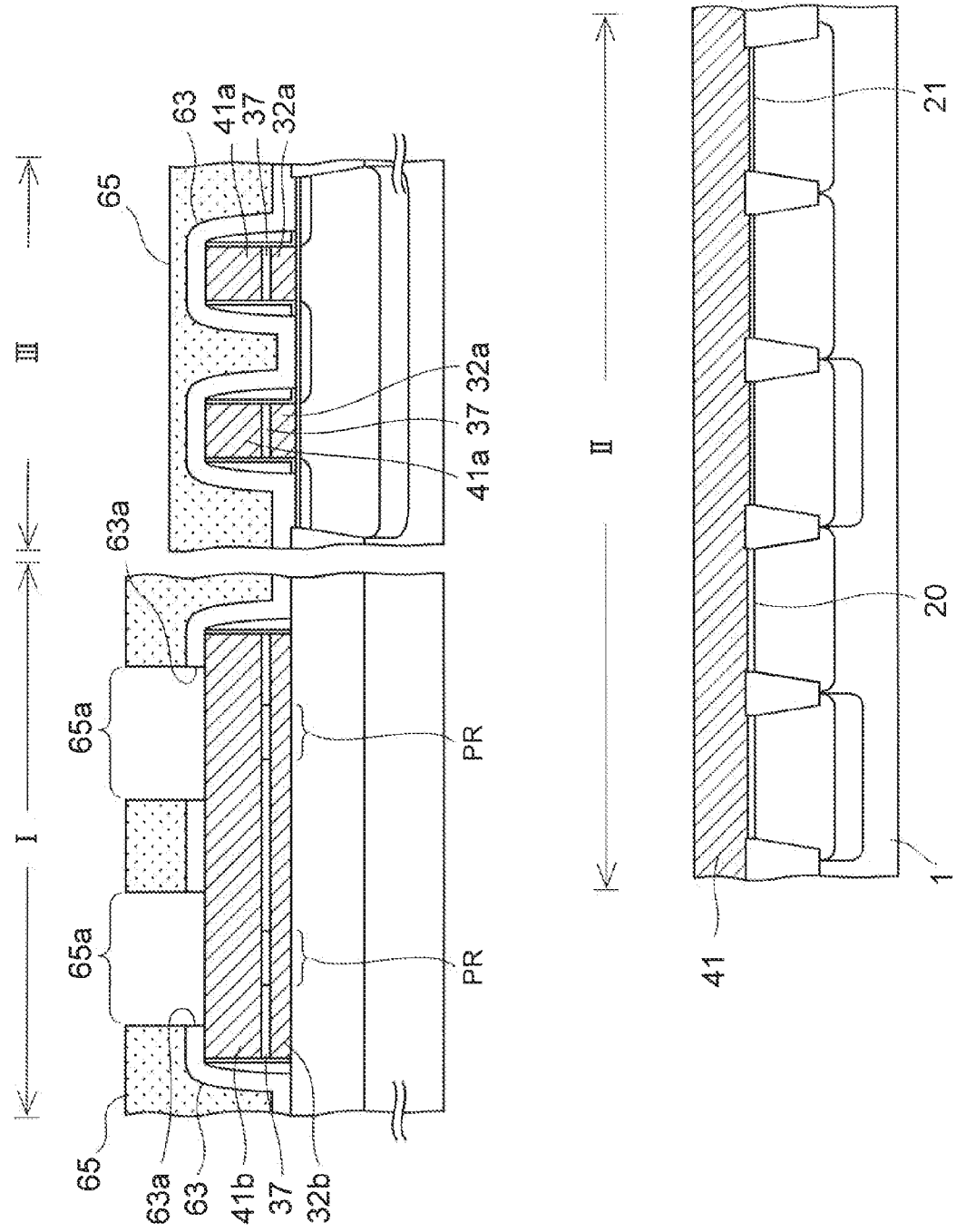

Next, as illustrated in FIG. 7B, a fifth resist film 65 made of an i-line resist is formed on an entire top surface of the silicon substrate 1. Then, the mask film 63 is wet etched by using hydrofluoric acid and the fifth resist film 65 as a mask, to remove the mask film 63 from the second logic region II as well as to form two third openings 63a in the mask film 63 in the first logic region I.

After the wet etching, an entire top surface of the silicon substrate 1 is exposed to APM and SPM in turn to remove the fifth resist film 65.

Figure 7C:
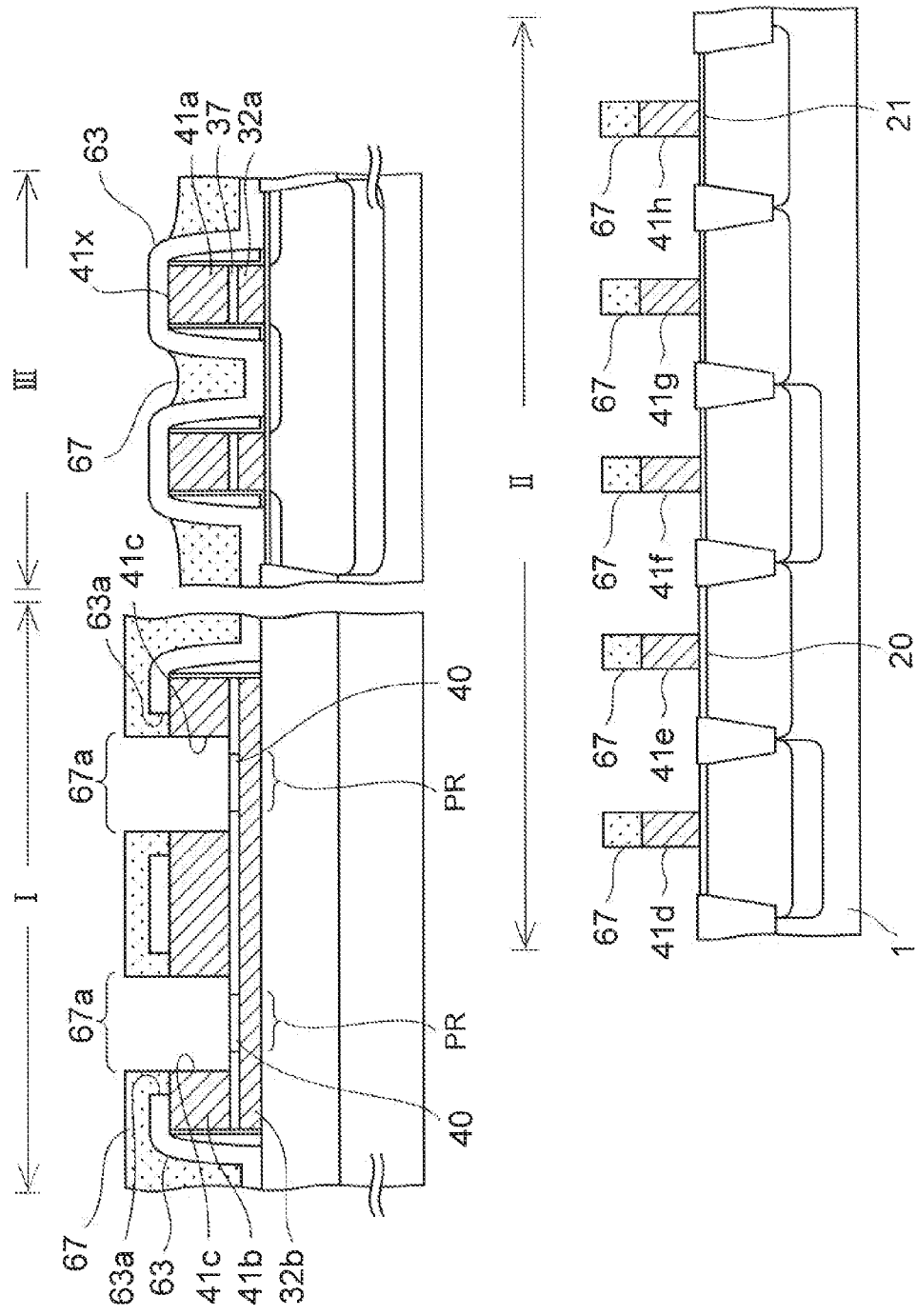

Subsequently, as illustrated in FIG. 7C, an ArF resist is applied onto an entire top surface of the silicon substrate 1, and the ArF resist is exposed and developed to form a sixth resist film 67 including a window 67a as in the case of the first embodiment.

Then, two second openings 41c are formed in a second conductive pattern 41b in the first logic region I, by dry etching using the sixth resist film 67 as a mask. At the same time, the conductive film in the second logic region II is patterned to form second to sixth gate electrodes 41d to 41h.

In this dry etching, a mixed gas including $Cl_2$ and $O_2$ is used as the etching gas, as in the case of the first embodiment.

Moreover, as described in the first embodiment, although the sixth resist film 67 is eliminated from the surface of the first gate electrode 41a in the course of this dry etching in the memory region III, the top surfaces 41x of the first gate electrodes 41a are protected from the etching atmosphere by the mask film 63.

Figure 7D:
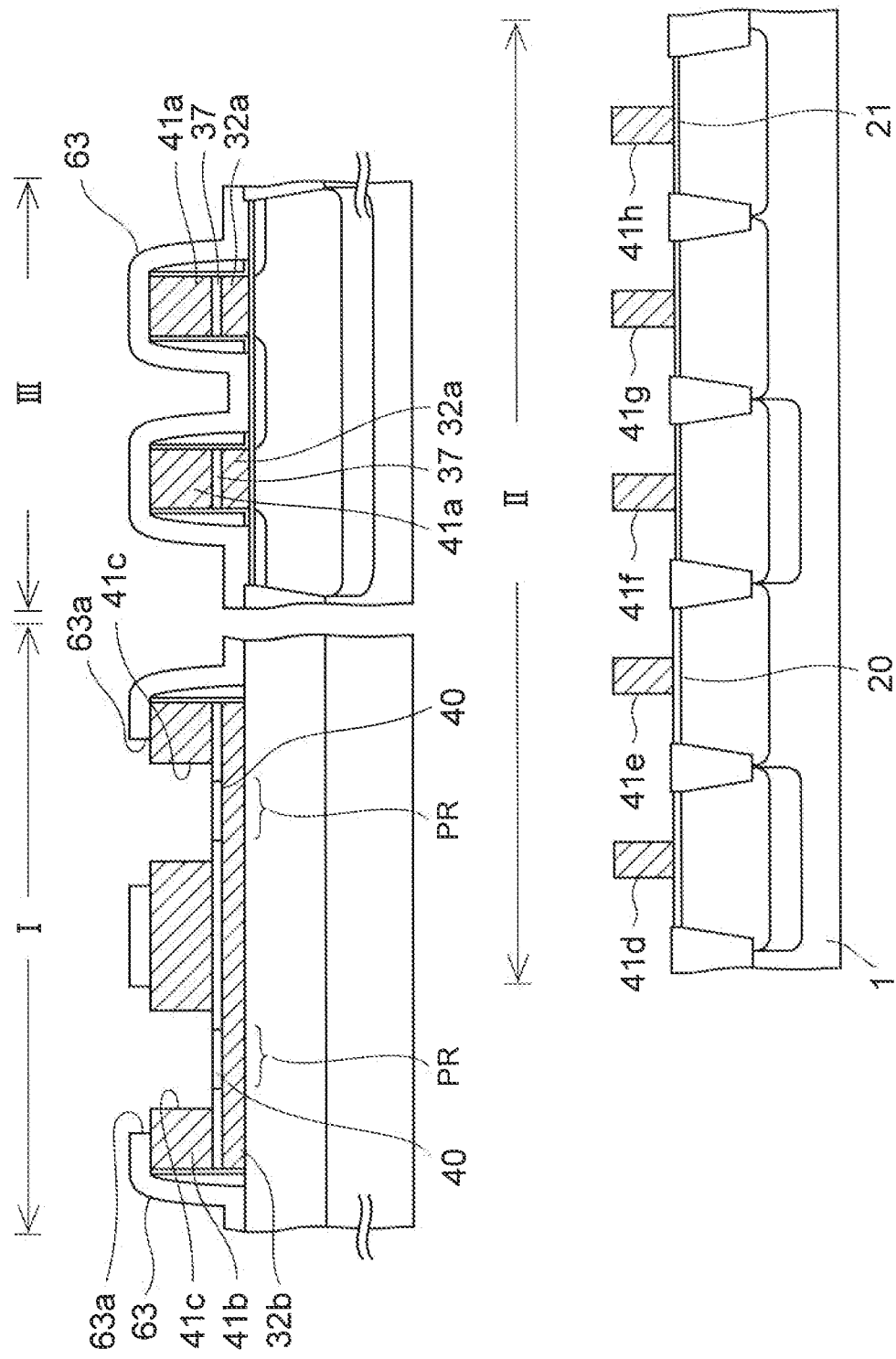

Thereafter, as illustrated in FIG. 7D, the sixth resist film 67 is removed by asking.

Figure 7E:
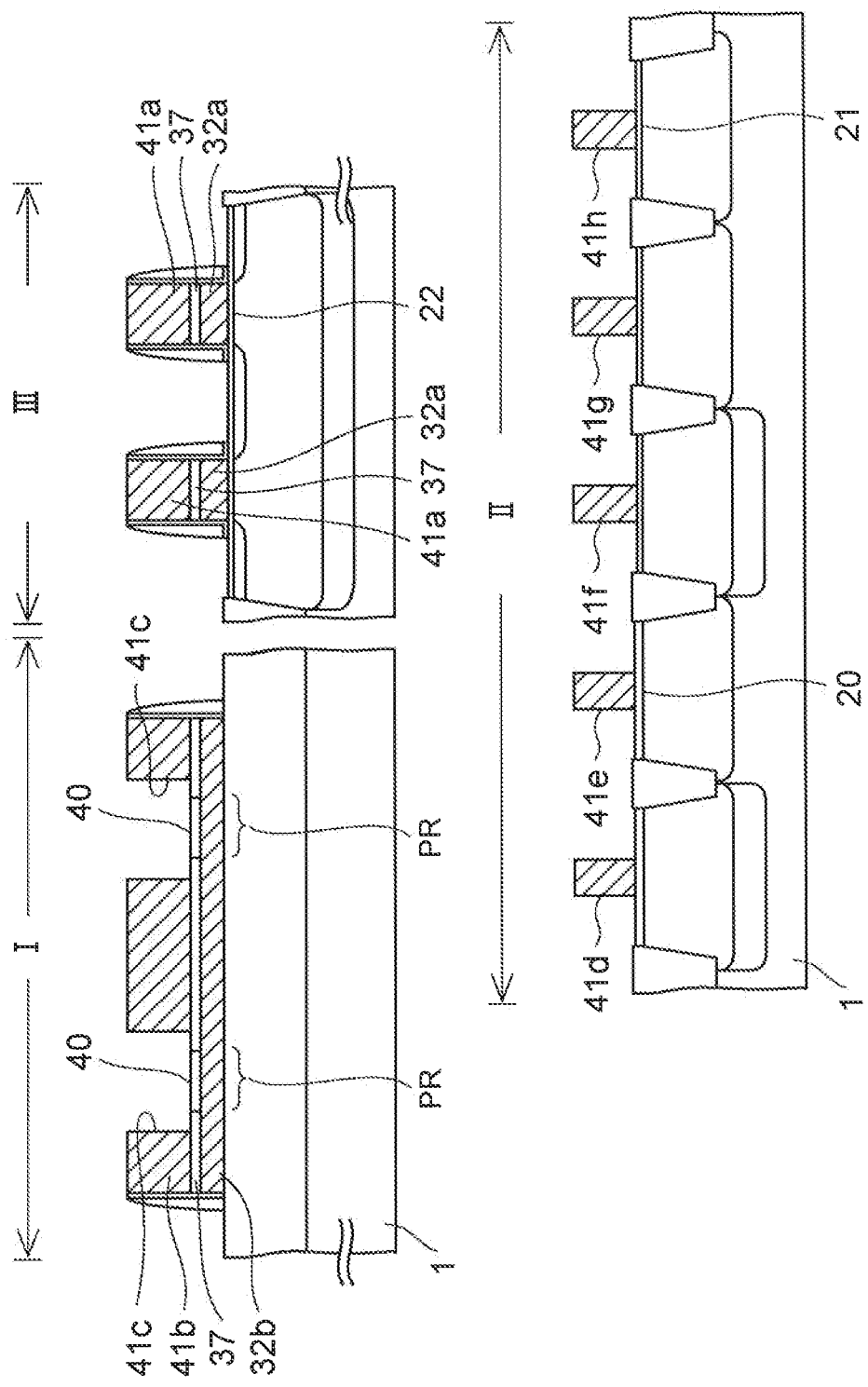

Next, as illustrated in FIG. 7E, the mask film 63 is removed by wet etching using hydrofluoric acid as the etchant. Note that the silicon substrate 1 may then be soaked in APM or SPM to be cleaned.

Figure 7F:
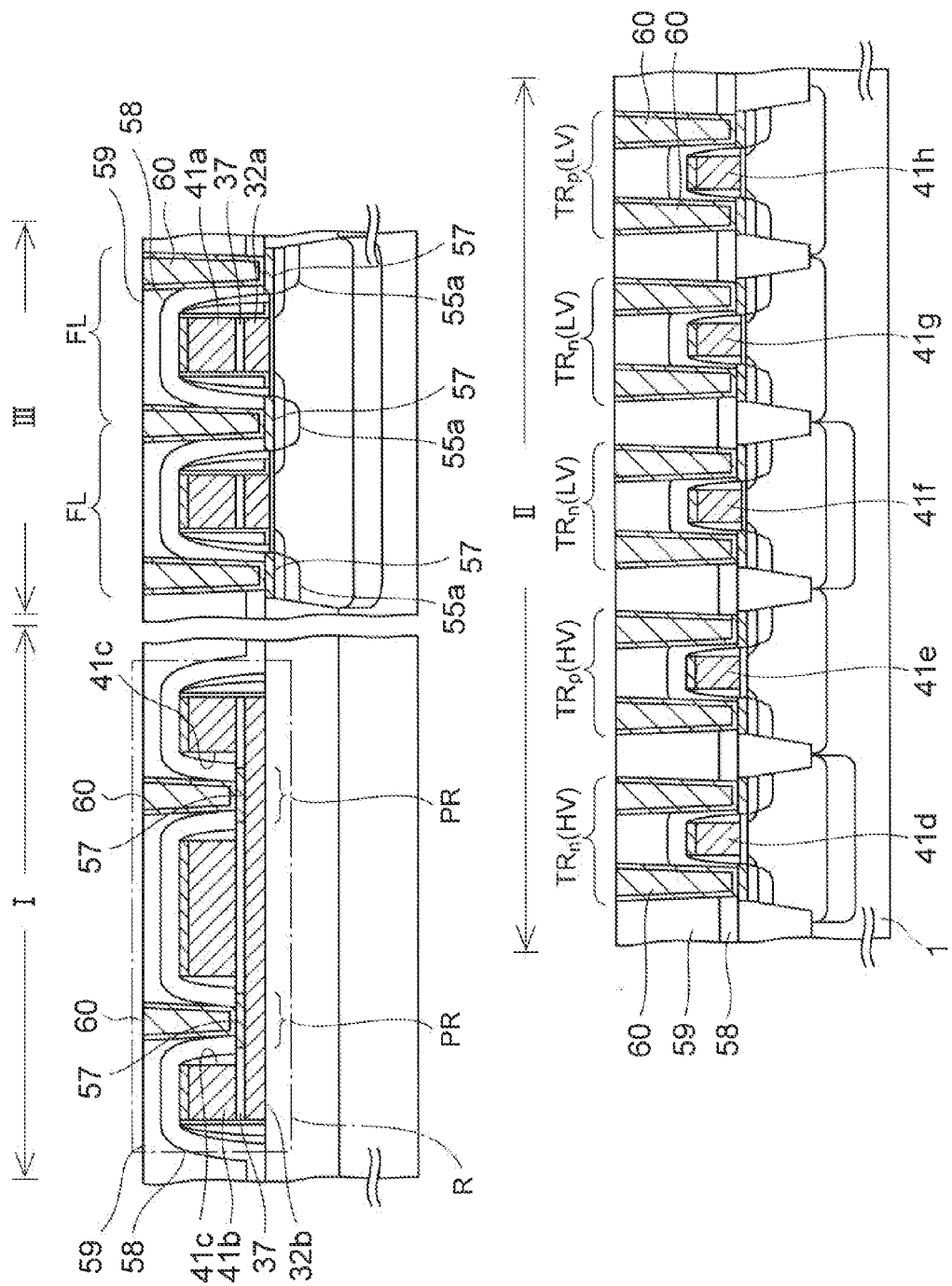

Thereafter, the aforementioned processes illustrated in FIGS. 1Q to 1T are performed to complete the basic structure of the semiconductor device according to the third embodiment, illustrated in FIG. 7F.

In the semiconductor device, a conductive plug 60 is formed on each of two partial regions PR of the first conductive pattern 32b functioning as resistors. In addition, these conductive plugs 60 form a resistive element R with the first conductive pattern 32b, as terminals of the resistive element R.

In the third embodiment described above, as illustrated in FIG. 7C, the window 67a is formed to overlap with the third opening 63a. Accordingly, as in the case of the first embodiment, when the second opening 41c is formed in the second conductive film 41b by dry etching, it may be possible to prevent the mask film 63 from hindering the dry etching.

Fourth Embodiment

While a resistive element R is formed in the first logic region I in the third embodiment, a transistor is formed instead in the fourth embodiment.

FIGS. 8A to 8H illustrate in sectional views a semiconductor device according to the fourth embodiment in the course of manufacturing. Note that in FIGS. 8A to 8H, components which are the same as those described in the first embodiment are assigned the same reference numerals as the first embodiment, and descriptions thereof are omitted in the following description.

To manufacture this semiconductor device, the aforementioned processes illustrated in FIGS. 1A to 1K are performed to obtain the cross section structure illustrated in FIG. 8A.

Note that as illustrated in FIG. 8A, a tunnel insulating film 22 is also formed in a first logic region I in the fourth embodiment.

In addition, in the dry etching using a third resist film 43 as a mask, a laminate including a floating gate 32a, an intermediate insulating film 37, and a first gate electrode 41a is formed in the memory region III as mentioned earlier.

Meanwhile, in the first logic region I, a laminate including a seventh gate electrode 32c, an intermediate insulating film 37, and a first gate electrode 41a is formed on the tunnel insulating film 22 by the dry etching.

Moreover, on the element isolation insulating film 4 in the first logic region I, a laminate including a first conductive pattern 32b, the intermediate insulating film 37, and a second conductive pattern 41b is formed as in the case of the first embodiment.

Figure 8B:
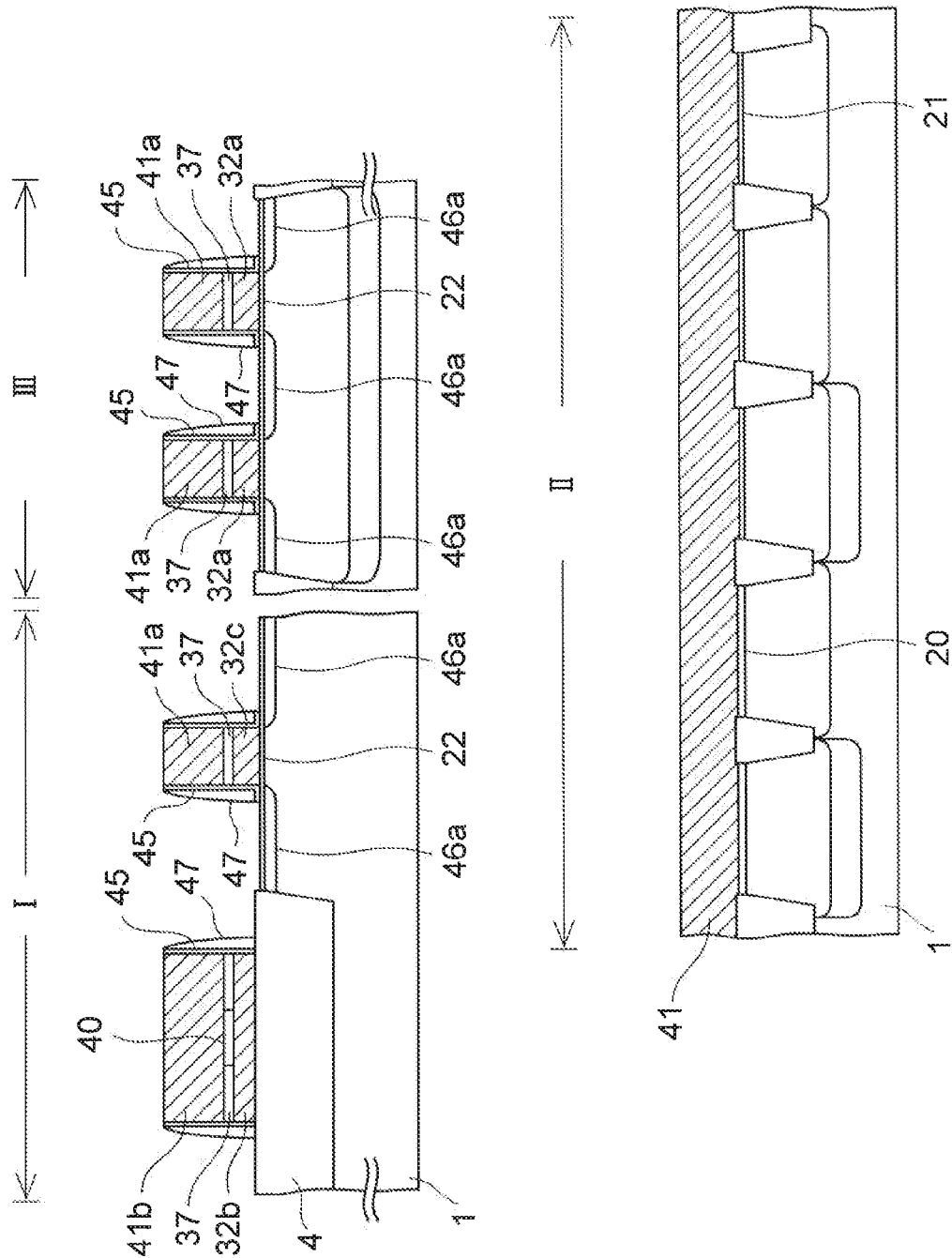

Next, as illustrated in FIG. 8B, the aforementioned processes illustrated in FIGS. 1L to 1M are performed to obtain a structure in which a first n-type source and drain extension 46a is formed in a silicon substrate 1. The first n-type source and drain extension 46a is formed not only in a memory region III, but also in the silicon substrate 1 at sides of the seventh gate electrode 32c in the first logic region I.

Figure 8C:
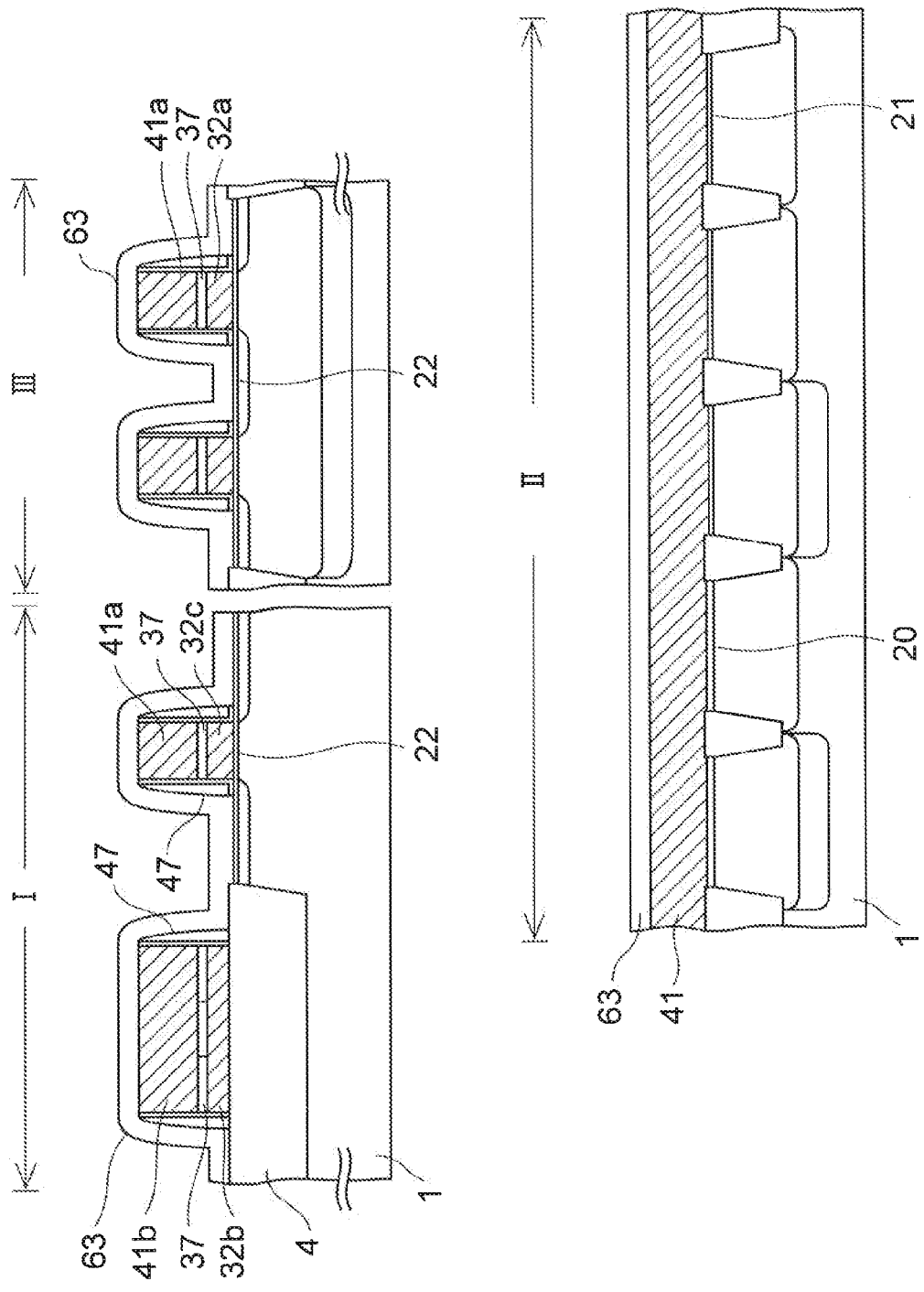

Thereafter, as illustrated in FIG. 8C, a silicon oxide film is formed with about 300 nm thickness as a mask film 63, on an entire top surface of the silicon substrate 1 at a substrate temperature of 620° C., by CVD using TEOS gas as the film-forming gas.

Figure 8D:
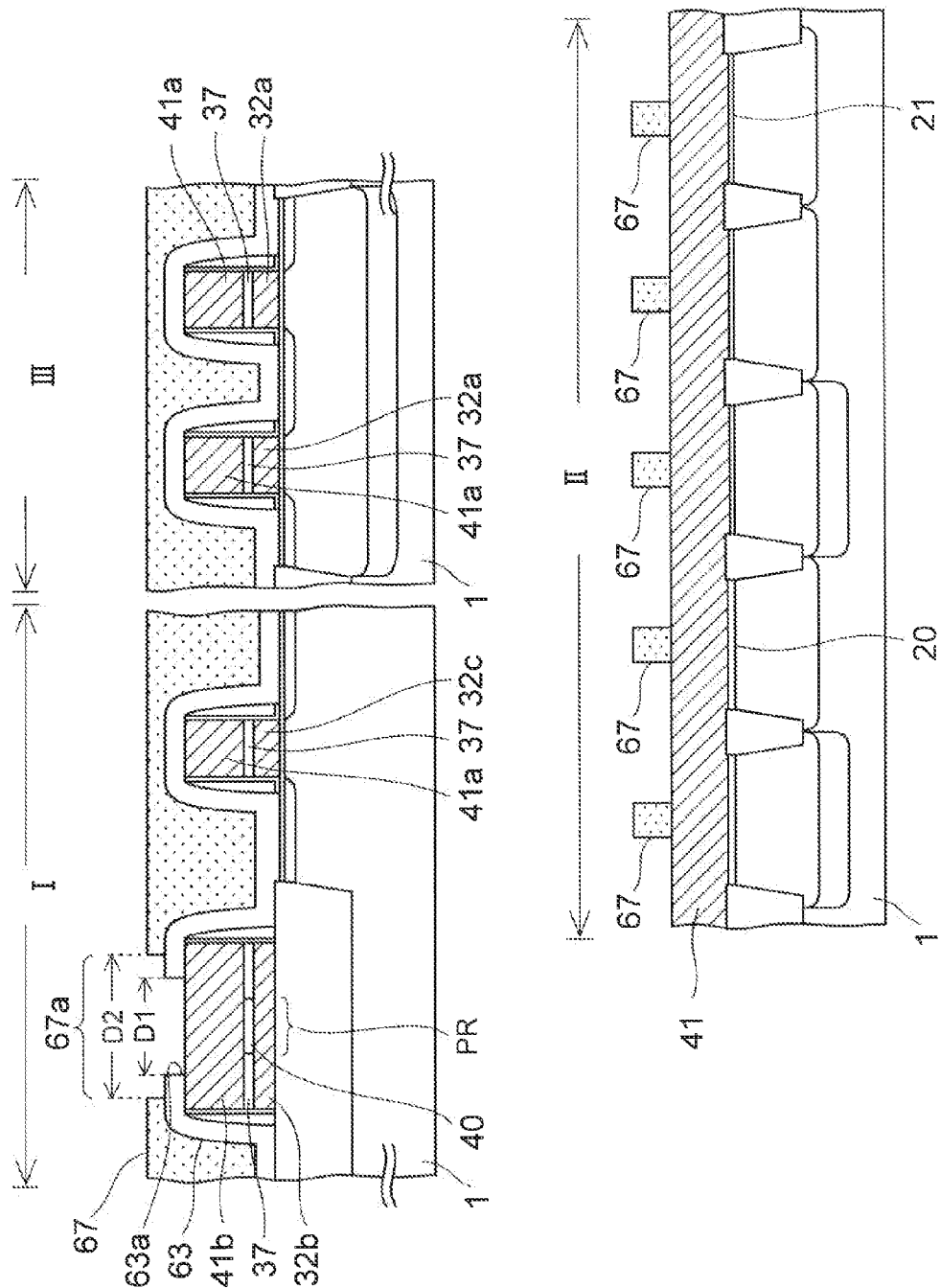

Next, a description is given of processes for obtaining the cross section structure illustrated in FIG. 8D.

Firstly, the mask film 63 is patterned according to the process of FIG. 3C, to remove the mask film 63 from the second logic region II, as well as to form a third opening 63a in the mask film 63 in the first logic region I.

Next, an ArF resist is applied onto an entire top surface of the silicon substrate 1, and the ArF resist is exposed and developed to form a sixth resist film 67.

As described in the first embodiment, the sixth resist film 67 has a window 67a in the first logic region I, and is formed in the shape of gate electrodes in the second logic region II.

While the aforementioned window 67 is formed to overlap with the third opening 63a, in the fourth embodiment, a diameter D2 of the window 67a is made larger than a diameter D1 of the third opening 63a, as in the second embodiment.

Figure 8E:
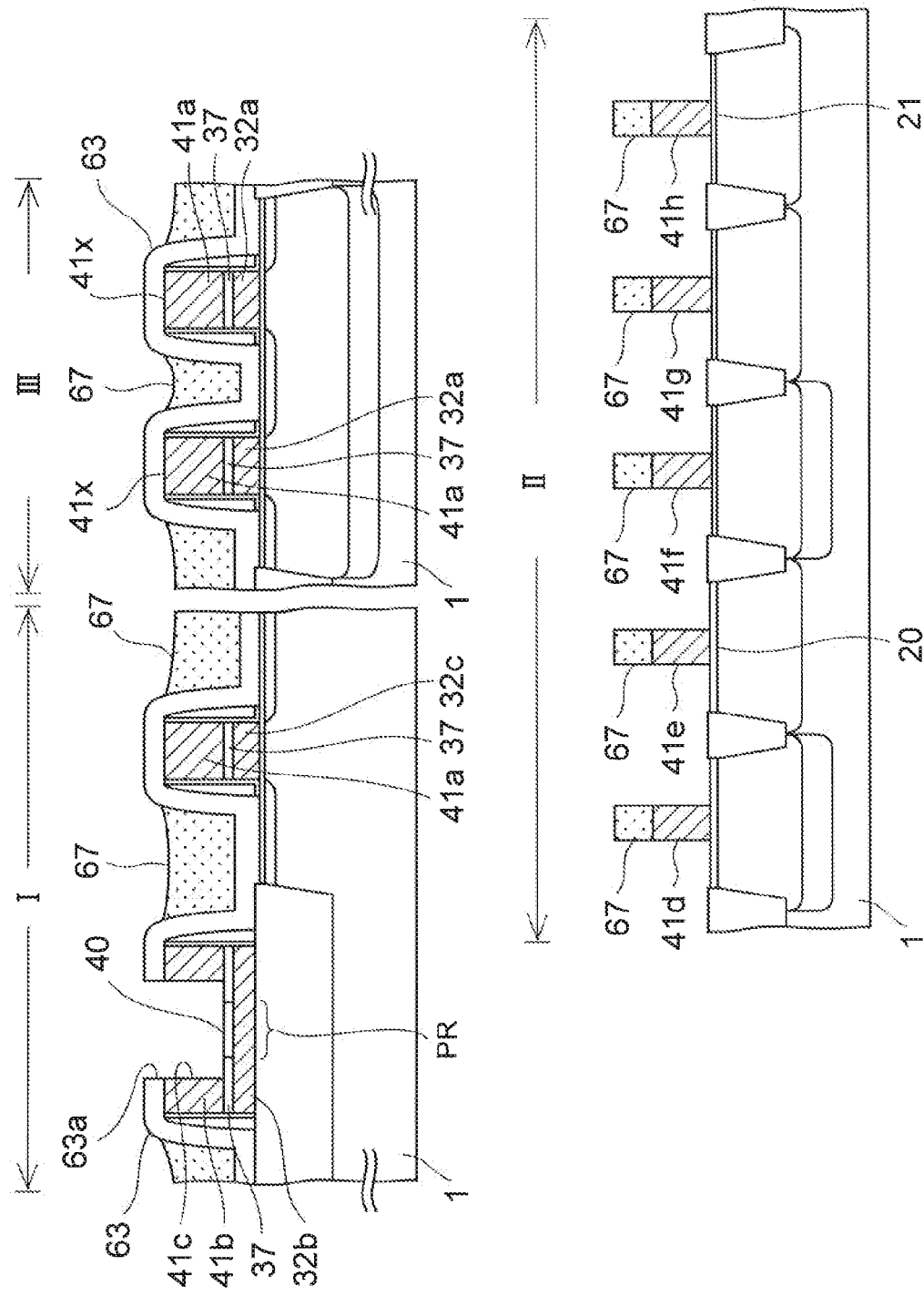

Next, as illustrated in FIG. 8E, a second opening 41c is formed in the second conductive pattern 41b in the first logic region I, by dry etching using the sixth resist film 67 as a mask and a mixed gas including $Cl_2$ and $O_2$ as an etching gas. Then, at the same time, the conductive film 41 in the second logic region II is patterned to form second to sixth gate electrodes 41d to 41h.

As described in the first embodiment, although the sixth resist film 67 is eliminated from the surface of the first gate electrode 41a in the course of this dry etching in the memory region III, the top surfaces 41x of the first gate electrodes 41a are protected from the etching atmosphere by the mask film 63.

Figure 8F:
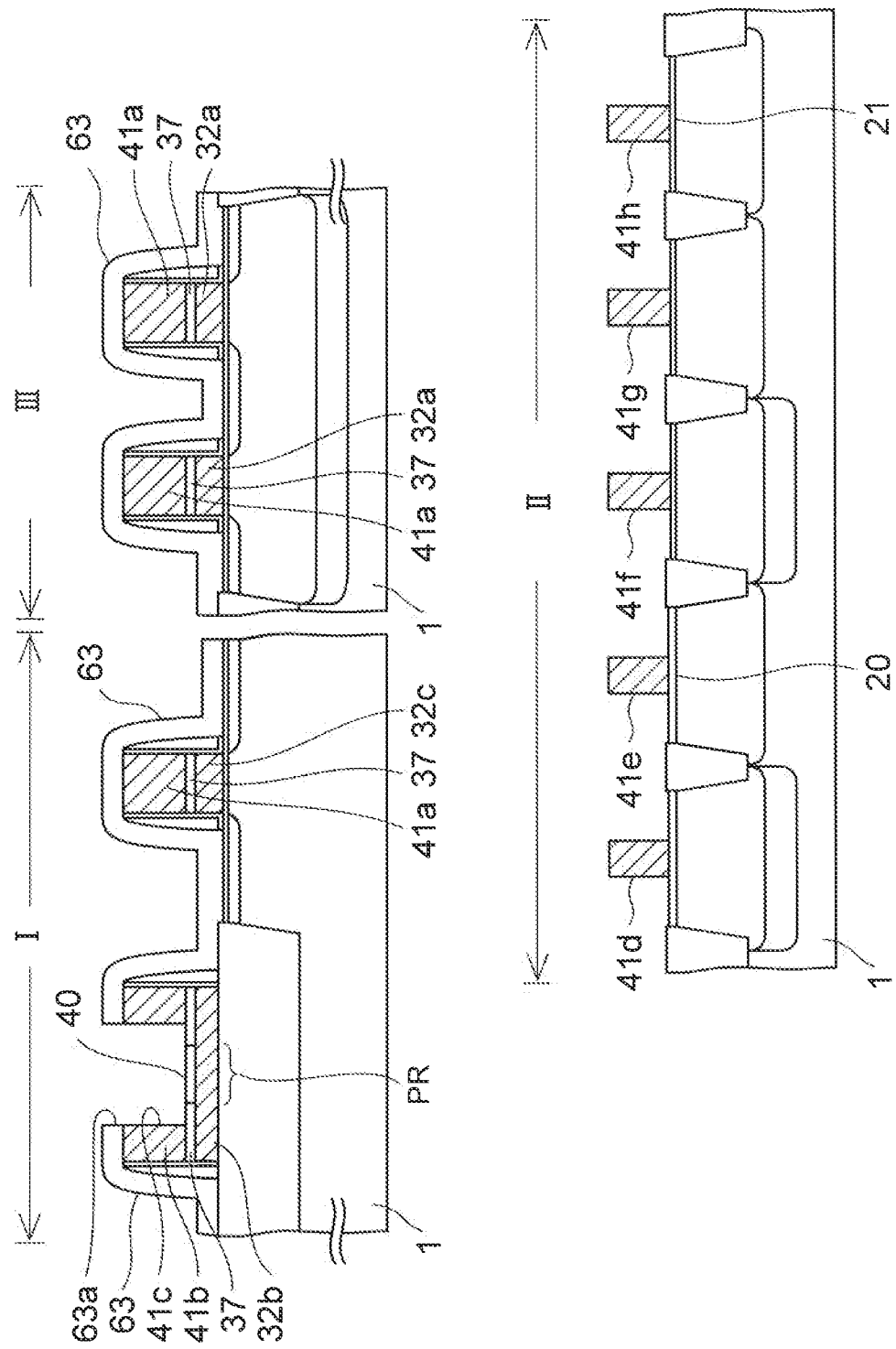

Thereafter, as illustrated in FIG. 8F, the sixth resist film 67 is removed by asking.

Figure 8G:
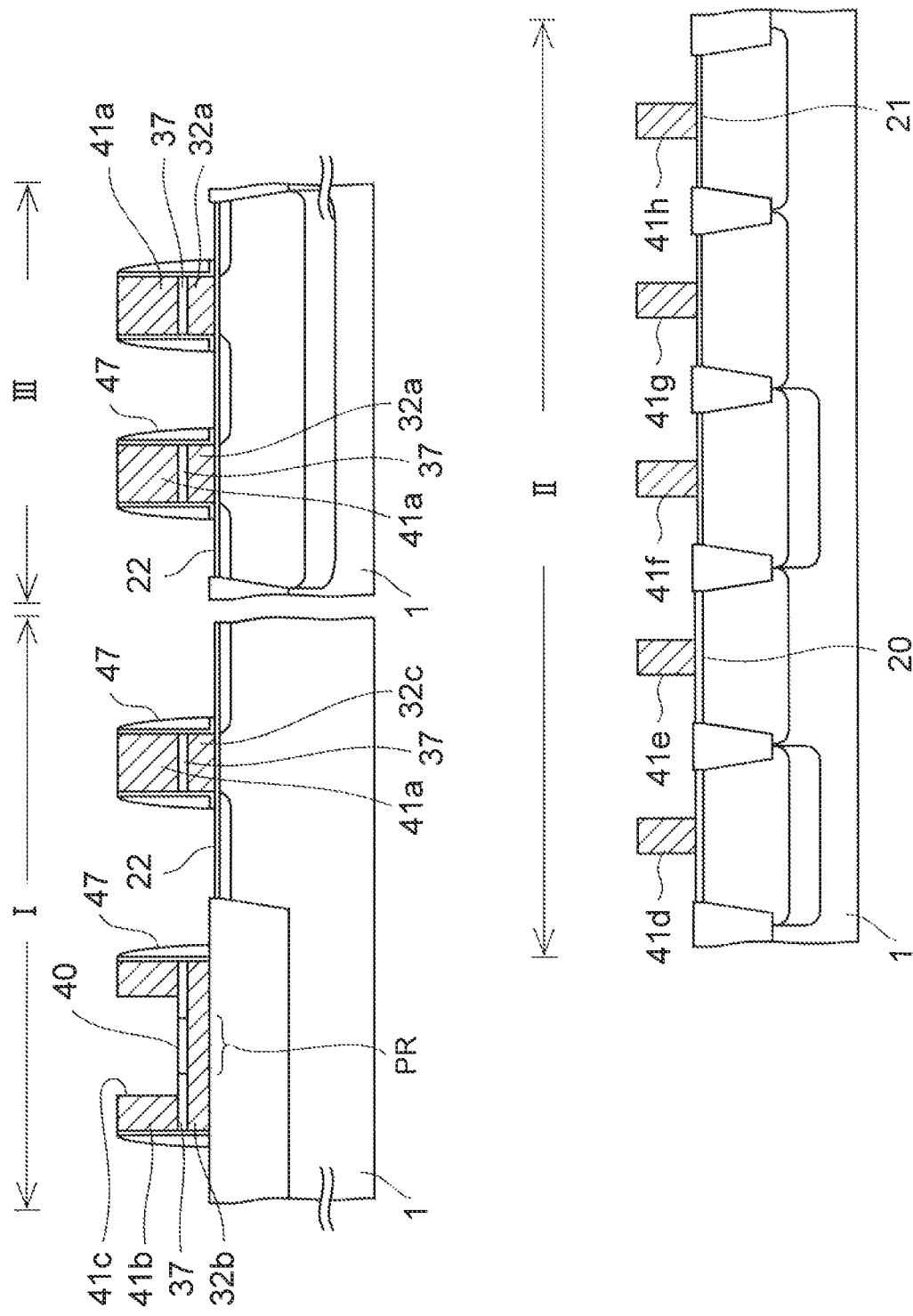

Next, as illustrated in FIG. 8G, the mask film 63 is removed by wet etching using hydrofluoric acid as the etchant. Note that after removing the mask film 63, the silicon substrate 1 may be soaked in APM or SPM to be cleaned.

Figure 8H:
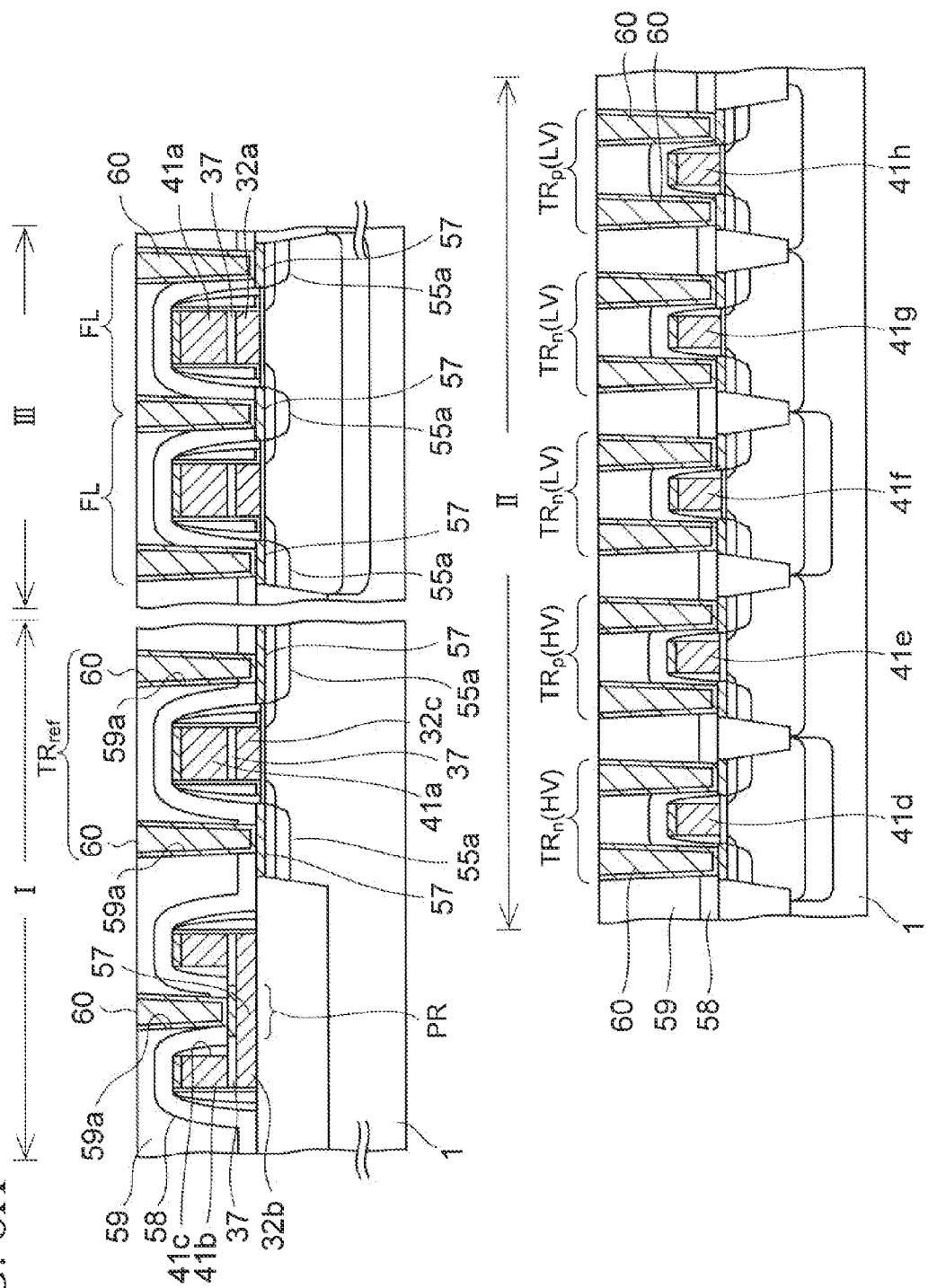

Thereafter, the aforementioned processes illustrated in FIGS. 1Q to 1T are performed to complete the basic structure of the semiconductor device according to the fourth embodiment illustrated in FIG. 8H.

In this semiconductor device, a conductive plug 60 is formed on a partial region PR of the first conductive pattern 32b in the first logic region I.

Meanwhile, first n-type source and drain regions 55a similar to those in the memory region III are formed at sides of the seventh gate electrode 32c in the first logic region I, and a conductive plug 60 is formed above each of the first n-type source and drain regions 55a.

Then, the first n-type source and drain regions 55a form a reference transistor, together with the tunnel insulating film 22 and the seventh gate electrode 32c.

Figure 9:
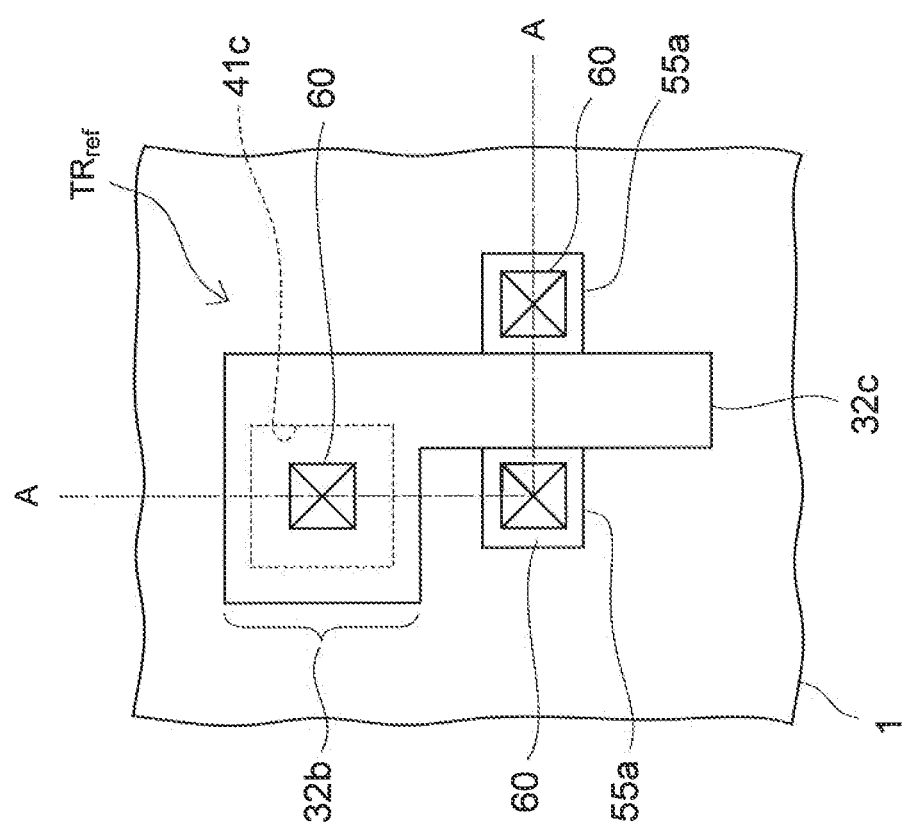
FIG. 9 is an enlarged plan view of a first logic region of the semiconductor device according to the fourth embodiment.

FIG. 9 is an enlarged plan view of the first logic region I of the semiconductor device, and the sectional view of the first logic region I illustrated in FIG. 8H is a sectional view taken along a line A-A in FIG. 9.

Note that in FIG. 9, the first gate electrode 41a and the second conductive pattern 41b are omitted to clarify the layout in plan view.

As illustrated in FIG. 9, the first conductive pattern 32b is a portion of the seventh gate electrode 32c, and a gate voltage of the reference transistor $TR_{ref}$ is applied to the seventh gate electrode 32c from the conductive plug 60 in the second opening 41c.

Functions of the reference transistor $TR_{ref}$ are not particularly limited. Since the tunnel insulating film 22 of the flash memory cell FL is used for the gate insulating film, the reference transistor TRref is preferably used in a test for finding the breakdown voltage of the tunnel insulating film 22.

In the test, a potential of gate voltage of the seventh gate electrode 32c is gradually raised in a state where a certain voltage is applied to the first n-type source and drain regions 55a at both sides of the seventh gate electrode 32c.

Then, when the tunnel insulating film 22 under the third gate electrode 32 is broken down and electrons are implanted into the seventh gate electrode 32c, a current flows through the conductive plug 60 above the first conductive pattern 32b. The breakdown voltage of the tunnel insulating film 22 may be found by detecting this current.

In the fourth embodiment described above, a diameter D2 of the window 67a formed in the process in FIG. 8D is made larger than the diameter D1 of the third opening 63a. For this reason, the second opening 41c may be formed in a good shape in the second conductive pattern 41b by dry etching using the mask film 63 as a mask, even when the sixth resist film 67 in the first logic region I is made thin in the process in FIG. 8E.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method of manufacturing a semiconductor device, the method comprising:
   forming a conductive film in a memory region and a logic region of a semiconductor substrate;
   forming a first gate electrode in the memory region by patterning the conductive film in the memory region while leaving the conductive film in the logic region;
   after forming the first gate electrode, forming a mask film above the conductive film left in the logic region, and above the first gate electrode;
   removing the mask film in the logic region;
   after removing the mask film in the logic region, forming a first resist film above the mask film left in the memory region, and above the conductive film left in the logic region;
   forming a second gate electrode in the logic region by etching the conductive film using the first resist film as a mask;
   removing the first resist film; and
   removing the mask film,
   wherein, in the forming the mask film, the mask film is formed on a lateral surface of the first gate electrode and a top surface of the first gate electrode, and,
   in the forming the second gate electrode in the logic region, the second gate electrode is formed in the logic region while leaving the mask film on the lateral surface of the first gate electrode and the top surface of the first gate electrode in the memory region.

2. The method of manufacturing a semiconductor device according to claim 1, the method further comprising:
   before forming the mask film, forming a side wall insulating film at each side of the first gate electrode wherein:
   in the forming the mask film, the mask film is also formed on the side wall insulating films; and
   in the removing the mask film, the mask film is removed by etching under an etching condition that makes the mask film have a higher etching rate than the side wall insulating films.

3. The method of manufacturing a semiconductor device according to claim 2, wherein:
   in the forming the side wall insulating film, a silicon nitride film is formed as the side wall insulating film;
   in the forming the mask film, a silicon oxide film is formed as the mask film; and
   in the removing the mask film, the mask film is removed by wet etching using hydrofluoric acid.

4. The method of manufacturing a semiconductor device according to claim 1, wherein in the forming the mask film, the mask film is formed with such a thickness that the mask film remains above the first gate electrode at the time point when the second gate electrode is formed.

5. The method of manufacturing a semiconductor device according to claim 1, wherein in the forming the mask film, an insulating film having a higher etching rate than a silicon thermal oxide film is formed as the mask film.

6. The method of manufacturing a semiconductor device according to claim 5, wherein a silicon oxide film is formed as the insulating film by CVD using TEOS gas.

7. The method of manufacturing a semiconductor device according to claim 5, the method further comprising:
before the forming the mask film, forming the silicon thermal oxide film on a lateral surface of the first gate electrode and on the semiconductor substrate at each side of the first gate electrode, wherein
the forming the mask film is performed in a state where the silicon thermal oxide film is formed.

8. The method of manufacturing a semiconductor device according to claim 1, wherein the removing the mask film in the logic region further comprises:
forming a second resist film on the mask film; and
removing the mask film in the logic region by wet etching using the second resist film as a mask.

9. The method of manufacturing a semiconductor device according to claim 1, the method further comprising:
after the removing the mask film, forming a metal silicide film on a surface of the semiconductor substrate besides each of the first gate electrode and the second gate electrode.

10. The method of manufacturing a semiconductor device according to claim 1, the method further comprising:
before the forming the conductive film, forming an underlying conductive film in the memory region of the semiconductor substrate; and
forming an intermediate insulating film on the underlying conductive film, wherein:
in the forming the conductive film, the conductive film is formed on the intermediate insulating film; and
in the forming the first gate electrode, a control gate of a flash memory cell is formed as the first gate electrode, and a floating gate of the flash memory cell is formed out of the underlying conductive film under the first gate electrode by patterning the intermediate insulating film and the underlying conductive film while leaving the intermediate insulating film under the first gate electrode.

11. The method of manufacturing a semiconductor device according to claim 10, wherein:
the logic region includes a first logic region and a second logic region;
in the forming the underlying conductive film, the underlying conductive film is formed in the logic region of the semiconductor substrate;
in the forming the first gate electrode, the underlying conductive film in the first logic region is patterned to form a first conductive pattern, as well as the conductive film in the first logic region is patterned to form a second conductive pattern;
in the removing the mask film in the logic region, the mask film in the second logic region is removed, while a first opening including a partial region of the first conductive pattern inside thereof is exposed is formed in the mask film in the first logic region;
in the forming the first resist film, a window overlapping with the first opening is formed in the first resist film in the first logic region; and
in the forming the second gate electrode, the second conductive pattern is etched through the window to form a second opening in the second conductive pattern, as well as to form the second gate electrode out of the conductive film in the second logic region, the method further comprising:
removing the intermediate insulating film in the partial region of the first conductive pattern;
forming an interlayer insulating film in the memory region and the logic region of the semiconductor substrate;
forming a hole in the interlayer insulating film inside each of the first opening and the second opening; and
forming in the hole a conductive plug electrically connected to the partial region in the first conductive pattern.

12. The method of manufacturing a semiconductor device according to claim 11, wherein a diameter of the window is larger than a diameter of the first opening.

13. The method of manufacturing a semiconductor device according to claim 11, wherein a capacitor is formed by the first conductive pattern, the intermediate insulating film, and the second conductive pattern.

14. The method of manufacturing a semiconductor device according to claim 11, wherein the first conductive pattern is a resistor of a resistive element.

15. The method of manufacturing a semiconductor device according to claim 11, wherein in the forming the first gate electrode, the underlying conductive film in the logic region is patterned to form a third gate electrode as a portion of the first conductive pattern.

16. The method of manufacturing a semiconductor device according to claim 1, wherein in the forming the mask film, the mask film is formed in contact with the top surface of the first gate electrode.

17. The method of manufacturing a semiconductor device according to claim 1, wherein a top surface of the conductive film left in the logic region is flat at the time point when the first resist film is formed.

* * * * *